(12) United States Patent
Cummings

(10) Patent No.: US 10,694,402 B2
(45) Date of Patent: Jun. 23, 2020

(54) SECURITY ORCHESTRATION AND NETWORK IMMUNE SYSTEM DEPLOYMENT FRAMEWORK

(71) Applicant: Mark Cummings, Atherton, CA (US)

(72) Inventor: Mark Cummings, Atherton, CA (US)

(*) Notice: Subject to any disclaimer, the term of this patent is extended or adjusted under 35 U.S.C. 154(b) by 0 days.

(21) Appl. No.: 16/008,673

(22) Filed: Jun. 14, 2018

(65) Prior Publication Data

US 2018/0368007 A1  Dec. 20, 2018

Related U.S. Application Data

(63) Continuation-in-part of application No. 15/060,478, filed on Mar. 3, 2016, now Pat. No. 10,187,811,
(Continued)

(51) Int. Cl.
*H04W 24/02* (2009.01)
*H04W 8/22* (2009.01)
(Continued)

(52) U.S. Cl.
CPC .......... *H04W 24/02* (2013.01); *G06F 9/4411* (2013.01); *G06F 30/327* (2020.01); *H04L 67/10* (2013.01);
(Continued)

(58) Field of Classification Search
None
See application file for complete search history.

(56) References Cited

U.S. PATENT DOCUMENTS 5,555,286 A  9/1996 Tendler
5,751,909 A  5/1998 Gower
(Continued)

FOREIGN PATENT DOCUMENTS

CN  1762130  4/2006
CN  101013957  8/2007
(Continued)

OTHER PUBLICATIONS

Accellera, Unified Power Format (UPF) Standard. Version 1.0. Feb. 22, 2007.
(Continued)

*Primary Examiner* — Diane L Lo
(74) *Attorney, Agent, or Firm* — Van Pelt, Yi & James LLP

(57) ABSTRACT

Image data of a node with which an orchestration module is associated is received. The node is an electronic device and the image data of the node is received in a language associated with the node. The image data of the node with which the orchestration module is associated is translated into a meta-language associated with an orchestrator network comprising the orchestration module and one or more other orchestration modules associated one or more corresponding nodes. A scope of information to provide from the orchestration module to the one or more other orchestration modules associated with one or more corresponding nodes is determined. The determined information is communicated to the one or more other orchestration modules in the meta-language understood by the orchestration module and the one or more other orchestration modules associated with one or more corresponding nodes.

26 Claims, 27 Drawing Sheets

Related U.S. Application Data which is a continuation of application No. 13/290,736, filed on Nov. 7, 2011, now Pat. No. 9,311,108, said application No. 16/008,673 is a continuation-in-part of application No. 15/694,072, filed on Sep. 1, 2017, now Pat. No. 10,231,141, which is a continuation of application No. 13/290,767, filed on Nov. 7, 2011, now Pat. No. 9,788,215, said application No. 16/008,673 is a continuation-in-part of application No. 15/411,546, filed on Jan. 20, 2017, and a continuation-in-part of application No. 14/993,641, filed on Jan. 12, 2016, now Pat. No. 9,591,496, which is a continuation of application No. 13/290,760, filed on Nov. 7, 2011, now Pat. No. 9,268,578.

(60) Provisional application No. 62/523,636, filed on Jun. 22, 2017, provisional application No. 61/456,385, filed on Nov. 5, 2010, provisional application No. 62/378,449, filed on Aug. 23, 2016.

(51) Int. Cl.

| | | |
|---|---|---|
| *G06F 17/50* | (2006.01) | |
| *H04W 28/02* | (2009.01) | |
| *H04W 48/16* | (2009.01) | |
| *H04L 29/08* | (2006.01) | |
| *H04W 24/00* | (2009.01) | |
| *G06F 9/4401* | (2018.01) | |
| *G06F 30/327* | (2020.01) | |

(52) U.S. Cl.
CPC .............. *H04L 67/16* (2013.01); *H04L 67/22* (2013.01); *H04W 8/22* (2013.01); *H04W 28/0215* (2013.01); *H04W 48/16* (2013.01); *H04W 24/00* (2013.01)

(56) References Cited

U.S. PATENT DOCUMENTS

| | | | |
|---|---|---|---|
| 5,966,531 A | 10/1999 | Skeen | |
| 5,970,490 A | 10/1999 | Morgenstern | |
| 6,141,565 A | 10/2000 | Feuerstein | |
| 6,438,594 B1 | 8/2002 | Bowman-Amuah | |
| 6,618,805 B1 | 9/2003 | Kampe | |
| 6,711,624 B1 | 3/2004 | Narurkar | |
| 6,976,160 B1 | 12/2005 | Yin | |
| 7,263,551 B2 | 8/2007 | Belfiore | |
| 7,571,069 B1* | 8/2009 | Farkas .................. G06Q 10/06 702/120 |
| 8,291,468 B1 | 10/2012 | Chickering | |
| 8,775,218 B2 | 7/2014 | Burgoon, Jr. | |
| 9,317,843 B2 | 4/2016 | Bradley | |
| 2003/0074443 A1 | 4/2003 | Melaku | |
| 2004/0111590 A1 | 6/2004 | Klein | |
| 2004/0203385 A1 | 10/2004 | Narayanan | |
| 2004/0267965 A1 | 12/2004 | Vasudevan | |
| 2005/0055196 A1 | 3/2005 | Cohen | |
| 2005/0096055 A1 | 5/2005 | Colban | |
| 2005/0157660 A1 | 7/2005 | Mandato | |
| 2005/0203892 A1 | 9/2005 | Wesley | |
| 2005/0251501 A1 | 11/2005 | Phillips | |
| 2006/0007919 A1 | 1/2006 | Steinheider | |
| 2006/0190904 A1 | 8/2006 | Haji-Aghajani | |
| 2006/0223443 A1 | 10/2006 | Reudink | |
| 2007/0055552 A1 | 3/2007 | St Clair | |
| 2007/0087738 A1 | 4/2007 | Melkesetian | |
| 2007/0130208 A1 | 6/2007 | Bornhoevd | |
| 2007/0220342 A1 | 9/2007 | Vieira | |
| 2007/0283317 A1 | 12/2007 | Sadler | |
| 2008/0046292 A1 | 2/2008 | Myers | |
| 2008/0062871 A1 | 3/2008 | Grayson | |
| 2008/0068989 A1 | 3/2008 | Wyk | |
| 2009/0070728 A1 | 3/2009 | Solomon | |
| 2009/0080408 A1 | 3/2009 | Natoli | |
| 2009/0100178 A1 | 4/2009 | Gonzales | |
| 2009/0125497 A1 | 5/2009 | Jiang | |
| 2009/0257351 A1 | 10/2009 | Hande | |
| 2009/0319685 A1* | 12/2009 | Martin .................. G06F 9/54 709/240 |
| 2010/0014533 A1 | 1/2010 | Hirano | |
| 2010/0056215 A1 | 3/2010 | Gorokhov | |
| 2010/0063930 A1 | 3/2010 | Kenedy | |
| 2010/0125664 A1 | 5/2010 | Hadar | |
| 2010/0191765 A1 | 7/2010 | Gan | |
| 2010/0192120 A1 | 7/2010 | Raleigh | |
| 2010/0202391 A1 | 8/2010 | Palanki | |
| 2011/0007708 A1 | 1/2011 | Hapsari | |
| 2011/0016214 A1 | 1/2011 | Jackson | |
| 2011/0086636 A1 | 4/2011 | Lin | |
| 2011/0116480 A1 | 5/2011 | Li | |
| 2011/0137805 A1 | 6/2011 | Brookbanks | |
| 2011/0138060 A1 | 6/2011 | Purkayastha | |
| 2011/0145153 A1 | 6/2011 | Dawson | |
| 2011/0145209 A1 | 6/2011 | Kahn | |
| 2011/0153854 A1 | 6/2011 | Chickering | |
| 2011/0182253 A1 | 7/2011 | Shekalim | |
| 2011/0246236 A1 | 10/2011 | Green, III | |
| 2011/0250911 A1 | 10/2011 | Xu | |
| 2011/0276713 A1 | 11/2011 | Brand | |
| 2012/0033621 A1 | 2/2012 | Mueck | |
| 2012/0096525 A1 | 4/2012 | Bolgert | |
| 2012/0116782 A1 | 5/2012 | Punnoose | |
| 2012/0239685 A1 | 9/2012 | Kahn | |
| 2013/0237182 A1 | 9/2013 | Schlager | |
| 2016/0259902 A1 | 9/2016 | Feldman | |
| 2017/0012870 A1 | 1/2017 | Blair | |
| 2017/0103215 A1 | 4/2017 | Mahaffey | |
| 2017/0147722 A1 | 5/2017 | Greenwood | |

FOREIGN PATENT DOCUMENTS

| | | |
|---|---|---|
| CN | 101616007 | 12/2009 |
| EP | 1560451 | 10/2011 |
| EP | 2947915 | 11/2015 |
| WO | 2014200493 | 12/2014 |

OTHER PUBLICATIONS

Amba Design Kit. Revision: r3p0. Technical Reference Manual. ARM DDI 0243C. Copyright (c) 2003, 2007.

Amba Designer ADR-400. Revision: r3p1. User Guide ARM DUI 0333K. Copyright (c) 2006-2010, 2011 ARM.

Anupam Bakshi, IDesignSpec (TM) Don't Fear Change, Embrace it. Agnisys Inc. May 1, 2008.

Author Unknown, IEEE Standard for IP-XACT, Standard Structure for Packaging, Integrating, and Reusing IP within Tool Flows. IEEE Computer Society and the IEE Standards Association Corporate Advisory Group. Sponsored by the Design Automation Standards Committee. Feb. 18, 2010.

Author Unknown, SDR Conference 2009. V1 4.

Author Unknown, Software Defined Radio Forum. SDR Forum. Use Cases for MLM Language in Modem Wireless Networks. SDRF-08-P-0009-V1.0.0. Jan. 28, 2009.

Author Unknown, SystemRDL V1.0: A Specification for a Register Description Language. Prepared by the Register Description Working Group of the SPIRIT Consortium. Mar. 24, 2009.

Author Unknown, VMM Register Abstraction Layer User Guide. Jul. 2011.

Cooklev et al., Networking Description Language for Ubiquitous Cognitive Networking. SDR Technical Conference, Washington, DC, Oct. 2008.

Cummings et al., Via Commercial Wireless Metalanguage Scenario. SDR Technical Conference. 2007.

Cummings et al. IEEE 802.21: The Leading Edge of a Larger Challenge. 2008.

Cummings et al., ECSG Adhoc Use Case Tutorial. IEEE 802 Executive Committee Study Group on TV White Spaces—Adhoc Use Case Sub-Group. Jan. 20, 2009.

(56) References Cited

OTHER PUBLICATIONS

Cummings et al., en Via. The Role of a Metalanguage in the Context of Cognitive Radio Lifecycle Support. SDR Technical Conference. Orlando, Nov. 16, 2006.
Cummings et al., Activities of SDR Forum MLM Working Group on a Language for Advanced Communication Systems Applications. SDR Technical Conference, Washington, DC, Oct. 2008.
Cummings et al., Changing Metalanguage Landscape. IPFW Indiana University—Purdue University Fort Wayne. SDR Conference 2009.
Cummings et al., Changing Metalanguage Landscape. Proceedings of the SDR '09 Technical Conference and Product Exposition, Copyright (c) 2009 SDR Form, Inc.
Cummings et al., Commercial Wireless Metalanguage Scenario. SDR Technical Conference. v13. 2007.
Cummings et al., en Via II. Perspectives on a Meta Language for Configurable Wireless Systems. SDR Forum Technical Conference Phoenix, Nov. 2004.
Cummings et al., en Via. Commercial Wireless Metalanguage Scenario. SDR Technical Conference, Denver, CO. Nov. 2007.
Cummings et al., The Role of a Metalanguage in the Context of Cognitive Radio Lifecycle Support. SDR Technical Conference. 2006.
Dave Murray, duolog technologies. Using IP-XPACT (TM) in Complex SoC i/o Integration and SoC Register Management. IP-XACT Users Group: Session 1 (in association with Texas Instruments). Jul. 8, 2008.
Fette et al., Next-Generation Design Issued in Communications. Portable Design. Mar. 2008.
Google, Inc., Authorized Ex Parte Contract—Unlicensed Operation in the TV Broadcast Bands (ET Docket No. 04-186). Apr. 10, 2009.
Kokar et al., Towards a Unified Policy Language for Future Communication Networks: A Process. Dyspan Conference, Chicago Oct. 2008.
Kokar et al., Towards a Unified Policy Language for Future Communication Networks: A Process. DySpan. NDL v10. 2008.
Lawton, G. New Protocol Improves Interaction among Networked Devices and Applications. Computing Now [online], Jul. 2010 [retrieved on Feb. 23, 2012]. Retrieved from the Internet: <URL: http//www.computer.org/portal/web/computingnow/archive/news065>.
Mark Cummings, Creating a New Wireless World. EE Times. Aug. 23, 2004.
Mark Cummings, Commercial SDR Drivers & Status SDR Forum Technical Plenary. RFco Semiconductor. Toronto. Jun. 15, 2004.
Mark Cummings, en Via II. Managing Complexity as Networks Evolve. Future Wireless Workshop. SDR Form. Seoul, South Korea. Sep. 13, 2004.
Mark Cummings, en Via II. SDR Forum: Commercial SDR Initiative. GSPx, Sep. 30, 2004.
Mark Cummings, IEEE P802.19 Wireless Coexistence. Directions to a TV White Space Coexistence Mechanisms Par. Aug. 17, 2009.
Mark Cummings, Status and Future Directions of Technology for Software Defined Radios and Implications for Regulators. Symposium on Download Security and Regulatory Issues. RFco. Tokyo. Apr. 14, 2003.
Mark Cummings, System of Systems Joint E2R / SDR Forum Workshop. RFco Semiconductor. Mainz. Apr. 20, 2004.
Mark Cummings, Vision, Trend and Challenges of SDR. RFco. ITU Workshop. Geneva. Dec. 3, 2003.
Mark Cummings. Alternatives for Coexistence Mechanisms in White Space. doc.: IEEE 802.19-09/0044r0. Jul. 7, 2009.
Matthew Sherman. TV Whitespace Tutorial Intro. IEEE 802 Executive Committee Study Group on TV White Spaces. Mar. 10, 2009.
Paine et al., IEEE P802.19. Wireless Coexistence. WhiteSpace Coexistence Ue Cases. Jul. 2009.
Patrick Mannion, Cognitive Radio Hailed as Next Big Thing: in Wireless. EE Times. Aug. 23, 2004.
Subrahmanyam et al., Perspectives on a Metalanguage for Configurable Wireless Systems. SDR Technical Conference. 2004.
Synopsys, Inc., An Introduction to the VMM Register Abstraction Layer. SOCentral. Jul. 30, 2007.
Trusted Computing Group, TCG Trusted Network Connect, TNC IF-MAP Binding for SOAP, Specification Version 1.1, Revision 5, May 18, 2009.
Visarius et al. 'Generic Integration infrastructure for IP-based design processes and tools with a unified XML format. Integration, the VLSI Journal—Special issue: IP and design reuse', vol. 37, Issue 4. Published Sep. 2004 [online] Retrieved from the Internet <URL:http://www.sciencedirect.com/science/article/pii/S016792600400033>.
Wagner et al., 'Strategies for the integration of hardware and software IP components in embedded systems-on-chip'. In Integration, the VLSI Journal, vol. 37. Published Sep. 2004 [online] Retrieved from the Internet <URL http://www.sciencedirect.com/science/article/pii/S0167926003001093>.
Wirthlin et al. Future Field Programmable Gate Array (FPGA) Design Methodologies and Tool Flows. Report AFRL-RY-WP-TR-2008-1228 of the Air Force Research Laboratory [online]. Published Jul. 2008. [retrieved on Mar. 8, 2012] Retrieved from the Internet <URL:http://www.dtic.mil/cgi-bin/GetTRDoc?AD=ADA492273&Location=U2&doc=GetTRDoc.pdf>.
Wirthlin et al. 'OpenFPGA CoreLib core library interoperability effort'. In Journal of Parallel Computing, vol. 34, issue 4-5 [online]. Published May 2008. [retrieved on Mar. 8, 2012] Retrieved from the Internet <URL:http://ce-serv.et.tudelft.nl/publicationfiles/1605_1002_OpenFPGA.pdf>.

* cited by examiner

SECURITY ORCHESTRATION AND NETWORK IMMUNE SYSTEM DEPLOYMENT FRAMEWORK

CROSS REFERENCE TO OTHER APPLICATIONS

This application claims priority to U.S. Provisional Patent Application No. 62/523,636 entitled SECURITY ORCHESTRATION AND NETWORK IMMUNE SYSTEM DEPLOYMENT FRAMEWORK filed Jun. 22, 2017 which is incorporated herein by reference for all purposes.

This application is a continuation in part of co-pending U.S. patent application Ser. No. 15/060,478, entitled ORCHESTRATING WIRELESS NETWORK OPERATIONS filed Mar. 3, 2016, which is a continuation of U.S. patent application Ser. No. 13/290,736, now U.S. Pat. No. 9,311,108, entitled ORCHESTRATING WIRELESS NETWORK OPERATIONS filed Nov. 7, 2011, which claims priority to U.S. Provisional Patent Application No. 61/456,385, entitled COLLABORATIVE COMMUNICATIONS AND COMPUTING, filed Nov. 5, 2010, all of which are incorporated herein by reference for all purposes.

This application is a continuation in part of co-pending U.S. patent application Ser. No. 15/694,072, entitled COLLABORATIVE COMPUTING AND ELECTRONIC RECORDS filed Sep. 1, 2017, which is a continuation of U.S. patent application Ser. No. 13/290,767, now U.S. Pat. No. 9,788,215, entitled COLLABORATIVE COMPUTING AND ELECTRONIC RECORDS filed Nov. 7, 2011, which claims priority to U.S. Provisional Patent Application No. 61/456,385, entitled COLLABORATIVE COMMUNICATIONS AND COMPUTING filed Nov. 5, 2010, all of which are incorporated herein by reference for all purposes.

This application is a continuation in part of co-pending U.S. patent application Ser. No. 15/411,546, entitled SELF ORGANIZING SYSTEM TO IMPLEMENT EMERGING TOPOLOGIES filed Jan. 20, 2017, which claims priority to U.S. Provisional Patent Application No. 62/378,449, entitled SELF ORGANIZING SYSTEM ON A CHIP TO IMPLEMENT EMERGING TOPOLOGIES filed Aug. 23, 2016, both of which are incorporated herein by reference for all purposes.

U.S. patent application Ser. No. 15/411,546, entitled SELF ORGANIZING SYSTEM TO IMPLEMENT EMERGING TOPOLOGIES filed Jan. 20, 2017, is also a continuation in part of U.S. patent application Ser. No. 14/993,641, now U.S. Pat. No. 9,591,496, entitled INTEGRATED CIRCUIT DESIGN AND OPERATION USING AGENTS ASSOCIATED WITH PROCESSING CORES TO NEGOTIATE MUTUALLY COMPATIBLE PARAMETERS TO ACHIEVE AN APPLICATION-RELATED OBJECTIVE filed Jan. 12, 2016, which is a continuation of U.S. patent application Ser. No. 13/290,760, now U.S. Pat. No. 9,268,578, entitled INTEGRATED CIRCUIT DESIGN AND OPERATION FOR DETERMINING A MUTUALLY COMPATIBLE SET OF CONFIGURATION FOR CORES USING AGENTS ASSOCIATED WITH EACH CORE TO ACHIEVE AN APPLICATION-RELATED OBJECTIVE filed Nov. 7, 2011, which claims priority to U.S. Provisional Patent Application No. 61/456,385, entitled COLLABORATIVE COMMUNICATIONS AND COMPUTING filed Nov. 5, 2010, all of which are incorporated herein by reference for all purposes.

BACKGROUND OF THE INVENTION

Seventy five years ago networks were primarily based on mechanical circuit switches, and the very few computers that existed were mostly isolated—that is not connected to communications systems. Most functions in society were controlled manually or mechanically. Telecommunications companies (hereinafter referred to as "telcos") were the only entities that operated large complex networks. Information security was primarily a matter of physical security. Today, there are more computers on the planet than people. The difference between telecommunications equipment and computers is disappearing. Most large businesses, governments, etc. operate networks at least as large and complex as telcos'. Information security has become critical.

Over time, technology has developed to address the new security problems associated with telecommunications equipment and computers. For example, physical external barriers providing physical security have been replaced with new external software barriers to provide information security. Examples of these external barriers include: access control systems, virus checkers, firewalls, etc. Out of recognition that this new kind of security involved both computing and communications, this new kind of security has been called cyber security (cyber from cybernetics—the science of communications and control).

Because of the rapid development of information technology, many generations of cyber security technology have been developed and deployed. The result is that most organizations have a profusion of security tools, each focused on a specific problem and tied together (with each other and the underlying system) and being protected by security staff. At the same time, the attackers became more and more sophisticated. Criminal organizations have been joined by state sponsored organizations operating in a fashion similar to that of the privateers of old. The attackers are using sophisticated attack tools and pervasive automation to improve their effectiveness. So, the frequency of attacks and their number keeps growing dramatically while the cycle times (i.e., the time it takes attackers to sense that a new type of attack is being defended against and therefore change the attack) keep shrinking.

In this threat environment, the outer skin defenses of a system stop ~95% of the attacks, but because of the number of attacks, the ~5% that get through cause severe damage. As a result, people have begun to search for techniques of identifying attacks that have penetrated the outer defenses.

BRIEF DESCRIPTION OF THE DRAWINGS

Various embodiments of the invention are disclosed in the following detailed description and the accompanying drawings.

DETAILED DESCRIPTION

Figure 1A:
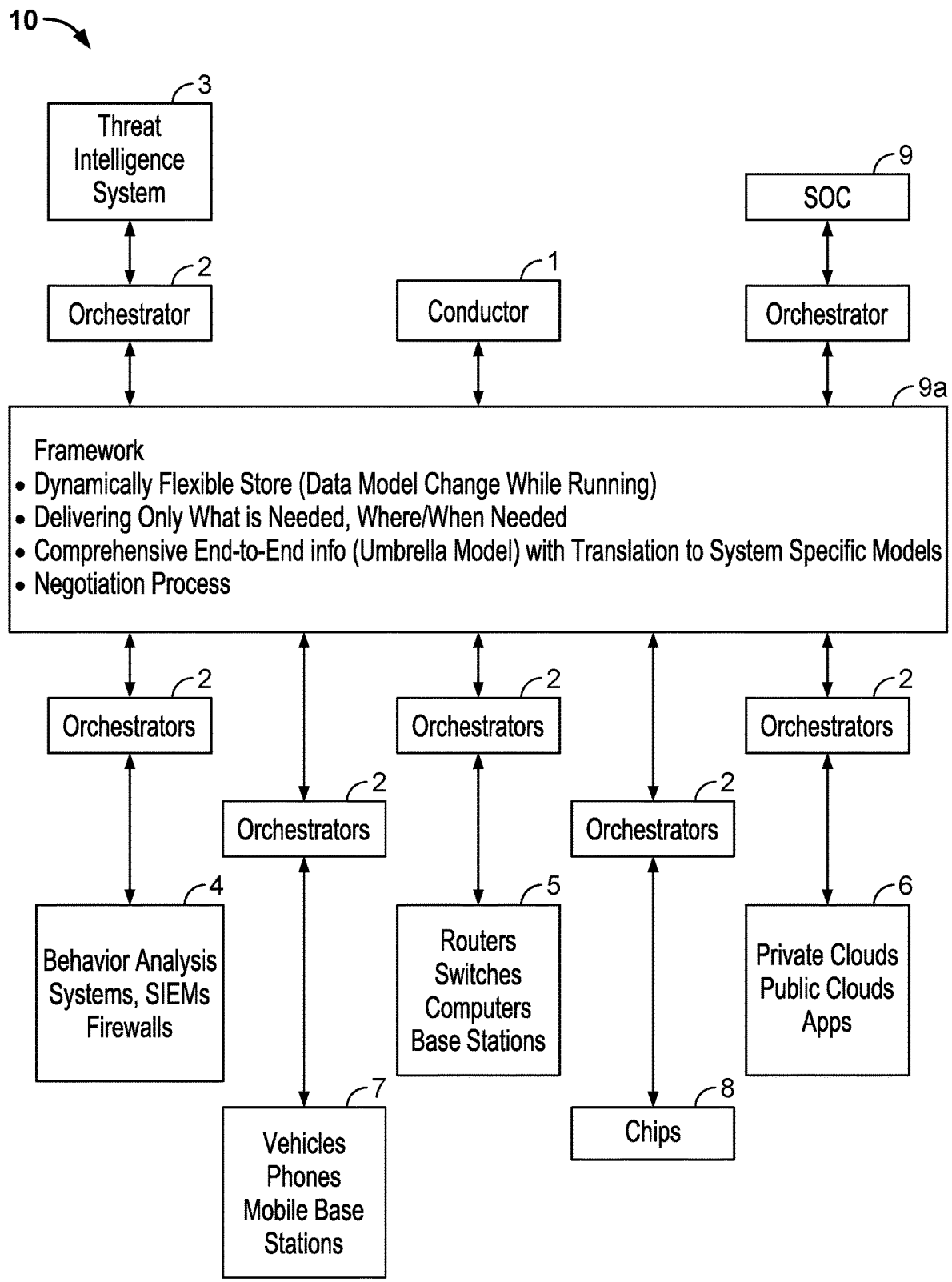
FIG. 1A is a diagram illustrating a high level overview of the embodiments of an autonomous network immune system shown in more detail in the following figures.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions, reconfigurable, and/or hardwired logic, etc.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

One approach to identify cyberattacks that have penetrated the outer defenses of a system is based on behavioral analysis. This approach is based on the hypothesis that a successful cyberattack will result in an observable change in behavior. There are a lot of point solutions that have been fielded based on some form of behavioral analysis. An example of a point solution is a dedicated system focused on a specific type of problem and/or attack. However, these point solutions have trouble observing all of the aspects of system behavior and have added to the profusion of tools that still rely on manual effort by security staff. It would be useful to have a solution that enables all the existing tools to work together in a timely fashion and to protect cyber systems from the ~5% of attacks that penetrate the outer security skin.

Because of the way information technology has evolved, it has become hard to distinguish between "computer systems" and "communications networks". In some embodiments, a system may refer to a computing device that is comprised of a group of processing and storage components (primarily semiconductor integrated circuits) that are tied together by a network. In other embodiments, a system may refer to an integrated circuit that is comprised of a group of processing and storage semiconductor devices tied together by a network. In other embodiments, a system may refer to a plurality of computers and storage devices that are tied together by a network. The terms "system" and "networks" may be used interchangeably and may refer to a computing device, a network, an integrated circuit, a computer network, a communications network, computer systems, Clouds, etc.

Computers/networks are so pervasive that they affect every aspect of society and therefore every form of social organization. There is no single word that covers all forms of social organization. A social organization may include an enterprise, a for profit company, a not for profit company, government, government organization, religious organization, family, etc.

A system and/or system component may have been breached, a subject of unauthorized access, comprised, hacked, etc. These words or phrases indicate that the system and/or system component has been, or is under attack.

Overview

As our underlying networks have grown with layer upon layer of different technologies and different proprietary vendor solutions, the same thing has happened to our systems to secure the underlying networks. A profusion of cyber security solutions focused on particular aspects, particular types of threats, particular types of systems, etc. often called "point solutions" have emerged. There are approximately 10,000 point solution security products today and organizations typically have multiple versions of the different types installed. Thus, while it has become more important to secure those networks, it has become more difficult/expensive to do so. Expense is a key consideration. Social organizations don't want to pay more in insurance to protect an asset than the total value of the asset itself. Similarly, there are practical limits to what is reasonable to spend on security systems. In today's large networks, the cost of the arrays of point solutions typically implemented is significant, but one of the key limiting factors is the cost and availability of the talent required to make them work. Most of the security tools do a good job on the specific problem for which they are designed, i.e., the point solution. However, such security tools require manual intervention to tie them together, supply them with input, or implement their results. These manual functions are described by some as orchestration and response.

To successfully complete these manual interventions requires staff that are trained and experienced with: each of the user interfaces, and underlying technologies of the point security solutions; and each of the types, and vendor implementations of components in the underlying network. At first, these manual security functions were added to the tasks of the network operations group, generally organized into an Operations Center. However, over time it was found that security required specialized expertise and special security operations groups were formed, generally organized in a Security Operations Center (SOC). The SOC had to be manned 24/7 with staff that have all of the required expertise listed above. This proved to be very expensive, and difficult/impossible to achieve. One solution was to replace required expertise with "playbooks," that is, recipes that could be followed by SOC staff in particular situations. One of the most important manual efforts for which playbooks are used is remediation (implementing attack counter measures to address damage and prevent further attacks). Remediation may require intervention into the underlying network being secured.

Playbooks and associated manual effort led to at least four sets of serious problems. First, they often led to human errors commonly called "fat finger errors" because many of them involve keyboarding errors. Since the staff member executing the playbook didn't have the full expertise, and couldn't recognize and/or repair the resulting problem, these fat finger errors led to whole networks ceasing to function at all for extended periods of time. Thus, using playbooks to protect the network could result in destroying the network. The second problem is that playbooks only worked for what was anticipated. They couldn't fully address the quickly changing attack environment. Third, when they did work, they at best worked slowly allowing time for serious damage to occur. Speed is very important when attackers are using sophisticated automated attacks. Finally, when components got software updates, new ones were added, etc., the playbooks became obsolete. Using an obsolete playbook could bring down a system. Not doing anything while a new playbook is developed leaves systems open to significant damage.

As modern networks and associated information systems continue to evolve and become more and more critical to society, new threats and vulnerabilities are creating new challenges. The challenges are significant because of factors such as: the advent of nation state cyber-attacks, the move to software centric networks, increasing network scale, complexity, and volatility, increasing number of events to track, increasing frequency of attacks, increasing sophistication of attackers, decreasing attack cycle times, and/or increasing potential for damage from attacks.

Networks, network components, computers, PC's, Smart Phones, servers, Clouds, etc. have become targets. Previously, an organization's complex software was confined to a single central site data center. Because, by its very nature, modern information systems are spread out over large geographic areas, and software-based systems are pervading the entire network, vulnerabilities may be distributed throughout the network; not just at central sites and at network edges. At the same time, networks are evolving from hardware-based components to more software-based components (SDN—Software Defined Networking; SDR—Software Defined Radio; etc.).

There has been some progress in the areas of detection of malicious activity that has penetrated outer defenses such as firewalls and virus checkers. This has, so far, been from two types of systems: behavioral analysis systems and threat intelligence systems. In the future there may be other forms developed. If so, those forms will be dealt with in a similar fashion to that shown below for these two. Behavioral analysis today is primarily based on collecting information from components in the network such as computers, routers, switches, etc., bringing it back to a central site, and using behavioral algorithms at the central site to detect malicious activity. Threat intelligence systems collect information from outside the network on potential attacks. In both cases the response, i.e., the remediation, is mainly manual. Remediation may include the preparation for anticipated attacks (e.g., the "hardening"). Manually tying all the point solutions together and manually performing remediation are prone to several problems such as: long delays in fixing problems, Fat Finger errors causing more damage, difficulty finding sufficient qualified staff able to remediate the growing number and complexity of types of systems deployed, and the cost of maintaining such staffs. Tying all the point solutions together is often called orchestration and remediation is often called response.

Automating these functions can be seen as equivalent to creating an autonomous network immune system. The autonomous network immune system, disclosed herein, is a practical way of achieving the goals of a cyber immune system while solving all the problems described above with which others have struggled. The autonomous network immune system may be configured to implement an overlay of end-to-end orchestration components throughout the network/system that can interact and negotiate with each other to automate anticipation, prevention, detection and remediation of Cyber intrusions and infections. In some embodiments, this overlay is incorporated into (that is run on the same resources as) the underlying systems, but just as the human body has several communications channels and distributed control components (conscious, autonomic, lymphatic, ganglions, etc.) there may be value in keeping all, or parts, of the network immune system separate.

In the science of cybernetics there is a fundamental principle that, to be effective, a solution space must have at least one more degree of freedom than the problem space it seeks to solve. Furthermore, the greater the increase in solution degrees of freedom over the problem space, the better. The system described herein maintains more degrees of freedom than the security problem, especially in regards to scale, complexity, and volatility, as well as many other aspects. Other attempts have tried to reduce the number of degrees of freedom of the problem in order to solve it. In doing so, they have fundamentally limited their effectiveness.

Some of the ways that previous approaches have tried to limit degrees of freedom have included:

1. Only using specific links between specific systems (often resulting in a "spaghetti architecture" that is difficult to maintain, slow/difficult to respond to software upgrades, does not scale, etc.)

2. Only implementing central site systems (confounding the data volume problem and limiting effectiveness outside of the central site)

3. Limiting the sources of behavioral information to reduce the volume of data to be dealt with (limiting the effectiveness of behavioral analysis)

4. Only working with a reduced set of point solutions (often called the best of breed approach)

5. Only working with point solutions provided by the same vendor providing the orchestration and automation system (again reducing what can be used which is particularly damaging in an environment of rapidly changing threats and associated point solution responses)

6. Not preserving an organization's sunk investments in point solutions (thus increasing costs)

7. Replicating the playbooks while not providing an automated mechanism to respond to the unforeseeable 8. Not providing a single end-to-end view that is customized to the particular job functions of staff (increasing the stress on security staffs, while increasing staffing costs and limiting effectiveness)

9. Slow costly processes to add new point solutions as new threats appear (dramatically reducing effectiveness)

10. Forced retirement of productive resources

11. Not adequately securing the automated orchestration and response system

12. Not providing a distributed comprehensive umbrella model that can be updated while the system is running The system disclosed herein provides the ability to:

1. Preserve the sunk investment in existing point solutions

2. Strengthen the outer skin while quickly identifying and remediating the 5% of attacks that penetrate the outer security skin 3. Provide an easy on-ramp for the new point solutions that will be required and implementing implement security for new types of components added to the underlying network 4. Reduce the stress on security staff, improve their productivity, and make their function practically achievable 5. Secure not only the central site and end points, but also everything in between and do so with low latency 6. Provide a cost effective solution that provides the degree of cyber security organizations are seeking.

FIG. 1A is a high level summary of the autonomous network immune system described in detail below. System 10 is an overlay on an underlying network that seeks to harden the underlying network against attack, find attacks that have successfully penetrated defenses, and quickly stop the damage while preventing further similar attacks.

In the example shown, system 10 includes a conductor 1 that is responsible for the creation and on-going configuration of a plurality of orchestrators 2. Orchestrators 2 are standard components that each are personalized to work with the specific underlying system component with which they are associated (e.g., components 3, 4, 5, 6, 7, 8, 9). Orchestrators 2 are personalized by the addition of a Bridge that translates from the data model of the underlying component they are associated with to an Umbrella data model (part of Framework—9a), and by objectives, algorithms, and constraints appropriate for the underlying component with which they are associated. Orchestrators 2 working together using a negotiation process (part of Framework—9a) perform the functions. Orchestrators 2 may receive inputs from and deliver outputs and/or instructions to a range of types of systems including:

Threat intelligence System systems 3 that deliver information for outside system 10 about potential vulnerabilities and attacks on others Existing deployed security tools 4 (e.g., Behavior Analysis Systems, SIEMs, Firewalls, etc.)

Components of the underlying network 5 (e.g., switches/routers, computer, basestations, etc.)

Clouds 6—both public and private and the applications (apps) that run on and move between them Mobile components 7 of the underlying system including vehicles—including autonomous vehicles, cell phones, mobile base stations, etc.

Semiconductor chips and their internal components/networks 8

Security Operations Center (SOC) staff 9

What follows are examples of implementations that illustrate how the invention is used to create an evolving network immune system. These examples are meant to be illustrative and are not an exhaustive list of all the different ways of implementing the invention.

Figure 1B:
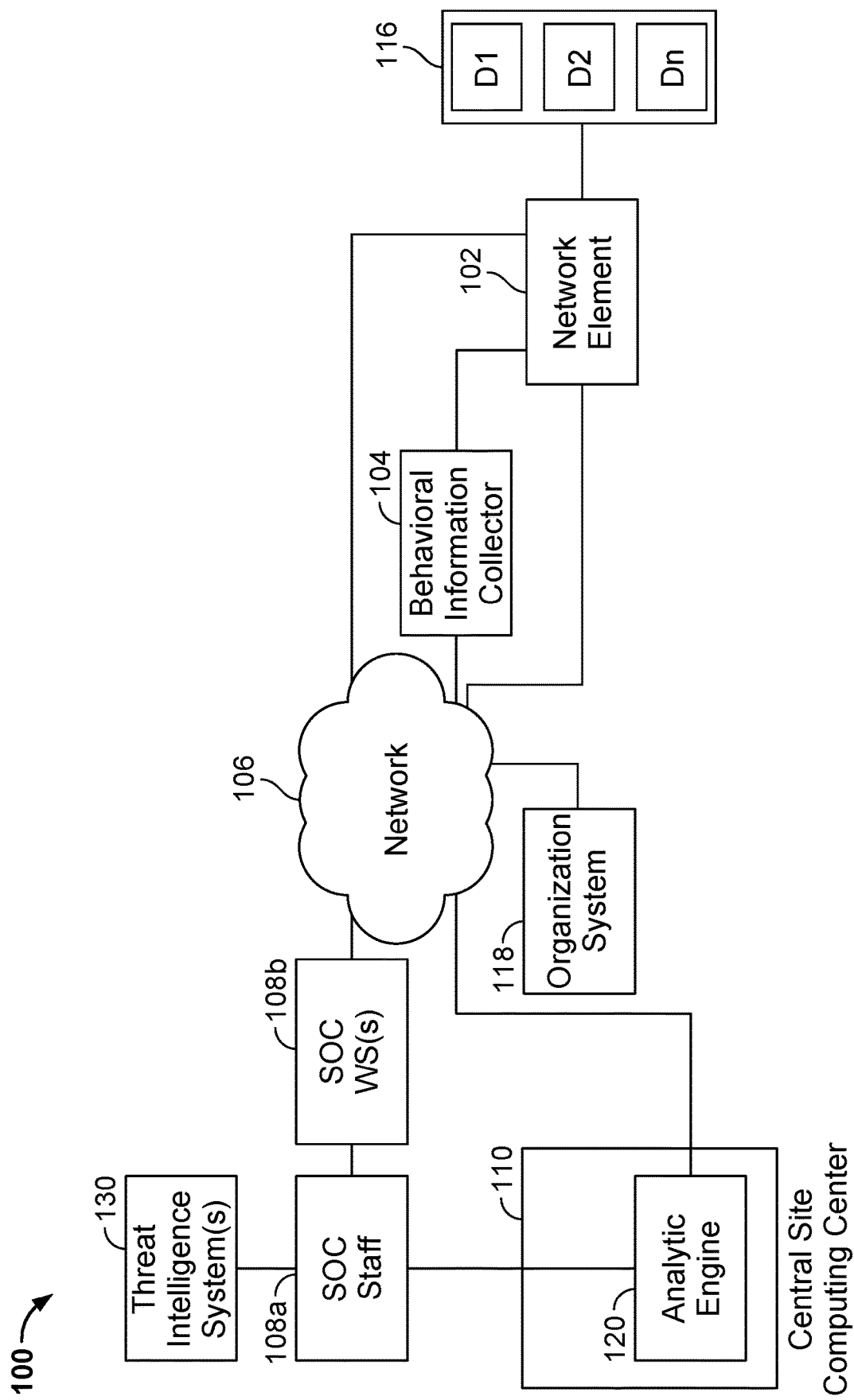
FIG. 1B is a block diagram illustrating a cyber security system.

FIG. 1B is a block diagram illustrating a cyber security system. System 100 is configured to rely on manual remediation and manual updating of algorithms based on inputs from threat intelligence systems and other manual interactions with other parts of the security systems generally performed by staff in a Security Operations Center. An SOC typically contains staff 108a, workstations 108b (digital displays plus audio, phones, etc.), sometimes other information processing and storage equipment, etc. In various embodiments, the SOC is owned and operated by an organization that owns and operates part or all of the system that is to be protected (including organization system 118, network element 102, devices 116, etc.; an organization that specializes in providing security services; a Telco that provides some or all of Internet 106, network element 102, devices 116, etc.; an individual, etc.)

In the example shown, system 100 includes an underlying network element 102 (e.g., an edge router with interior and exterior firewalls, a computing component/system, a communications component/system, etc.), a behavior information collector 104 (sometimes also referred to as a security probe), a network 106 (e.g., the Internet, wide area networks, personal area networks, local area networks, etc.), a Security Operations Center (SOC) composed of SOC staff 108a (one or more operators, users, security experts, management, etc.) and SOC Workstations 108b (a workstation is composed of some form of keyboard/display and voice communications systems), a plurality of computing devices 116 served by network element 102, an organization system 118, and an analytic engine 120 in a central site computing center 110. The analytic engine 120 may be comprised of one or more processors configured to analyze data collected from behavior info collector 104. The organization system 118 includes the underlying computing and communications resources associated with an organization for which cyber security services are being provided. The plurality of computing devices 116 may include fixed devices (e.g., desktop, mainframe, server, television, smart television, etc.) and/or mobile devices (cell phone, smart phone, tablet, smart watches, autonomous vehicles, etc.).

In the example shown, collector 104 is generally configured to capture either log information, or IP address information (but not both) from network element 102 and to deliver that information to analytic engine 120 via network 106. Analytic engine 120 may be configured to compile the collected information and determine a normal behavior profile associated with collector 104. For example, a router (e.g., network element 102) in Washington D.C. communicates with network nodes in Boston, New York, other parts of the country, such as Washington D.C. and Atlanta. When analytic engine 120 determines that network element 102 is communicating or has communicated with a new node, such as a node in Russia, analytic engine 120 is configured to issue a notification, such as an abnormal behavior alert to a human operator in the SOC 108a. The operator uses the operator's technical knowledge and documentation including playbooks (work flow process scripts for specific types of alerts and specific types of equipment) to determine a course of action. The operator alone or with other people accessed by phone, messaging, email, etc. decides on the course of action (the selection of course of action may also be in a playbook). The operator alone or with other people accessed by phone, messaging, email, etc. starts the remediation process (making changes to components in the underlying network) manually (the remediation process may also be in a playbook).

In this example, the operator may also receive threat intelligence information from one or more threat intelligence services 130, but only in a human readable form (e.g., a printout, email). The operator reads that information, analyzes the information, and enters the results of the analysis manually into analysis engine 120. Based on that information, analysis engine 120 or SOC staff 108a may trigger one or more other alerts resulting in remediation actions that are manually executed. Today, in one US corporation, a single person may receive threat intelligence information from 276 different threat intelligence services, each with its own method of delivery, format, data model, etc. That single person has to read all that information, analyze it, and decide what and how to enter it into that company's system. That person typically also has other security related duties that must be performed on a daily basis. This makes the use of threat intelligence information less than optimal. The point of threat information is to learn about attacks on others and to use that information to protect a network before it is attacked. However, if one cannot quickly sift through all the information, find what is relevant, and implement remediation before the attack reaches the network, the advantage/benefit is lost.

There are a number of problems with these manual processes. By its very nature, manual responses are slow relative to computer speeds. Especially with attack cycle times (the time a single form of attack is in use—attackers change the form of the attack once they think that targets are aware of its current form and are defending against it) in the single digits hours and dropping fast (expected to soon be in minutes), manual responses are often too late. A slow response to malicious activity in an organization's communication/computing system can allow data loss, corruption, etc. that can be very expensive in both direct costs and brand damage. But with the advent of connected medical devices, automobiles, etc. leading to self-driving cars, self-driving everything—in other words pervasive automation—slow response can even lead to otherwise preventable deaths. In order to accomplish even these relatively slow responses, the SOC needs to be staffed 24/7 with people who have the necessary expertise on: all of the information assets plus relative value of each, all of the different technologies deployed, and all the different remediation techniques for all the technologies in the network. In practice, this turns out to be very expensive, and so difficult to achieve, that it is considered impossible by some. To try to overcome the difficulty and cost, many try to employ playbooks. Unfortunately, playbook use often leads to keyboard errors (sometimes called fat finger problems). Because operators are working with technology that they are not familiar with, they may not be aware of their keyboarding errors until the network/system has crashed. The result is that many organizations are afraid to respond to known vulnerabilities and/or attacks out of fear that in responding they will cause severe damage to their systems. So, in summary, these manual responses are expensive, fraught with danger, and often allow serious and expensive damage to be done by malicious attackers.

An autonomous network immune system that can combine inputs from a wide variety of different incompatible systems to develop a course of action and execute one or more remediation steps in response to a suspected network attack is disclosed herein. The autonomous network immune system can respond in a manner that is similar to the human immune system when the human "skin" defenses are breached. The autonomous network immune system may solve the problems in implementation and deployment that result from the scale, complexity, and volatility of today's large networks and their attackers. Further, disclosed is a system that orchestrates existing security systems that work well in isolation, but are not efficient and may rely on manual interfaces to cooperate with other related security systems.

Analytic engines served by collectors/security probes can quickly identify a breached component. The response may be to partially or fully remove that component from the network, repair, reconfigure, patch, reinstall software from a known good source, etc. An end-to-end orchestration system can connect to the collectors (e.g., security probes), and/or accept alerts from, and automate the response to infection detections. In this way, such a system becomes the immune system of the network. Furthermore, it can connect to one or more threat intelligence systems and other security related systems to automate the process of updating algorithms based on collected information that reports on attacks on others, identifies new vulnerabilities, anticipates coming attacks, etc. It can also automate the delivery of information (recent/ongoing attacks and associated information) to threat intelligence systems. For example, the information that is detected by the autonomous network immune system may be provided to one or more threat intelligence systems. Finally, it can connect the plurality of the separate security systems together, providing an end-to-end real time view of the security situation, automating many of the current manual tasks, reducing response times, improving SOC staff productivity, etc. resulting in superior security system performance.

Figure 2:
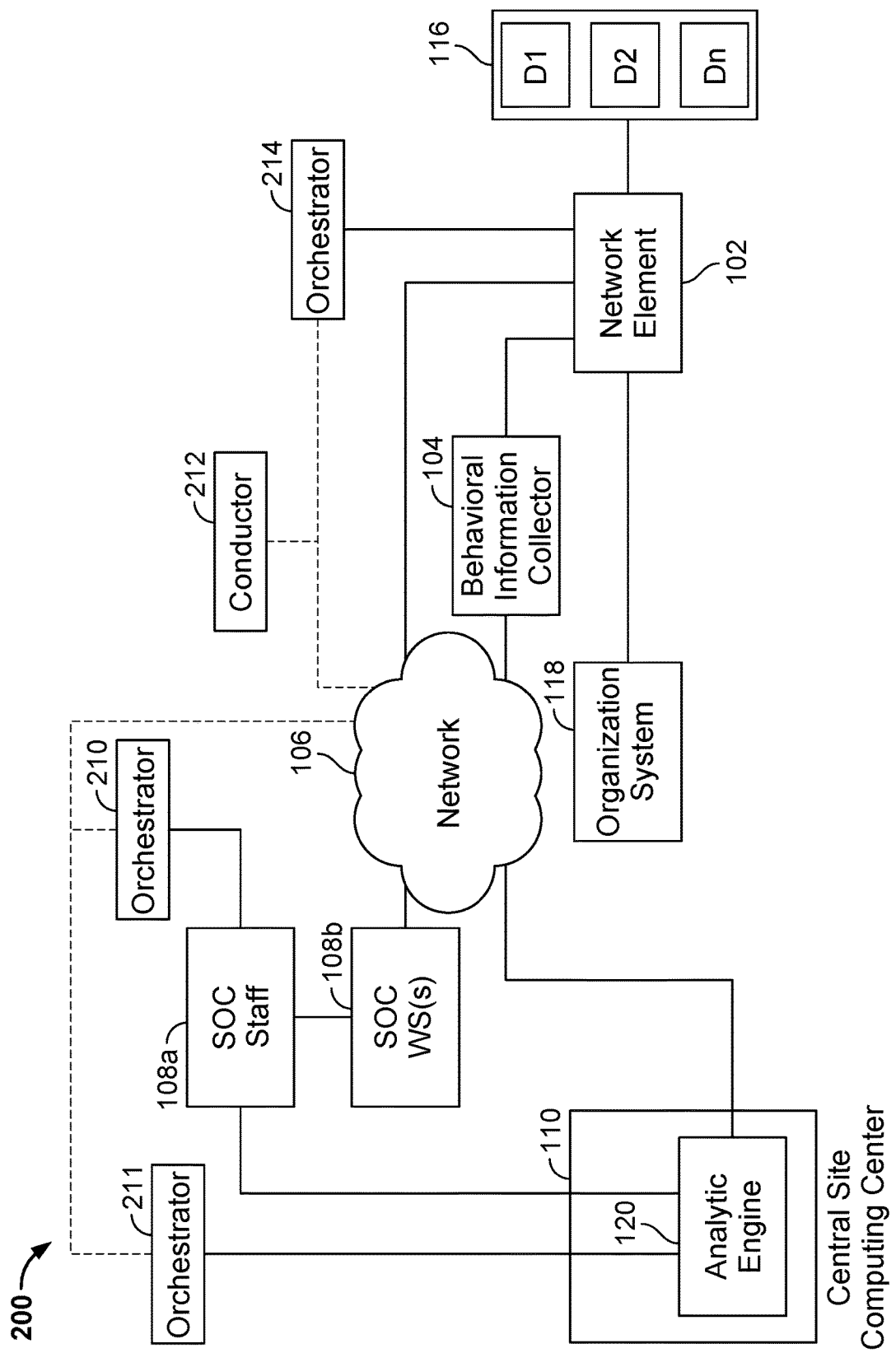
FIG. 2 is a block diagram illustrating an embodiment of an autonomous network immune system.

FIG. 2 is a block diagram illustrating an embodiment of an autonomous network immune system. In the example shown, the autonomous network immune system 200 includes an underlying network element 102 (e.g., an edge router with interior and exterior firewalls, a computing component/system, a communications component/system, etc.—this is merely one example and any computing, communications, sensor, actuator, etc. component may be placed in the position of network element 102), collector 104, a network 106 (e.g., the Internet, wide area networks, personal area networks, local area networks, etc.), SOC staff 108a, SOC Workstation(s) 108b consisting of computer input and output devices, and audio (telephone or other audio communications systems) able to communicate with other people and systems, a plurality of computing devices 116 served by network element 102, organization system 118, an analytic engine 120 in a central site computing center 110, a conductor 212, and orchestrators (sometimes referred to as a Local Security Engine—LSE) 210, 211, 214. In some embodiments, an orchestrator and/or a conductor can function in a software module, Virtual Machine (VM), a container, similar virtualization system, as an operating system application, as a background task, as embedded software, as firmware, as hard wired logic, etc., in a central site computer system, in the same variety of implementations shown above and below on any intermediate component in the network, on the component with which it is associated, plugged into the component with which it is associated using a form factor such as a Blade, thumb drive etc., hardwired logic, in a computer "backpack" attached to the component with which it is associated, in a separate computer system anyplace in the network, etc. All or part of network 106 can be a separate (air gap) network, the common internet, a Virtual Private Network (VPN, MPLS, etc.), an implementation of the Dark Net (that is using internet addresses that are not published, do not appear in a publicly available DNS server(s), and do not respond unless arriving packets have appropriate credentials), protected in some other way including but not limited to advanced encryption techniques, a combination of the above, etc. Conductor 212, orchestrators 210, 211, 214, and the network with which they communicate may be seen as a high priority target by attackers. To protect them from attackers, conductor 212 and orchestrators 210, 211, 214 may be configured on a separate network (e.g., a separate (air gap) network, the common internet, a Virtual Private Network (VPN, MPLS, etc.), an implementation of the Dark Net (that is using internet addresses that are not published, do not appear in a publicly available DNS server(s), and do not respond unless arriving packets have appropriate credentials), protected in some other way including but not limited to advanced encryption techniques, or a combination of the above.). FIG. 2 and subsequent embodiments depict this potentially separate network with a dotted line. In other embodiments, conductor 212 and orchestrators 210, 211, 214, may be configured on the network associated with system 200. In some embodiments, a combination of orchestrators and conductors can be used to monitor orchestrators 210, 211, 214 and conductor 212.

A conductor can reside anywhere in network 106 and can be moved around in the network without changing the conductor's software. In some embodiments, conductor 212 is located in a central site computing center 110. An orchestrator may reside anywhere in network 106 and can be moved around in the network without changing its software. The closer an orchestrator is to the component with which it is associated, the better the performance of the orchestrator due to lower latency, access to more and fresher data, etc. This is because data has not been summarized and delayed to lessen load on the network, etc. However, there may be one or more policies based on security, reliability, and/or performance reasons that keep the orchestrator close to a component, but on a separate hardware/communications system, or someplace else in the network. Over time, the orchestrator may move from location to location based on one or more policies. Over time, the conductor may move based on one or more policies, although it is likely that conductors will move less frequently than orchestrators. In some embodiments, a plurality of orchestrators are located in a network similar to the way ganglions are located within a body's nervous system, that is the orchestrators are distributed throughout the network at locations near network devices, points where information and control converge, etc., which allows the system to quickly respond to abnormal network behavior.

Conductor 212 may be initially loaded into the autonomous network immune system 200. Conductor 212 is configured to generate one or more orchestrators. Conductor 212 is configured to push out the one or more generated orchestrators to one or more selected locations in the autonomous network immune system 200. In some embodiments, the one or more locations are selected by an administrator or operator associated with the autonomous network immune system. The one or more orchestrators may be generated in a form that matches the device with which it will be associated. For example, a device may be capable of hosting a virtual machine. Conductor 212 may generate a virtual machine that includes the orchestrator and deploy the virtual machine to the device. In other embodiments, the orchestrator is transferred to a memory stick and the memory stick is inserted into a computer. Conductor 212 is configured to store the IP addresses of the connected devices of the autonomous network immune system. Conductor 212 is configured to determine which of the connected devices should be subject to orchestration.

Orchestrators 210, 211, 214 and conductor 212 may be configured to implement an IF-MAP (Interface for Metadata Access Points) datastore or IF-MAP like datastore. IF-MAP and IF-MAP like systems provide the ability of IF-MAP clients, such as the orchestrators located throughout a network, to store and update metadata records, as well as to subscribe to be updated in the event of changes in image data associated with a network device (such as a computing, sensing, actuator, storage and/or communications system whether hardware, software, or a combination of the two) to which an orchestrator is associated. Image data may include configuration, activity, log, addresses and address related information of others communicated with, operational data, and other data about the activity of the device including configuration, content contained in it and/or passed through it, functions performed, etc. An orchestrator may be configured to subscribe to one or more parameters from a network device it is associated with or through an orchestrator associated with another network device. In some embodiments, an orchestrator is configured to subscribe to changes to one or more parameters from a network device or an orchestrator associated with the network device. In some embodiments, an orchestrator is configured to subscribe in the event of a change to a first parameter, to one or more other parameters from a network device or an orchestrator associated with the network device. In this way, only the data that is needed is delivered where it is needed, when it is needed.

Conductor 212 is configured to create and configure orchestrators 210, 211, 214. Configuration includes providing and updating algorithms, objectives, and constraints to the orchestrators. Constraints include the definition of parameters of the component the orchestrator is associated with such that the component's local data model can be translated into the data schema (e.g., Umbrella Model) used internally by the orchestrator/conductor network, and the protocol to connect to that component. The Umbrella Model is a superset of all the data models of all the devices/systems within the span of control of the conductor/orchestrator (108a, 108b, 120, 104, 102, 116 in the realization shown in FIG. 2). In order to achieve this, each local data model has to be translated to/from the Umbrella Model. Each orchestrator does this corresponding translation. Because software upgrades to existing devices can result in changes in local data models and adding new devices can result in the addition of new data models, it is necessary that the Umbrella Model and the local translators in the orchestrators be able to change while the overall conductor/orchestrator system is running. The translation function in each orchestrator is isolated within a module called a Bridge. A Bridge in one orchestrator can be updated without changing any other Bridge. This makes the resulting system easy to maintain even as the scale grows dramatically. The ability to evolve the Umbrella Model makes it easy to deal with high rates of volatility even in conjunction with a large and growing scale. The combination of the Bridges, the Umbrella Model, and the autonomous functionality makes it easy to deal with high levels of complexity even in conjunction with a large and growing scale and volatility. This kind of data model flexibility and flexibility in its associated data stores is referred to as organic flexibility.

Orchestrators 210, 211, 214 are configured to receive information from the components with which they are associated and to deliver information and commands to the components with which they are associated. In the example shown, orchestrator 210 is associated with the SOC staff 108a. Orchestrator 210 is configured to control access and the privileges of SOC staff 108a to the orchestrator/conductor network, allowing them to interact through the other orchestrators with the underlying network components. Orchestrator 210 may also perform data visualization for the operators including structured means to accept input from operators that minimizes the opportunities for operator input error (fat finger errors). This operator input may be part of a structured use case implemented by the conductor/orchestrator system, or it may be unstructured queries. Orchestrator 210 is configured to connect SOC staff 108a via a device of SOC staff 108a (not shown) to the orchestrator/conductor network, to provide data visualization, and to provide data autonomously or via manual actions. Orchestrator 211 is associated with the analytic engine 120 and is configured to communicate with orchestrators 210, 214. Orchestrator 214 is associated with the underlying network element 102 (e.g., edge router) and is configured to communicate with orchestrators 210, 211. Orchestrator 210 can request conductor 212 to create additional orchestrators, request that orchestrators be moved to different locations in the network, request that orchestrators be updated (translation process, algorithms, objectives, constraints, underlying software versions, etc.), etc. For internal security reasons, all human input regarding the conductor/orchestrator network originates at the orchestrator 210 or similar component. There may be a human interface to the conductor, but this is primarily only used to create and update the conductor and is strongly protected by at least dual authority credentials, heavy levels of encryption, physical security, etc.

In the example shown, analytic engine 120 is configured to determine that one of the computing devices 116 has been compromised based on information provided by collector 104. Analytic engine 120 can deliver a notification and/or alert to orchestrator 211. Orchestrator 211 is configured to receive the alert through an interface to the analytic engine. In some embodiments, the alert is also delivered to SOC staff 108a. The alert can be delivered to SOC staff through a special terminal device, paper such as a job ticket or report, the SOC workstation 108b, etc. In some embodiments, it is delivered through some other mechanism other than the SOC workstation 108b. Based on algorithms (which can be work flow process scripting, or more complex autonomous interactions between orchestrators), constraints, and objectives (which can include information about the value of the component in question, its owner, value of timely response, etc.), orchestrator 211 can determine whether human interaction should be included in the course of action, or if remediation should proceed immediately. In the event human interaction is determined to be needed, information determined by the algorithms, objectives, and constraints is provided to orchestrator 210, i.e., the orchestrator associated with SOC staff 108a. In some embodiments, the information is presented in a screen that minimizes the opportunity for the operator to make a "Fat Finger" error. For example, it is presented in a screen that is configured to provide relevant information and only allows for yes or no clicks/responses, confirmation interaction, etc. In some embodiments, orchestrator 211 provides a message to orchestrator 214 to begin remediation. In other embodiments, orchestrator 210 provides a message to orchestrator 214 to begin remediation. In other embodiments, orchestrator 211 and orchestrator 210, in conjunction, provide a message to orchestrator 214 to begin remediation. In response to receiving the message, orchestrator 214, based on algorithms, objectives, and constraints, is configured to communicate with the device with which it is associated, in this example, the underlying network element 102 (e.g., an edge router) and via the underlying network element 102, to communicate with the computing devices 116 to commence remediation. Examples of remediation actions include, but are not limited to, partially or fully limiting communication with the other parts of the underlying network with which at least one of the one or more computing devices 116 can communicate, rebooting at least one of the one or more computing devices 116, restoring at least one of the one or more computing devices 116 (e.g., to a last known good state), repairing at least one of the one or more computing devices 116, patching a software element associated with at least one of the one or more computing devices 116, reloading installed software on at least one of the one or more computing devices 116 from a trusted source, reconfiguring at least one of the one or more computing devices 116, reconfiguring network element 102, other remediation actions that could be manually performed, other remediation actions that could be performed through automation, etc.

The orchestrator network (e.g., orchestrators 210, 211, 214) is particularly effective in catching malignancies before they can spread because, in addition to being associated with central site systems, it can be distributed to the interior and edges of the network where attacks are most likely to start, and can react quickly. In large, complex, volatile networks, manual remediation and/or solely central site-based responses can't be fast enough to prevent significant damage. System 200 is configured to automate and quickly respond where the attack is originating. This would be acting in a way similar to how our lymphatic system protects against breaches of our outer defenses.

Figure 3:
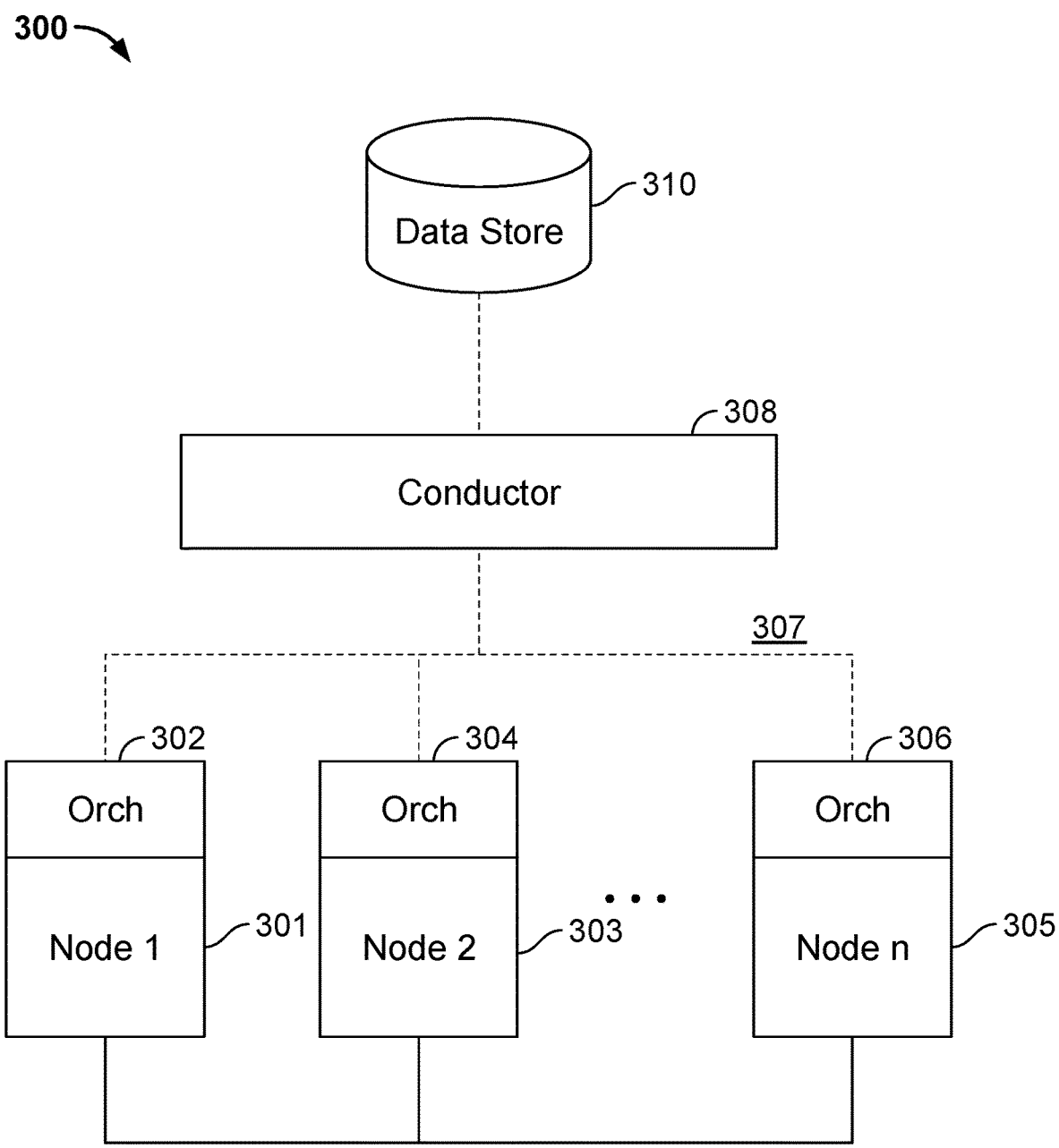
FIG. 3 is a block diagram illustrating an embodiment of an autonomous network immune system.

FIG. 3 is a block diagram illustrating an embodiment of an autonomous network immune system. In the example shown, each of the network elements represented by nodes 301, 303, and 305 has an associated orchestrator with which it is associated, represented in FIG. 3 by orchestrators 302, 304, and 306, respectively. The orchestrators may communicate through a wireless connection or a wired/optical fiber connection. In some embodiments, an orchestrator comprises software running on a processor comprising the equipment node with which the orchestrator is associated. Orchestrators 302, 304, and 306 communicate via communication path 307 to express and/or fulfill requirements. In some embodiments, each of the orchestrators is configured to perform one or more of the steps of the process of FIG. 8, such as by discovering adjacent or otherwise available nodes, establishing a connection or otherwise establishing communication with them, describing and/or discovering capabilities, negotiating a contract to fulfill a requirement, configuring the node with which it is associated to fulfill a contract, and actually performing operations to fulfill the requirement as agreed in the contract.

Conductor 308 may install, configure, and monitor the behavior of the orchestrators and intervene if and when necessary to create global optimization. Conductor 308 accesses node image data and global information about the environment (via orchestrator(s) not shown) which can include technical detail not available to the node, environmental information (such as sun spot forecasts, impending hurricanes, changes in the global threat environment, etc.), and impending human activity which will affect demand for services (such as: changing staff duties/functions/travel, a parade, sporting event, political demonstrations, terrorist activity, cyber warfare, etc.) stored in a data store 310 to determine for a resource or other requirement a node to fulfill the requirement. In various embodiments, each of the nodes 1 through n is represented in data store 310 by node image data that indicates one or more of an objective of the node (e.g., establish and maintain secure connectivity with another node as required, etc.), rules/constraints that apply to the node (e.g., seek operator permission before instituting a remediation action, etc.), algorithms associated with the node (e.g., ones the node is configured to implement and/or algorithms conductor 308 should use to meet needs of the node and/or determine whether the node should be used to meet a particular need (e.g., limit connectivity to stop intrusion, etc.)), capabilities of the node (e.g., does it have a Firewall, can the Firewall be configured remotely, etc.), how the node is configured and/or capable of being configured (e.g., can the node pass known good software and install commands to downstream devices, etc.), and an environment in which the node is operating (e.g., is the node a network element such as an edge router associated with an Automatic Teller Machine and thus needs to act as fast as possible and not wait for operator involvement when there is an indication of an intrusion, etc.). In various embodiments, data store 310 is implemented as an IF-MAP or similar data store, in which each node is represented in an umbrella model by a metadata record that expresses attributes of the node in a meta-language. The IF-MAP data store enables a data schema to be derived from metadata records received to be stored. IF-MAP like systems provide the ability of IF-MAP like participating nodes, such as nodes 1 to n, to store and update metadata records, and for nodes and/or conductor 308 to subscribe to be updated in the event of changes in node image data, for example, as a node is reconfigured, has a capability degraded and/or upgraded, detects a change in its environment (e.g., discovering new wireless connectivity options available through a beacon or other signal of a nearby base station, femtocell, access point, etc.), connection of an Automatic Teller Machine to a store network that previously did not have one, addition of a new fixed communication link to add capacity, etc. While IF-MAP is used in some embodiments, in other embodiments any data store that does not require an upfront, agreed defined data model, but rather can grow organically, may be used. Data Store 310 is shown as a single unitary store attached to the conductor 308. In some embodiments, the data store is a single unitary store. In other embodiments, the data store can be distributed over the conductor and all of the orchestrators 302, 304, 306. To the extent that the local data models of nodes 301, 303, 305 are different from each other, one of the algorithms each orchestrator 302, 304, 306 contains functions as a bridge that translates the to and from node specific data models to a superset umbrella model.

In various embodiments, conductor 308 is configured to fulfill requirements by searching node image data in data store 310 to identify one or more nodes capable of fulfilling requirements. Competing requirements are fulfilled optimally by applying one or more algorithms identified in node image data as being associated with and/or supported by one or more nodes identified based on node image data as having a capability that could be used to fulfill the requirement. Conductor 308 in various embodiments is configured to resolve differences between algorithms associated with dissimilar nodes and/or to implement a global optimization algorithm configured to achieve a globally optimal solution, e.g., by finding an optimal combination of locally optimized solutions.

Figure 4A:
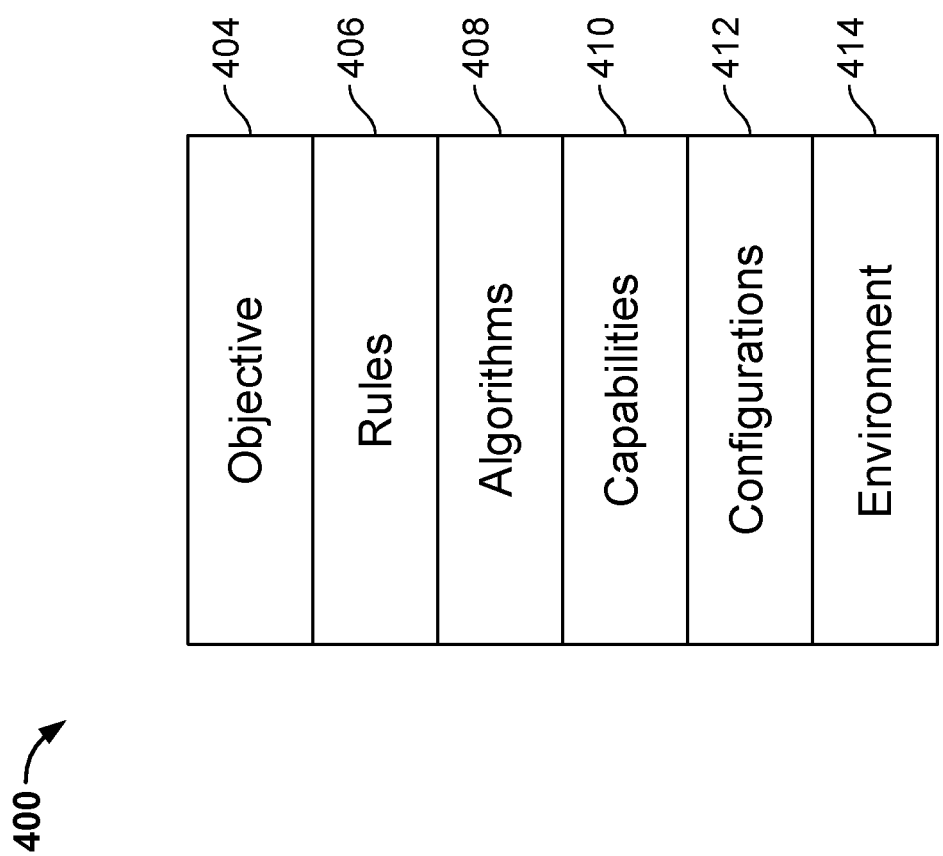
FIG. 4A is a block diagram illustrating an embodiment of a data structure for a node image.

FIG. 4A is a block diagram illustrating an embodiment of a data structure for a node image. The node image may be stored by an orchestrator with which the node is associated, and/or a conductor. When stored in a conductor an orchestrator may subscribe to it. In the example shown, node image 400 includes metadata, expressed in a meta-language using the umbrella model, that stores various attributes of the node (such as it controls communication to and from the CEO's personal computer, etc.), including in the example shown one or more objectives 404 of the node (e.g., establish and maintain secure connectivity as required, etc.), one or more rules 406 (sometimes also called constraints) applicable to the node (such as, if a security problem is found on the CEO's computer no automated action is to be taken, etc.), one or more algorithms 408 associated with the node (such as, the CEO's personal assistant is to be triggered to take recommended emergency procedures when the CEO's computer is showing signs of a potential intrusion, etc.), one or more capabilities 410 of the node (such as the ability to selectively control connectivity of downstream devices based on machine to machine instructions), one or more current and/or possible configurations 412 of the node (such as close ports 150 to 165, etc.), and an environment 414 in which the node is operating (such as this is a factory floor automation environment with fixed and mobile robots each with orchestrators with parameter X subscribed too, etc.). In various embodiments, the respective nodes and/or the conductor create the node image 400, for example, by storing metadata in a node image record in an IF-MAP similar or other data store, as described above.

Figure 4B:
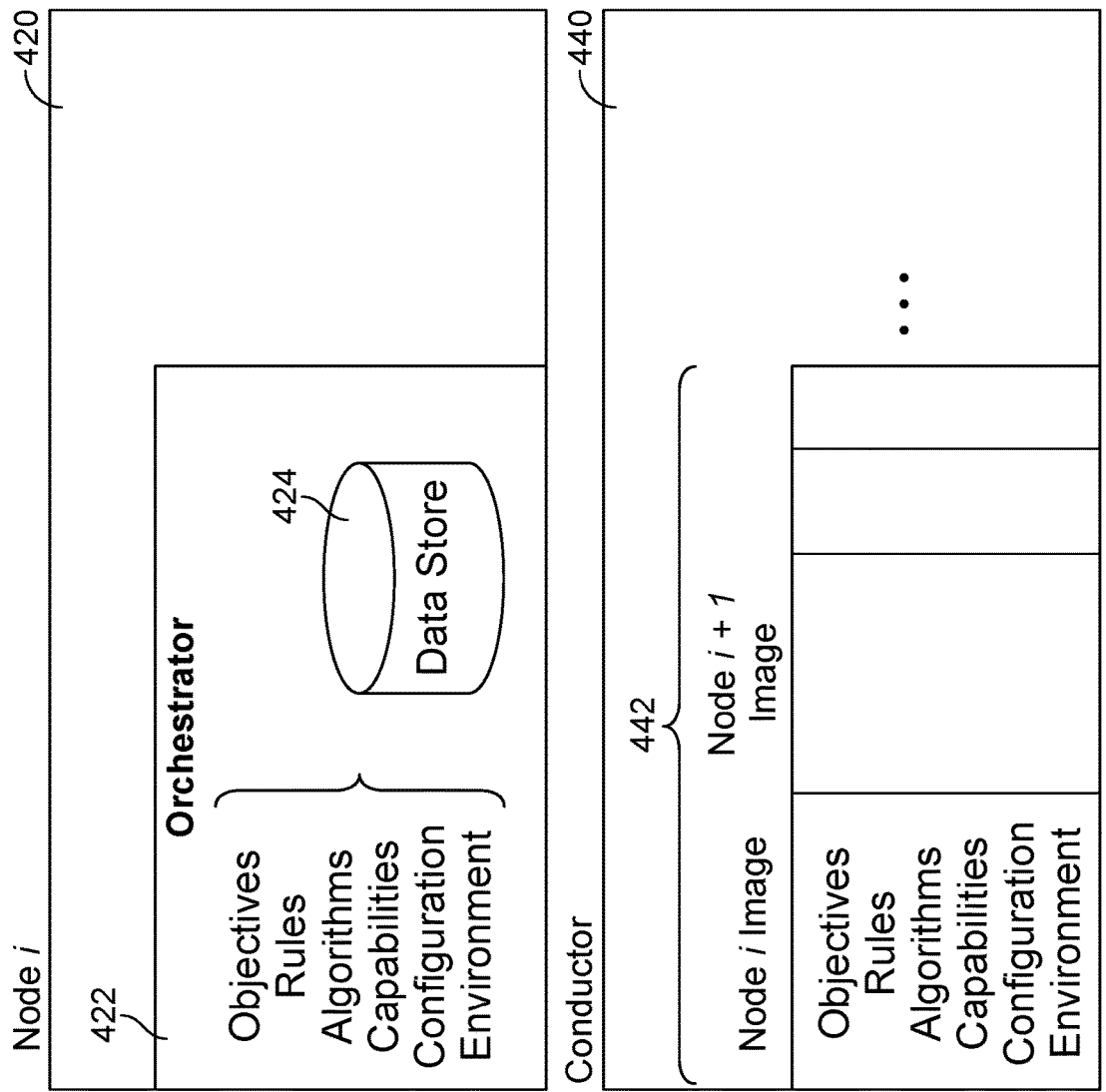
FIG. 4B is a block diagram illustrating an embodiment of a node, an orchestrator, and a conductor configured to store a node image.

FIG. 4B is a block diagram illustrating an embodiment of a node, an orchestrator, and a conductor configured to store a node image. In the example shown, node i 420 is associated with an orchestrator 422 that stores in a local data store 424 node image data such as that shown in FIG. 4A. Conductor 440 stores node images 442 for a plurality of nodes, each image in some embodiments corresponding to node image 400 of FIG. 4A. Node images 442 may store the data structures and high level objectives, algorithms, and constraints of orchestrator/node images, or may also store some or all of the data stored in the data structure. The data stored may be snapshots from specific times, as current as possible (there is propagation, processing, etc. delays between orchestrators and conductor) specific data, as current as possible summarized data, or a combination of the above.

Figure 5:
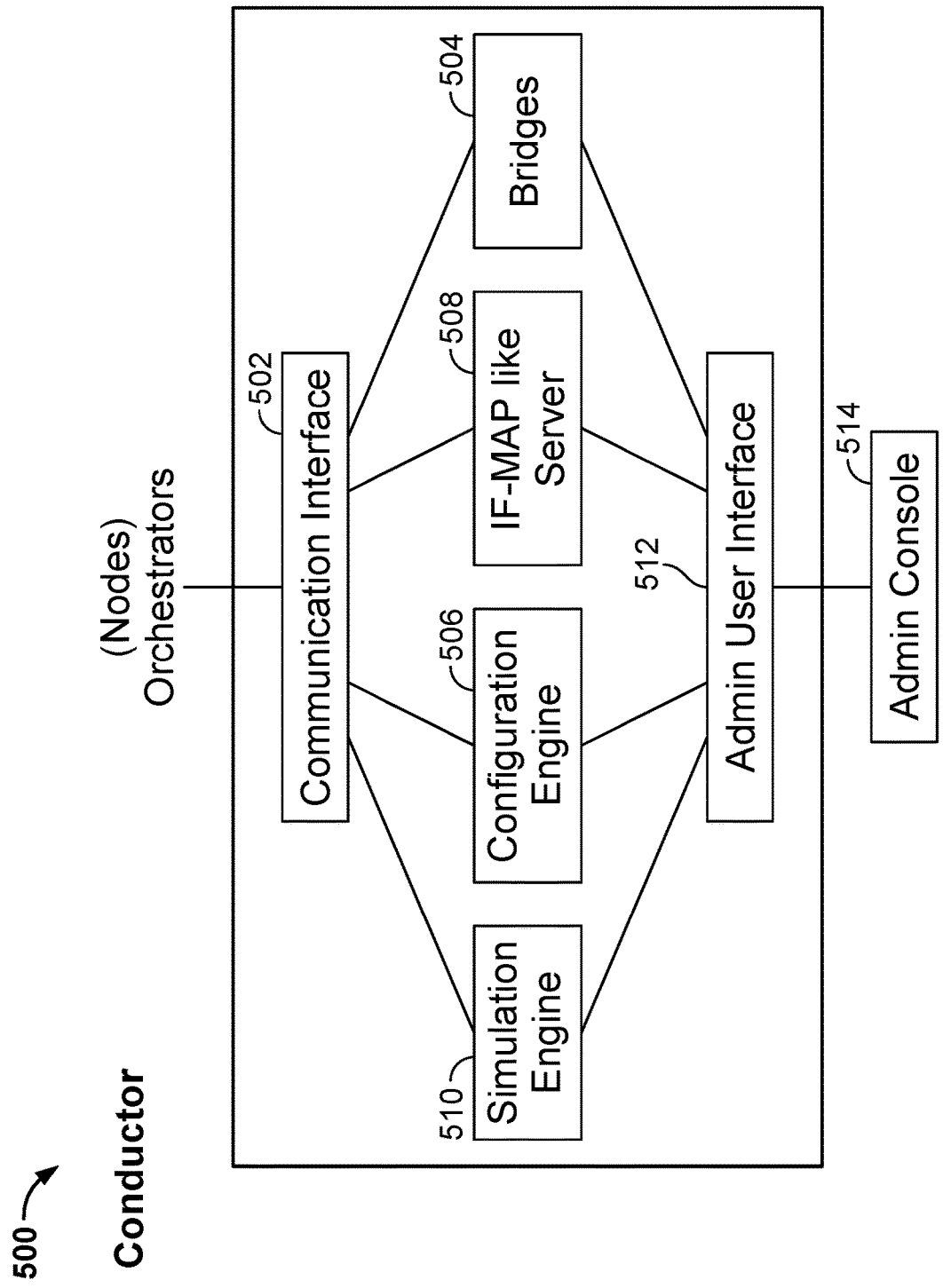
FIG. 5 is a block diagram illustrating an embodiment of a conductor.

FIG. 5 is a block diagram illustrating an embodiment of a conductor. In some embodiments, conductor 500 can be implemented by a conductor, such as conductors 212, 308, etc. In some embodiments, a system may include more than one conductor. This may be done because of the size of the network, regionalization of zones, political divisions, regulatory requirements, or other reasons. In such a case, a hierarchy of conductors (e.g., super conductors controlling meta conductors, meta conductors controlling conductors, etc.) may exist. In the example shown, conductor 500 includes an interface 502 to the constellation of orchestrators, other conductors, if there are any, and in some embodiments, direct to some or all of the nodes in the underlying network. An administrative communication interface 512 is configured to provide communication with the conductor for purposes of managing, maintaining, configuring, etc., the conductor. It is possible to access through this interface the constellation of orchestrators associated with nodes (e.g., communications/computing/sensing, actuating network elements). However, it may be more secure to restrict access to that constellation only through an orchestrator specially configured to do so. A set of one or more bridges 504 are configured to translate between node specific communications and a meta-language in an umbrella model used by the system in which conductor 500 resides to understand and store the attributes of the respective nodes, receive and process requests from nodes to fulfill requirements, and configure and/or otherwise control and direct nodes to fulfill requirements. Bridges 504 translate communications received from nodes in a node-specific format to a representation in the meta-language umbrella model, and translate commands, queries, etc. expressed in the meta-language umbrella model to a node-specific language, as applicable. In some embodiments, bridges 504 are stored in the conductor and downloaded to orchestrators where they perform their function. In such an embodiment, the orchestrator image stored in the conductor may include information about which bridge that orchestrator is using. In other embodiments, conductor 500 is configured to communicate directly with the underlying nodes using bridges 504. A configuration engine 506, for example one or more software processes executing on a processor, receives and responds to orchestrator creation, updating, management, etc. requirements, including by identifying and assigning one or more nodes to fulfill a requirement. In cases where a conductor needs to act itself (for example in a situation requiring global action), the conductor may directly communicate with an underlying network's node(s) by employing a bridge directly. An IF-MAP like server 508 enables conductors and orchestrators to store and update image data and/or enables nodes and/or the conductor 500 to subscribe to receive updates to image data (for orchestrators, conductors, underlying network node, etc.).

One of the problems in today's security environment is the fear of implementing remediation, that is, taking actions to make changes to nodes in the underlying network to stop/prevent damage and/or remove unauthorized access/software. What is feared is that such an action (or a mistake in manual entry commonly called a "fat finger" problem) may have unintended consequences that impact the ability of the underlying network to operate correctly or in the worst case, operate at all. As a result, it is not uncommon for security staff to leave a system that they know is compromised without implementing some or all possible remediation steps. A realization of the simulation engine 510 addresses unintended consequences. The automation of action through the orchestrators addresses the fat finger problem.

A simulation engine 510 may be used to simulate one or more potential solutions to fulfill one or more requirements, for example, to validate that a proposed remediation of a node (or group/class of nodes) to affect a remediation of a security breach would work and would not result in unintended consequences or some other requirements being generated, such as a particular software patch to an operating system will be compatible with a range of applications being run on a number of systems without any undesirable effects in a large network of computers, etc. In various embodiments, the simulation engine is used to perform simulations to answer what if questions such as what will happen to the Network (security, integrity, vulnerability, etc.) if this particular new type of wireless end user device is adopted by a given percentage of users, a new type of software is introduced into the Network, or a particular large scale event were to impact the overall Network environment, etc. The simulator function in the conductor combines the image data the conductor contains and/or has access to in the constellation of orchestrators with the new capability, configuration, rules, algorithms, and environment data projected for the new device, event condition, etc. and simulates how the network would appear from a functional and/or other viewpoint. In some situations, the simulation may be extended to include one or more nodes/devices/systems and their associated orchestrator(s)/conductor(s) in an isolated test network often referred to as a "sandbox." Here again, the purpose is to determine that the desired action will not produce any unintended undesirable consequences. Even after simulation with a sandbox, there may still be concerns about unintended consequences. For example, in a network of 10,000 computers, the following algorithm may be employed. A change may be implemented on only 10 computers in the live network and observed. If no undesirable outcomes are observed, then on 100. If no undesirable/unexpected outcomes are observed, then on 1,000, etc.

The conductor using the simulation function can perform verification in various embodiments. To verify that a device or software will function as desired in the network, the conductor combines metadata in the umbrella model (captured by the conductor and/or orchestrators, provided by the vendor, and/or internally and/or third party developed) of the device or software with image data on the network and simulates the result. If the outcome falls within desired parameters, then the device can be declared partially or fully verified. The extent of verification can be limited by the completeness and accuracy of the metadata. Verification functions are performed by network operator internal facilities to test new devices or software before being introduced into the network and by certification labs on behalf of regulators and network operators to certify that devices or software meet standards.

The simulation function 510 may also export "snapshots" to external systems for additional processing. Snapshots are data sets containing some or all of the information that the conductor(s) and/or the constellation of orchestrators have available at a given moment in time about their status, configuration, etc. and the status, configuration, etc. of the underlying network being secured. External systems can use these snapshots for a variety of functions including but not limited to: pattern searching/recognition, longitudinal time-based behavioral analysis, combination with other large data sets for pattern searching/recognition, satisfying regulatory/insurance/other auditing requirements, etc.

An administrative user interface 512 and administrative console 514 provide the ability to create, monitor, and/or control operation of the conductor 500. Manual involvement on a day-to-day basis is primarily provided through an orchestrator supporting operator consoles. This is done for internal system security reasons. However, manual operations can be accomplished through the conductor interface, for example, to execute a system suggested resource allocation and/or configuration, override an automatic resource allocation and/or configuration, and/or otherwise manually provision resources to fulfill requirements and deliver results of simulation and verification testing. In some embodiments, in an initial implementation phase, recommendations are delivered to the administrative console and an administrative user can accept or reject the recommendation. Subsequently, in stages, greater degrees of automated responsive action are introduced.

A conductor is a component. It is personalized for a particular implementation by the addition of objectives, algorithms, and constraints. These describe the technical environment including but not limited to: parameters, Umbrella Model, underlying data models, Bridges, degree of centralization/distribution, portions of underlying network within the span of control, degree of automated response, etc.

Objectives, algorithms, and constraints also describe the policy environment desired by the system owner (or if different from the owner, the person/organization responsible for cyber security) (e.g., SOC).

Where (location, type of hardware, etc.) the conductor is installed is determined by the SOC. A standard software package is installed on an Operating System, VM (Virtual Machine), Container, operating system, embedded system, hard wired logic, or other platform. This is done in such a way as to maximize security and minimize errors. Examples of such procedures include but are not limited to requiring multiple individuals (if there is a separate vendor involved, participation by both vendor and SOC staff) being physically present and authenticated. Once the base conductor is installed, it opens up (with appropriate security controls as stringent as those described above) its administrative interface. The personalization material is loaded through the interface, either from a keyboard, electronically, or both.

The conductor personalization information includes algorithm(s) appropriate to the particular network for Discovery. Using these within the defined objectives and constraints, the conductor begins to discover network components to associate orchestrators with. Once such a component is discovered, algorithms, objectives and constraints come in to play in determining the location (geographic, hardware type, Operating System, VM, Container, etc.) where the orchestrator is to be installed.

The orchestrator is a component. The conductor installs a copy of the component in the location. The component contains a subscription to its personalization image in the conductor. Prior to installing the orchestrator component, the conductor has populated the orchestrator's personalization image in the conductor with the orchestrator's objectives, algorithms, and constraints. As the orchestrator is installed and its subscription becomes active, it receives this personalization information and begins operation.

Over time, as the environment changes, or the SOC changes policies (for example about the granularity of orchestrators, where in the network to place orchestrators, etc.), the conductor may make appropriate changes to the orchestrator's personalization image. The orchestrator subscribing to its personalization image in the conductor "sees" these changes and acts accordingly.

A similar process is used to create a hierarchy of conductors.

Problem Avoidance and Recovery

If a conductor ceases to function, the associated orchestrators can continue to function. The ability to create new orchestrators, or to update and change policies is limited, but for relatively short periods of time, this does not have a markedly adverse effect. In some embodiments, a standby conductor exists. In some embodiments, this standby conductor is geographically removed and as far as practical on different hardware and platform types. The standby conductor may be configured to mirror the active conductor and only take control when it senses that the active conductor has stopped functioning. This sensing can be done in a number of ways including the use of tokens discussed elsewhere in this disclosure.

In most cases orchestrators do not need to be backed up. However, for very critical underlying components, they may be backed up using the same mirroring and token process. In other cases, if a conductor determines that it has lost contact with an orchestrator, it is configured to first seek to determine if it is a communication network failure (where the orchestrator is still functioning, but has lost connection with the conductor) or a failure of the orchestrator itself (hardware, platform, orchestrator itself, etc.). The conductor is configured to maintain in its personalization image, for each orchestrator, a map of all the information subscribed to by that orchestrator on other orchestrators. Using that map, the conductor is configured to check (using the subscription and the inquiry processes) to determine if other orchestrators are communicating with the orchestrator of interest. If so, the conductor is configured to mark the orchestrator of interest as running, but with a network connection fault. The orchestrator that is associated with the SOC subscribes to that information. Upon seeing that a network connection fault has occurred, the SOC orchestrator generates an alert to SOC staff to start the process of fixing the troubled communication link.

If the conductor determines that the network connection appears to be working correctly, but the orchestrator of interest has stopped working properly (using the token process and/or other algorithms, etc.), the conductor is configured to perform the following (not necessarily in this order):

1) Delete all the personalization information for that orchestrator

2) Create a new replacement orchestrator with the appropriate personalization information 3) Give the new orchestrator a new identity and address 4) Use the subscription map to publish new identity and address information to the other orchestrators subscribing to information on that orchestrator 5) If the problematic orchestrator tries to resume operation, it will first subscribe to its personalization information, thus becoming disabled. Once disabled, the conductor will use the "discontinuation" part of the process to delete the no longer needed (now replaced) orchestrator.

6) The above process is logged. That log will typically be subscribed to by the SOC orchestrator and tracked by SOC staff.

7) If there are frequent occurrences of the above, especially in the same place, same equipment, etc., the SOC staff investigates and remediates that cause.

Figure 6:
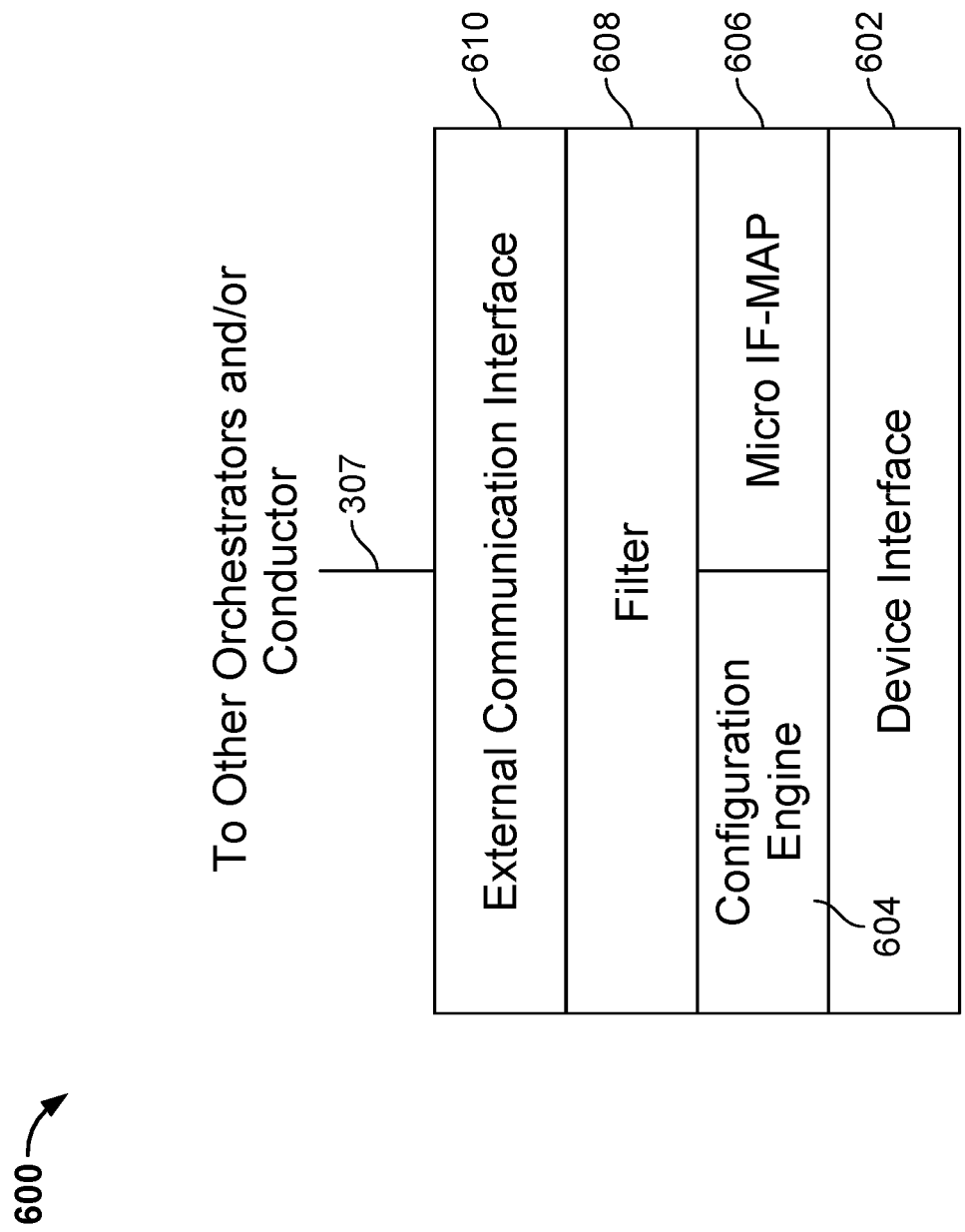
FIG. 6 is a block diagram illustrating an embodiment of an orchestrator.

FIG. 6 is a block diagram illustrating an embodiment of an orchestrator. In some embodiments, orchestrator 600 can be implemented by an orchestrator, such as orchestrators 210, 211, 214, 302, 304, 306, 422, 904, 1015, 1114, 1203, 1204, 1407, 1502a, 1502b, 1502n, 1609, 1715, 1814, 1816a, 1816b, 1816n, 1914, 1916a, 1916b, 1916n, 1921, 1922, 1923, 1924, 1925, 1926, 1927. An orchestrator may be referred to as an "orchestration module."

In the example shown, orchestrator 600 includes a device interface 602 used to interface (also called a Bridge) with the device (node) (e.g., underlying system element such as 301) the orchestrator is configured to orchestrate. A local configuration engine 604, in some embodiments, interacts with other orchestrators associated with other nodes and/or a central conductor to obtain help from one or more other nodes to accomplish an objective of the node the orchestrator is configured to orchestrate. A micro IF-MAP like data store 606 is used to store local node image data for the node with which the orchestrator is associated and in some embodiments, some or all of the image data of one or more nodes in the physical or virtual vicinity (physically and/or logically) of the node on which the orchestrator is associated (part of the node's environment).

A filter layer 608 determines, in some embodiments, a scope of information, for example, which status information to communicate externally and how frequently (e.g., the scope of information), to manage how much capacity is consumed by the overhead of security/configuration control messages flowing on the network, to deliver only the information that is needed where it is needed when it is needed, other system efficiency concerns, etc. An external communication interface 610 provides connectivity to other nodes via out of band path 307.

In some embodiments, a Control Point token is used to indicate which node has the power to control, whether a resource or other requirement will be fulfilled or attempted to be fulfilled initially by communicating directly with other nodes, for example, via their respective orchestrators, or instead will be sent to a central conductor to obtain fulfillment. In this way, the central conductor, if any, only has to intervene to obtain fulfillment of requirements that a node has been unable to fulfill through local, direct interaction with other nodes. In some embodiments, a filter in each orchestrator decides what and how much meta-information to share with other nodes and/or with the conductor. Similarly, a filter in the conductor decides how much information to share with a meta conductor and so forth for a super conductor. A Control Point decides what should be done and sometimes who is to do it. The Control Point is a "token." It can be passed in whole or in part. So, for example, in a network with no orchestrators and only one conductor, the conductor has the complete token. When some nodes are given orchestrators, those nodes will be given part of the token. In a network where all nodes have orchestrators, the nodes will be given the total local control portion of the token, but the conductor will retain the Global portion of the token. In a net of only orchestrators, the nodes will have the complete Control Point Token. In some implementations, tokens may be used to determine that orchestrators and conductor(s) and the network segments connecting them are still functioning properly and to implement fault tolerant and/or recovery procedures.

End Point Solutions

There is a class of point solutions that has emerged. The tool in this class is commonly called an "end point solution." Because of their wide spread deployment and level of vulnerability, they are primarily targeted on Windows PC's or appliances based on Windows (for example, cash registers, ATMs, etc.). Although not as common, there are similar tools for other O/S's (Operating systems). These end point solutions typically intrude into the kernel of the systems they are installed on and they only work on the systems they are installed on. In doing so they dramatically reduce performance and pave the way for another attack vector directly on the kernel.

Orchestrators can also be associated with end points, applications running in end points, and semiconductors making up end points (chips). In doing so, they can run in a central site, someplace in the intervening network, in hardwired logic, on a backpack computer attached to the end point (for example in a thumb drive form factor), in a VM on the end point computer, as an app in the end point computer, in software on chips inside the end point, in hardware in chips inside the end point, as a software module, etc. They do not intrude into the kernel. If running in the central site, network, hardwired logic, backpack computer, or something similar, they do not impact performance at all and do not pave the way for a kernel attack. If they run on the end point themselves, they do not have a significant impact on performance, nor pave the way for a kernel attack. Instead they work with log files, IP addresses, and content going into and out of the underlying end point system, and/or subsystem(s). If the system has a typical kernel based end point solution, and the system operator desires to continue to use it, the associated orchestrator can use the information output by the end point solution along with the other information it collects. If the system operator desires to remove the end point solution to improve performance or provide better protection for the kernel, the orchestrator can work with the information available from the underlying system through the other means described above. This provides protection while offering the underlying system operator choices between what otherwise can be thought of as bad alternatives.

Figure 7:
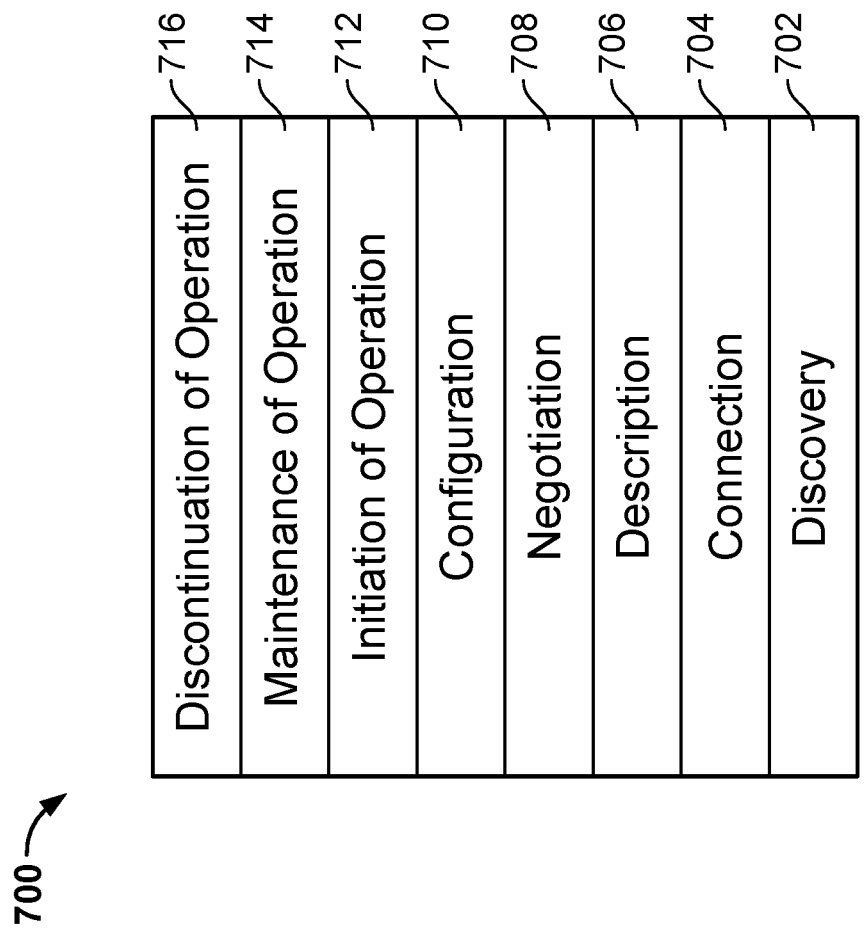
FIG. 7 illustrates a process to communicate with orchestrators and conductors according to some embodiments.

FIG. 7 illustrates a process to communicate with orchestrators and conductors according to some embodiments. Process 700, sometimes called a protocol instead of a process, may be used by orchestrators in various embodiments to interact with the other orchestrators and by conductors to interact with orchestrators and other conductors in the network. In some embodiments, the protocol is implemented as, and/or can be understood to comprise a state machine. This protocol differs from the ISO OSI (International Standards Organization Open System Interconnect) Model in that all information in each layer is available to all other layers. In the example shown, the eight layer (or state) model of process 700 used in various embodiments to coordinate network elements comprises stages of Discovery 702, Connection 704, Description 706, Negotiation 708, Configuration 710, Initiation 712, Maintenance 714, and Discontinuation 716.

In process 700, in various embodiments, an orchestrator associated with a node uses the protocol as follows. The process may be assisted by actions taken by the conductor at one or more of the steps. It seeks to satisfy its objectives by discovering another node's orchestrator which may help it do so. It performs the discovery process 702 by a combination of sensing relevant communication parameters, and/or sending out messages identifying itself and its objectives. When it Discovers another node which may appear capable of helping, it establishes a Connection 704 with an orchestrator of the discovered node. The Connection 704 is for the purpose of Description 706, Negotiation 708, Configuration 710, Initiation 712, Maintenance 714, and Discontinuation 716. Once a Connection 704 is established, the two orchestrators exchange Descriptions 706. In various embodiments, the Description 706 includes one or more of the following expressed in a common meta language using the umbrella model: one or more objectives of the node; one or more capabilities of the node; one or more rules the node is required to follow; and one or more protocols and/or algorithms the node has available for use. Based on the Description 706 received from the other orchestrator, each orchestrator determines if the node with which an orchestrator is associated can help it achieve its objectives. If so, the two orchestrators proceed to Negotiation 708. The first orchestrator bids a set of parameters that will help it achieve its objective. If the second orchestrator determines that a modified version of the parameters will better help it to achieve its objectives, it sends a counter bid. This proceeds to the point where both nodes accept the same bid. This acceptance constitutes a bind or contract. Once a bind has occurred, each node Configures 710 itself in accordance with the bind. Once Configuration 710 is complete, Initiation 712 can commence. Because Initiation 712 may involve very time critical events, the Initiation 712 procedure to be used can be part of the bind and prepared for in the Configuration 710 stage. Once Initiation 712 has taken place, in Maintenance 714 both orchestrators continue to monitor the environment. If there are changes that make the current initiation sub optimal, while continuing to operate in the Initiation in place, the two orchestrators start a new negotiation which may result in a new configuration and a new initiation or a discontinuation 716 of operation. The process 700 can also be used for communication between conductors, recovery from a network failure, recovery from a conductor failure, etc.

Process 700 is implemented in various embodiments by an orchestrator or conductor that receives its objectives, rules, algorithms, environmental information, etc. from an IF-MAP like or other data store that has the capability to create and support an organically growing/evolving/changing schema (umbrella model), and provides a mechanism to propagate changes to the schema or data, but only as necessary.

Figure 8:
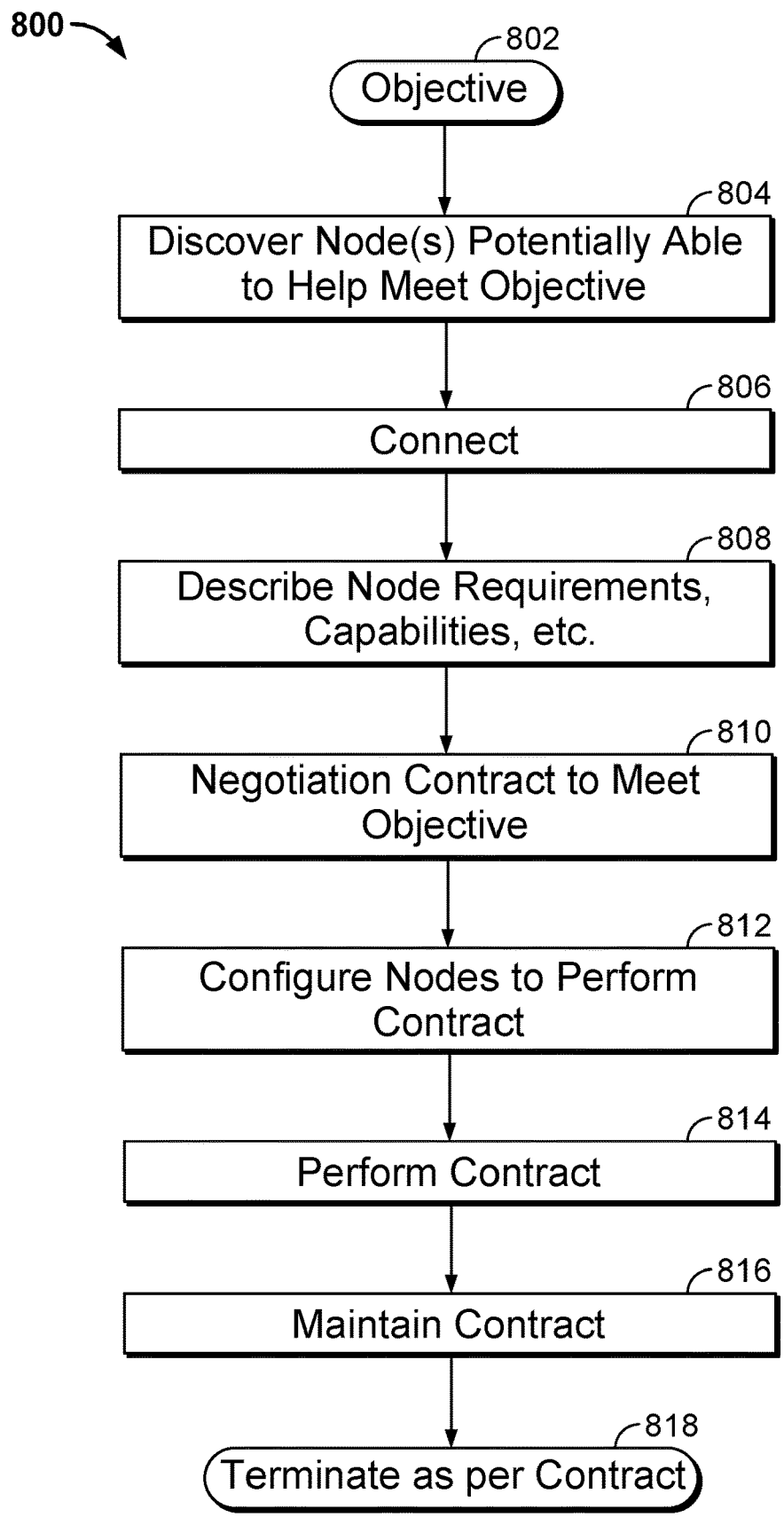
FIG. 8 is a flow diagram illustrating an embodiment of a process to orchestrate network elements to achieve security objectives.

FIG. 8 is a flow diagram illustrating an embodiment of a process to orchestrate network elements to achieve security objectives. In the example shown, when an unmet or not fully achieved objective exists (802), processing to discover one or more nodes to help achieve the objective is performed (804). Examples include, in some embodiments a central coordinator, such as conductor 308 of FIG. 3, searches node images in a data store such as data store 310 or the discovery process 702 is used to find orchestrators whose metadata indicates their suitability and/or availability to fulfill the requirement. Examples include a node that is capable of restricting communications with a node that has been compromised, a node that has the capability to download known good software to a compromised node, etc. In the case where a base station has been compromised by the insertion of unauthorized malicious software, the orchestrator for that base station's edge router may isolate that base station from the backhaul network, while the orchestrator associated with that base station's network core MME (Mobility Management Entity) may remove the base station from the list of base stations to which UE's (User Equipment such as handsets) can be assigned. Once this process is complete, the orchestrator associated with the affected base station may delete all the software on the base station and reload it from a known good source. Then, the three orchestrators (orchestrators associated with the edge router, base station, and MME) cooperate in reprovisioning the base station to return it to normal operation in the network. Similar scenarios can take place with factory robots, enterprise clouds, retail point of sale terminals, office computers, etc.

In the example shown, a connection is established (806) to one or more discovered nodes, for example, to obtain information needed to evaluate the node as a candidate to achieve the objective. In some embodiments, if a central conductor is implementing the process of FIG. 8, a connection may not be made at 806 to the discovered orchestrator(s). The requirements, capabilities, etc. of a discovered node are described (808), for example by the node itself or, in an embodiment in which a central conductor implements the process of FIG. 8, by reading relevant metadata from a node image stored in a data store such as data store 310, or in some cases, a combination of conductor and orchestrator information. A contract to help achieve the objective is negotiated (810), for example, via communications between the node having the requirement and a discovered node determined to be capable of helping to achieve the objective, or in an embodiment that includes a central conductor by applying at the conductor an algorithm that results in selection and assignment of a node to help achieve the objective. The node having the objective and the node selected to help achieve the objective are configured to operate together to achieve the objective (812) and the contract is performed (814). The nodes cooperate to maintain the operation (816), e.g., until the contract has been performed as agreed between the nodes and/or as determined by the conductor, after which the operation is discontinued per the contract (818).

Figure 9:
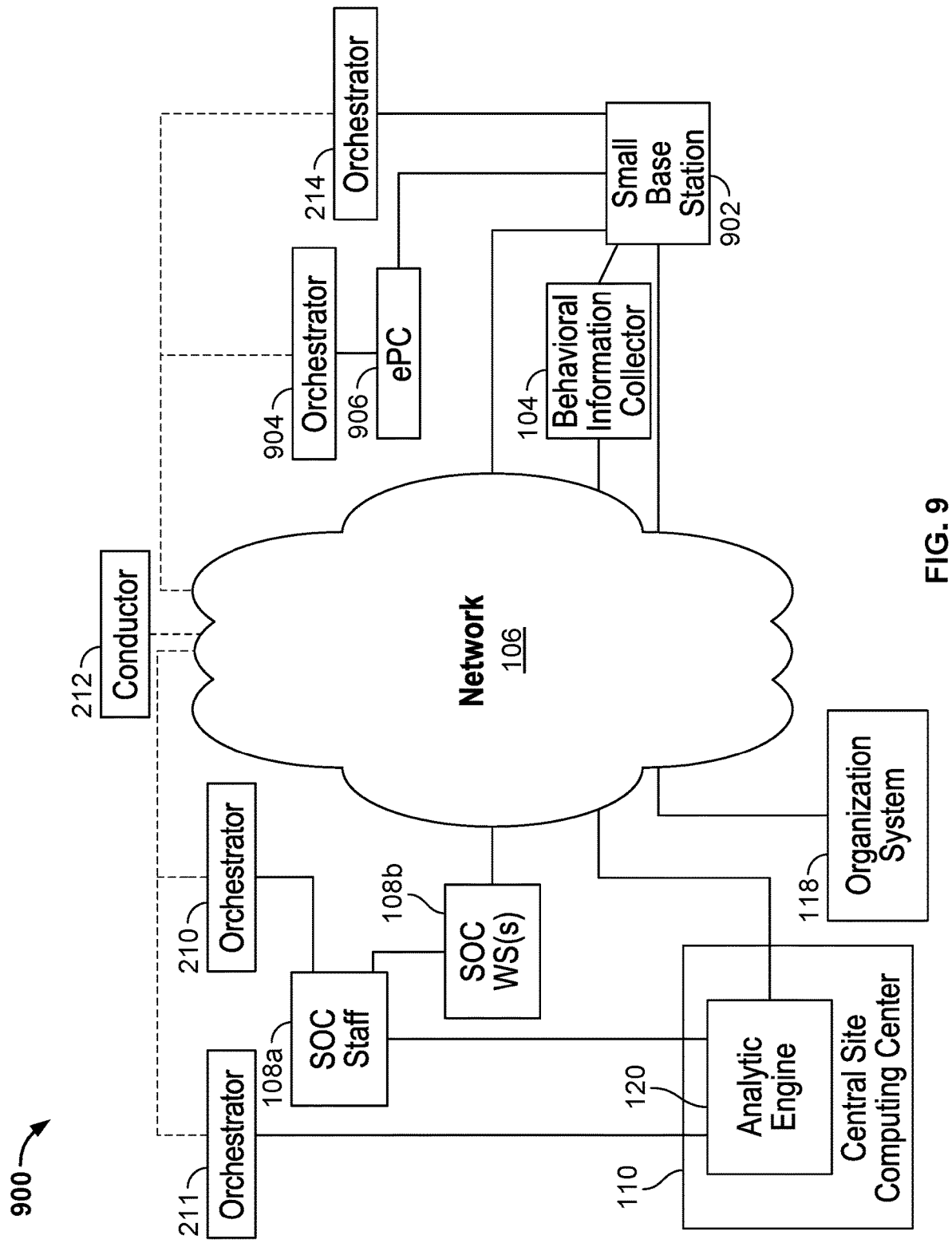
FIG. 9 is a block diagram illustrating an embodiment of an autonomous network security immune system.

FIG. 9 is a block diagram illustrating an embodiment of an autonomous network security immune system. In some embodiments part or all of system 900 is operated by a Cellco. In the example shown, system 900 includes a collector 104, a network 106 (e.g., the Internet, wide area networks, personal area networks, local area networks, etc.), SOC staff 108*a* and SOC workstation 108*b*, an analytic engine 120 in a central site computing center 110, a conductor 212, orchestrators 210, 211, 214, a base station 902 (e.g., small cell cellular, macro base station, mobile base station, WiFi access point, etc.), an underlying network element 906 (e.g., evolved Packed Core), and orchestrator 904 with which the network element 906 is associated.

Telco's and Cellco's networks are highly geographically distributed and subject to attacks throughout. For the reader's ease of understanding all of the scenarios and attack points will be illustrated by a description of one. However, the description applies to all. In some embodiments, base station 902 is in a location (e.g., coffee shop, public wi-fi location) that does not provide physical security, such as physical security provided by a Telco owned and operated physical location creating an added security exposure.

In the example shown, analytic engine 120 is configured to determine that base station 902 has been compromised based on information provided by collector 104. Analytic engine 120 may deliver a notification and/or alert to orchestrator 211. Orchestrator 211 is configured to receive the alert through an interface to the analytic engine. In some embodiments, the alert is also delivered to SOC staff 108*a*. Based on algorithms (which can be work flow process scripting, or more complex interactions between orchestrators using processes 700 and 800), constraints, and objectives (which can include information about the value of the component in question, its owner, etc.) orchestrator 211 (by itself or in cooperation with other orchestrator(s)) can determine whether human interaction should be included in the course of action or if remediation should proceed immediately. In the event human interaction is determined to be needed, information determined by the algorithms, objectives, and constraints is provided to orchestrator 210, i.e., the orchestrator associated with the SOC staff 108*a*. In some embodiments, the information is presented in a screen that minimizes the opportunity for the operator to make a "Fat Finger" error. For example, it is presented in a screen that is configured to provide relevant information and only allows for yes or no clicks/responses. The information may also be tailored to the specific person or role being performed. In some embodiments, orchestrator 211 provides a message to orchestrator 214 to begin remediation. In other embodiments, orchestrator 210 provides a message to orchestrator 214 and/or 904 to begin remediation. In other embodiments, orchestrator 211 and orchestrator 210, in conjunction, provide a message to orchestrator 214 and/or 904 to begin remediation.

In response to having received the message, orchestrator 214 is configured to shut down base station 902. But in so doing, it can confuse elements in ePC 906 (such as the Mobility Management Entity) and change the balance of shared resources in its base station neighborhood and/or allow UE's (user equipment such as handsets) to continue to be connected to base station 902 and exposed to security problems, etc. In the event base station 902 is to be shut down, orchestrator 904 is notified so that it can instruct the components in the ePC 906 to reconfigure the neighboring base stations and update the appropriate sub-components that base station 902 is no longer functioning. Remediation under the direction of orchestrator 214 of base station 902 continues seeking to repair and re-secure it. Once it has been repaired and re-secured, base station 902 is brought back into operation and orchestrator 214 is configured to update and instruct the appropriate subsystems in ePC 906 to bring the base station back into service while configuring the neighboring base stations appropriately.

Orchestrator 214 is further configured, based on algorithms, objectives, and constraints, to communicate with the device with which it is associated, in this example, base station 902 to commence remediation. Examples of remediation actions include, but are not limited to, partially or fully limiting the other parts of the underlying network with which base station 902 can communicate, rebooting base station 902, restoring base station 902 (e.g., to a last known good state), repairing base station 902, patching a software element associated with base station 902, reloading installed software on base station 902 from a trusted source, returning base station 902 to vendor delivered state and reprovisioning it, combinations of these, etc. Similar realizations can be implemented for automated factories with industrial robots, retail locations with Point of Sale Terminals, on-line enterprises and government organizations with Clouds (proprietary, public, and/or hybrid), offices with office equipment, etc.

Figure 10:
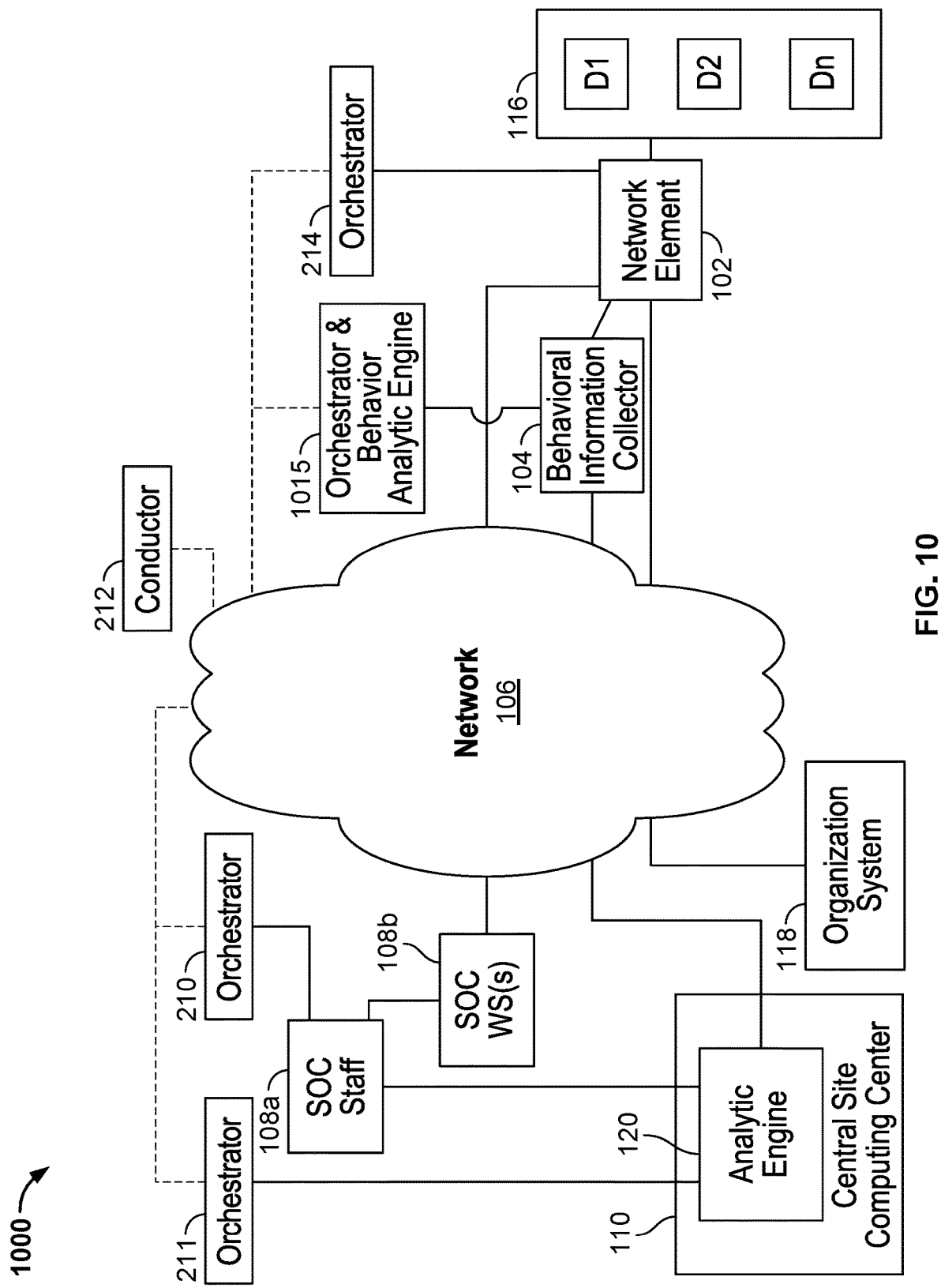
FIG. 10 is a block diagram illustrating an embodiment of an autonomous network immune system.

FIG. 10 is a block diagram illustrating an embodiment of an autonomous network immune system. In the example shown, system 1000 includes an underlying network element 102 (e.g., an edge router with interior and exterior firewalls, a computing component/system, a communications component/system, etc.), a network 106 (e.g., the Internet, wide area networks, personal area networks, local area networks, etc.), SOC staff 108a, SOC workstation 108b, a plurality of computing devices 116 served by network element 102, an organization system 118, an analytic engine 120 in a central site computing center 110, a conductor 212, orchestrators 210, 211, 214, a local collector 104 and its associated orchestrator 1015 that includes a local behavioral analytic engine. In some embodiments, system 1000 may include a plurality of orchestrators similar to orchestrator 1015 that are deployed throughout the system. System 1000 is configured in such a manner to overcome the problems created by the massive amounts of data being created in today's networks. Collectors today are producing volumes of data delivered to central site analytic engines in the mid to high 10's of Billions of Events Per Day (EPD) with 100's and then 1,000's on the horizon. Each event can involve 100's to 1,000's of Kilobytes. Delivering all this data to a central site consumes a tremendous amount of capacity of all types. It also makes it very difficult for the central site computer center to find the necessary behavior patterns in a timely fashion because of the time required to accept, structure store and then search such large amounts of data. By moving part, or all, of the analytic process out to the network interior and/or edge, these problems are reduced. Some analyses can be done at the edge, in the interior of the network, or distributed throughout the network, while some information can be summarized making it easier for the central site analytic engine 120 to handle it. In this topology there are now multiple locations that can generate an alert. The addition of the orchestrator 1015 and other similar ones provide the local analytic engine process, issue alerts locally, and based on algorithms (including workflow process scripting and dynamic processes involving negotiation, etc.), objectives, and constraints determine what information to summarize and send upstream to the central site analytic engine that can also initiate alerts.

In the example shown, collector 104 is configured to deliver information to both central site analytic engine 120 and orchestrator 1015. Either one can determine that one of the computing devices 116 has been compromised based on information provided by underlying network element 102. Either one can initiate a notification and/or alert. Based on algorithms (which can be work flow process scripting, or more complex interactions between orchestrators), constraints, and objectives (which can include information about the value of the component in question, its owner, etc.) orchestrators 210, 211, 214, and 1015 individually or collectively can determine whether human interaction should be included in the course of action or if remediation should proceed immediately. In the event human interaction is determined to be needed, information determined by algorithms, objectives, and constraints is provided to orchestrator 210, i.e., the orchestrator associated with the operator's console 108b. In some embodiments, the information is presented in a screen that minimizes the opportunity for the operator to make a "Fat Finger" error. For example, it is presented in a screen that is configured to provide relevant information and only allows for yes or no clicks/responses. In some embodiments, orchestrator 1015 (and/or orchestrator 211, see below) provides a message to orchestrator 214 directly (independent of orchestrator 210) to begin remediation.

In the example shown, central site analytic engine 120 is also configured to determine that one of the computing devices 116 has been compromised based on information provided by underlying network element 102 (e.g., an edge router) via the collector 104. Analytic engine 120 can deliver a notification and/or alert to orchestrator 211. Orchestrator 211 is configured to receive the alert through an interface to the analytic engine. In some embodiments, the alert is also delivered to SOC staff 108a. Based on algorithms (which can be work flow process scripting, or more complex interactions between orchestrators), constraints, and objectives (which can include information about the value of the component in question, its owner, etc.) orchestrator 211 can determine whether human interaction should be included in the course of action or if remediation should proceed immediately. In the event human interaction is determined to be needed, information determined by the algorithms, objectives, and constraints is provided to orchestrator 210, i.e., the orchestrator associated with the operator's console 108b. In some embodiments, the information is presented in a screen that minimizes the opportunity for the operator to make a "Fat Finger" error. For example, it is presented in a screen that is configured to provide relevant information and only allows for yes or no clicks/responses. In some embodiments, orchestrator 211 provides a message to orchestrator 214 to begin remediation. In other embodiments, orchestrator 210 provides a message to orchestrator 214 to begin remediation. In other embodiments, orchestrator 211 and orchestrator 210, in conjunction, provide a message to orchestrator 214 to begin remediation. In response to receiving the message, orchestrator 214, based on algorithms (both workflow process, and dynamic), objectives, and constraints, is configured to communicate with the device with which it is associated, in this example, the underlying network element 102 (e.g., an edge router) and via the underlying network element 102, to communicate with one or more of the computing devices 116 to commence remediation. Examples of remediation actions include, but are not limited to, partially or fully limiting the other parts of the underlying network with which computing device 116 can communicate, rebooting one or more of the computing devices 116, restoring one or more of the computing devices 116 (e.g., to a last known good state), repairing one or more of the computing devices 116, patching a software element associated with one or more of the computing devices 116, reloading installed software on one or more of the computing devices 116 from a trusted source, etc.

Orchestrator 1015 may use the cooperative distributed facility of the negotiation process combined with IF-MAP like data stores to implement the detection process and/or machine learning technology making it distributed analysis and/or distributed machine learning.

Figure 11:
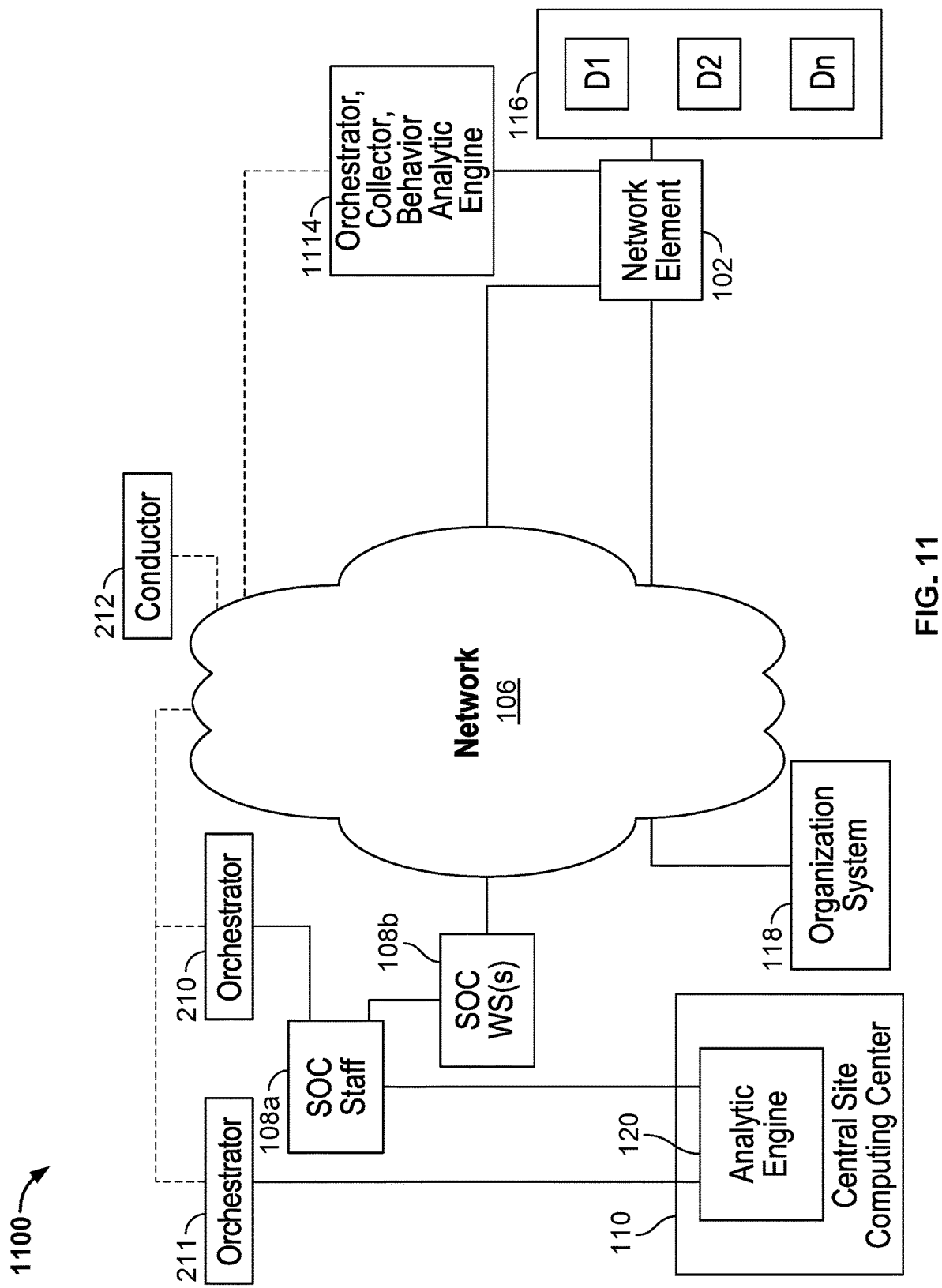
FIG. 11 is a block diagram illustrating an embodiment of an autonomous network immune system.

FIG. 11 is a block diagram illustrating an embodiment of an autonomous network immune system. In the example shown, system 1100 includes an underlying network element 102 (e.g., an edge router with interior and exterior firewalls, a computing component/system, a communications component/system, etc.), a network 106 (e.g., the Internet, wide area networks, personal area networks, local area networks, etc.), SOC staff 108a, SOC workstation 108b, a plurality of computing devices 116 connected via network element 102, other underlying computing and communications resources 118, an analytic engine 120 in a central site computing center 110, a conductor 212, and orchestrators 210, 211, 1114.

In the example shown, orchestrator 1114 includes a collector that is configured to capture behavioral information from network element 102. Orchestrator 1114 includes a local behavior analytic engine that may be configured to determine that one of the computing devices 116 has been compromised based on information provided by underlying network element 102 (e.g., an edge router) and analysis functions including but not limited to, behavioral analysis. Orchestrator 1114 can detect a problem using algorithms, objectives, and constraints; use machine learning technology to identify patterns; other mechanisms and/or processes, etc. As with the algorithms discussed in conjunction with FIG. 10, Orchestrator 1114 may use the cooperative distributed facility of the negotiation process (with orchestrators 211, 210, and in some realizations conductor 212) combined with IF-MAP like data stores to implement the detection process and/or the machine learning technology making it distributed analysis and/or distributed machine learning. The distributed process can, in some cases, involve analytic engine 120 that has received behavioral information from orchestrator 1114 via orchestrator 211.

In the example shown, orchestrator 1114 is configured based on information delivered to it by underlying network element 102 (e.g., an edge router) to determine that one of the computing devices 116 has been compromised and to generate an alert. In some embodiments, the alert is also delivered to SOC staff 108a. Based on algorithms (which can be work flow process scripting, or more complex interactions between orchestrators), constraints, and objectives (which can include information about the value of the component in question, its owner, etc.) orchestrator 1114 can determine whether human interaction should be included in the course of action or if remediation should proceed immediately. In the event human interaction is determined to be needed, information determined by the algorithms, objectives, and constraints is provided to orchestrator 210, i.e., the orchestrator associated with SOC staff 108a. In some embodiments, the information is presented in a screen that minimizes the opportunity for the operator to make a "Fat Finger" error. For example, it is presented in a screen that is configured to provide relevant information and only allows for yes or no clicks/responses. In some embodiments, orchestrator 211 provides a message to orchestrator 1114 to begin remediation. In other embodiments, orchestrator 210 provides a message to orchestrator 1114 to begin remediation. In other embodiments, orchestrator 211 and orchestrator 210, in conjunction, provide a message to orchestrator 1114 to begin remediation. In other embodiments orchestrator 1114 initiates remediation without input from orchestrators 210 and 211. In response to receiving the message, orchestrator 1114, based on algorithms, objectives, and constraints, is configured to communicate with the device with which it is associated, in this example, the underlying network element 102 (e.g., an edge router) and via the underlying network element 102, to communicate with the computing device 116 to commence remediation. Examples of remediation actions include, but are not limited to, partially or fully limiting the other parts of the underlying network with which computing device 116 can communicate, rebooting one or more of the computing devices 116, restoring one or more of the computing devices 116 (e.g., to a last known good state), repairing one or more of the computing devices 116, patching a software element associated with one or more of the computing devices 116, reloading installed software on one or more of the computing devices 116 from a trusted source, etc. In some embodiments, the central site analytic engine 120 is included as part of conductor 212.

There are some forms of attack that require correlations between behaviors in different systems in order to detect them. One example of such is commonly called "Deny, Deny, Admit" or DDA. For example, in one form of this attack, an attacker seeking entry into a multi-national organization may attempt to enter at one access point in one country be denied, then try a second country, be denied, and continue until the attacker succeeds in finding admittance. To identify these attacks, the distributed communication process described herein can be used where orchestrators associated with entry control systems throughout the organization find their neighbors, negotiate how to exchange information, and exchange denial information to support algorithms detecting DDA and similar attacks. So, for example, orchestrator 1114 may cooperate with other orchestrators besides orchestrators 210 and 211.

Figure 12:
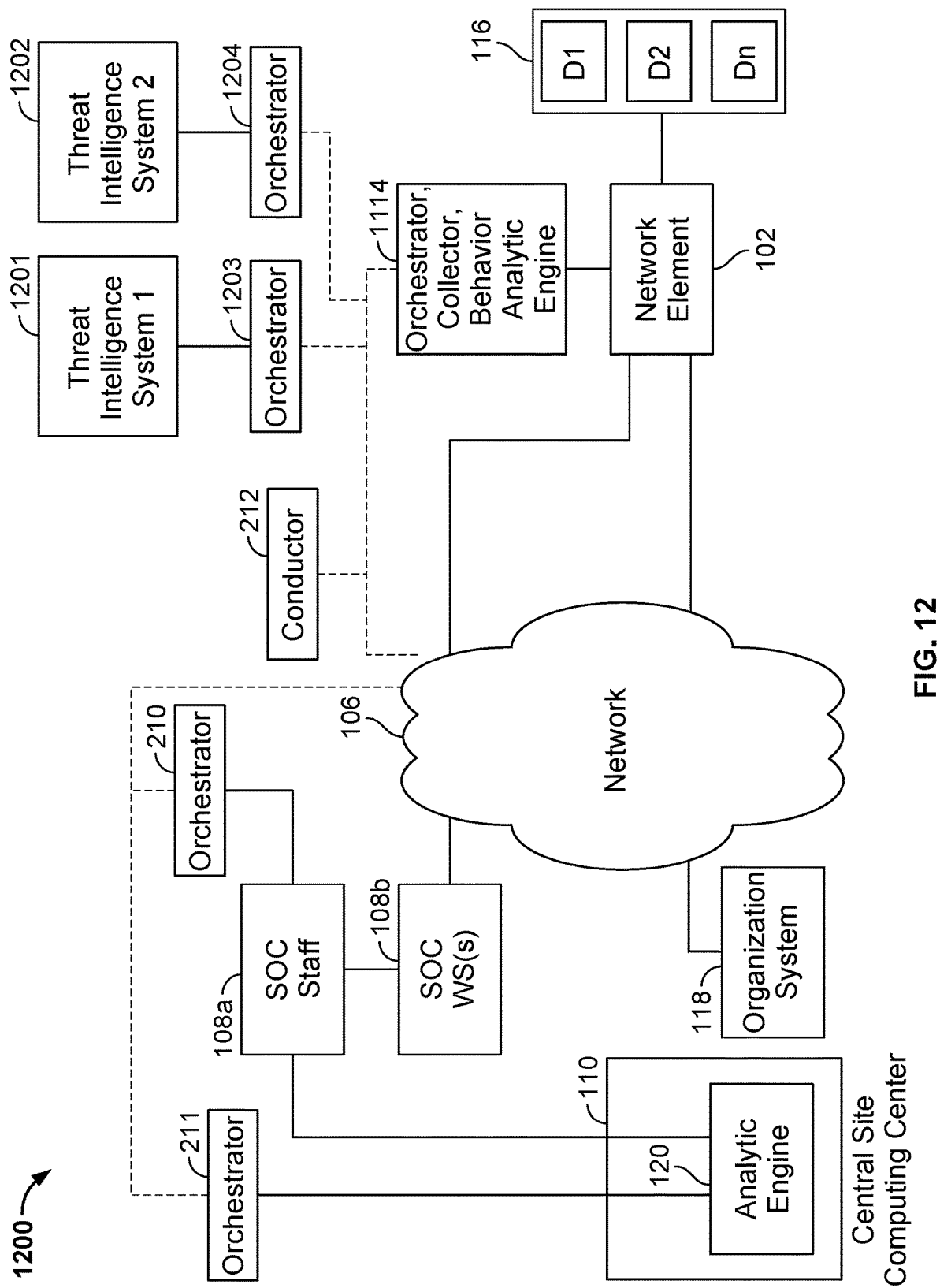
FIG. 12 is a block diagram illustrating an embodiment of an autonomous network immune system.

FIG. 12 is a block diagram illustrating an embodiment of an autonomous network immune system. System 1200 includes automated updating of security system components based on threat intelligence coming from a number of different sources in a number of different ways. In the example shown, system 1200 includes an underlying network element 102 (e.g., an edge router with interior and exterior firewalls, a computing component/system, a communications component/system, etc.), a network 106 (e.g., the Internet, wide area networks, personal area networks, local area networks, etc.), SOC staff 108*a*, SOC workstation 108*b*, a plurality of computing devices 116 served by network element 102, an organization system 118, an analytic engine 120 in a central site computing center 110, a conductor 212, orchestrators 210, 211, 1114, threat intelligence systems 1201, 1202 and their corresponding orchestrators 1203, 1204.

Threat intelligence systems 1201, 1202 are configured to collect and organize information on attacks occurring elsewhere, expected attacks, newly discovered system vulnerabilities, etc. The resulting information is shared today via paper publications, email lists, web sites, and a variety of non-compatible API's (Application Program Interfaces). There are some standards in this area, but even so, there is a wide disparity in threat intelligence system data models and interfaces. Also, the conversion of threat information into changes in virus checkers, firewalls, detection, remediation, and other point security solution systems is primarily manual. In one US corporation, a single person receives threat intelligence information from 276 different threat intelligence services each with its own method of delivery, format, data model, etc. That single person daily (only during business hours—single shift—not able to review material off hours, weekends, holidays, sick days, etc.) reads all that information and decides what and how to enter it manually into that company's systems. This is a large company with approximately 300 subsidiaries each with different underlying networks and different suites of security systems. That person also has other security related duties that must be performed on a daily basis. This manual effort dramatically limits the ability to effectively use all of the information in a timely fashion.

In the example shown, orchestrators 1203, 1204 work with the other orchestrators and conductor(s) to automate the conversion of this threat information into new algorithms, objectives, and constraints where appropriate in the orchestrator/conductor network. In some embodiments, threat intelligence systems 1201, 1202 and their corresponding orchestrators 1203, 1204 can be applied to other embodiments of an autonomous network immune system discussed herein. Similarly, other separate security systems can be incorporated into the resulting automated efficient, timely holistic end to end cyber security solution. For example, converted threat information may be provided to orchestrators 210, 211, 1114. In some embodiments, based on the converted threat information, orchestrator 1114 is configured to cause network element 102 to implement a remediation action. In other embodiments, based on algorithms (which can be work flow process scripting, or more complex interactions between orchestrators), constraints, and objectives (which can include information about the value of the component in question, its owner, etc.) orchestrator 1114 can determine whether human interaction should be included in the course of action or if remediation should proceed immediately. In the event human interaction is determined to be needed, information determined by the algorithms, objectives, and constraints is provided to orchestrator 210, i.e., the orchestrator associated with the operator's console 108. This form of remediation is sometimes referred to as hardening.

Behavior Analysis

The role of behavioral analysis has been discussed above. A number of embodiments of the autonomous network immune system have been shown that employ existing forms of behavioral analysis. However, today's forms of behavioral analysis face challenges including problems with volumes of data, manual effort required to set up and maintain, size of system footprint, amongst others. An innovative new method of performing behavioral analysis that overcomes these challenges is disclosed below.

Today's behavioral analysis systems tend to use only one source of behavioral data: either log files or IP addresses. The content of log files varies from system to system. It depends on different standards and on different proprietary implementations. Log file systems also vary in terms of latency and timing. IP address information may have lower latency than log data, but because of modern addressing tricks available, address data can be obfuscated. Being able to monitor both provides a more complete view of behavior and in some respects, a more timely view.

Adding other sources of behavioral information further improves the effectiveness of behavioral analysis systems. Other extremely valuable forms of behavioral information include message content flowing into and out of components (on-chip system activity information is also extremely valuable and is discussed in a later section of this document). However, today's behavioral analysis systems don't handle content very well. Virus checkers look at content for types of content (binary, graphic, etc.), but they do not look at content indicative of behavior patterns. The more forms of behavior a behavior analysis system can look at, the more effective it can be. For example, monitoring content for such things as social security numbers can catch a breach that exposes identity information in an unauthorized fashion that might not create an alert based only on log data or IP address data. But today's behavior analysis systems are drowning in even the small portions of data they are working with. The autonomous network immune system described herein solves this problem by distributing the functionality/data to the orchestrators and providing a way for the distributed functions to interact with each other when they need to. This interaction can either be scripted or determined through a negotiation process. Because of this distributed data and functionality, analysis of behavior based on log files, plus IP addresses, plus content (plus other forms as well) becomes practical. This is becoming more important because deep packet inspection technology is advancing at a dramatic pace (for example Barefoot Networks) and offers the potential for delivering a lot of very useful message content based behavioral data.

Because there are so many types of attacks and they are changing so rapidly, it is hard to predict what parameters will show the next attack. This leads to a desire to ever increase the parameter sets being observed. But today's systems find it difficult to deal with the volumes of data and so, don't use all available sources.

For example, a central site behavioral analysis system may only use log files as input data receives 50 billion events per week. This equates to multiple petabytes of information to deal with. Looking for patterns in such large data sets can take an inordinate amount of time. One approach to try to deal with the volume of information is Approximate Query. This provides some relief in search times for today's behavioral data sets, but it has a few problems. First it requires a lot of effort to specify the patterns that are being looked for. Second, it requires a significant amount of pre-processing of incoming data before it is placed in the data set. Finally, it too will be overwhelmed as the data volumes continue to rise.

The key activity in behavioral analysis for Cyber Security is identifying an observable behavior pattern that indicates trouble. Most such systems today use Bayesian models. That is, they have some predetermined relationship that they are looking for. This requires a lot of work to set up, and to keep up to date, as the attack vectors change and behaviors change. Typically, the development of these patterns comes from a manual analysis of successful attacks. So, it assumes some number of successful attacks is always going to happen. Then, it takes time for the manual effort to identify the pattern and either train or script the behavioral analysis system to find it in the data. While this is happening, attackers are still successful. Once attackers realize that the pattern of the existing attack has been detected, analyzed, and defense systems updated, the attackers change the attack to produce a different pattern, sometimes called a signature. These steps are characterized as a cycle. Sophisticated attackers attacking well-protected systems have attacks with a cycle time approaching an hour (projected to move down to minutes). While this is happening and automation becomes pervasive, the manual training or scripting effort runs up against problems in scale, complexity, and volatility.

The volume problem in addition to having to create and evolve models (Bayesian or other) is a major stumbling block. Existing forms of behavioral analysis can be helpful, but they are limited by the manual effort needed to either train or script them, and their difficulty in effectively using even subsets of behavioral data.

The autonomous network immune system described herein is fundamentally different in that it automatically (without human intervention) determines what the "normal" behavior is, automatically (without human intervention) tracks that behavior as it evolves to identify the "new normal," and alarms significant deviations from normal. Thus, it catches a significant change in the behavior of a system component of interest. Each system, subsystem, component, etc. has a "normal" behavior pattern. A security breach, intrusion, etc. provokes abnormal behavior. Of course, there are other things that can produce a change in system behavior such as a software upgrade or a significant environmental change. The autonomous network immune system may be configured to track those things so a change in behavior can be filtered to determine if one of those other things caused the change, or if it is indeed an attack. The autonomous network immune system does this in a distributed fashion that overcomes the data volume problem and can therefore use IP addresses, log files, content, and any other source of behavioral information available and do so both in large central site systems and much smaller distributed systems.

The autonomous network immune system is configured to provide an improved security solution at least in part by: accepting all the possible data input sources (dealing with the data volume problem); minimizing the amount of effort required to determine "normal behavior"; tracking normal as systems evolve, change, and grow; creating a constantly updated "new normal"; and quickly determining deviations from this new normal.

The autonomous network immune system is configured to use a combination of the innovative architecture/process disclosed herein and an innovative use of histograms. A histogram is a list of parameters and their frequency (number of occurrences) in a given period of time. In one embodiment, histograms are used in approximate query to create a metadata structure of log files that are then searched for patterns. In such an embodiment, a significant amount of effort is needed to specify the structure of the histograms and the patterns being searched for. Furthermore, even with approximate query technology, there is no use of for all the potential data sources because of the data volume problem.

The autonomous network immune system includes an automated process that observes all of the available data sources to determine the proper timing of samples for creation of histograms. A statistical algorithm is used to automatically determine the valid sample size for each implementation. The frequency of activity is observed and used to automatically calculate the minimum time segment required to produce a statistically valid sample. Then, the autonomous network immune system begins to create histograms for that sample period. Sample periods are tracked and automatically updated if necessary.

The histograms are constructed without regard to "meaning," nor manually created search patterns (whether or not augmented by automated processes). They are merely counts. A moving sum statistically valid average histogram is constructed from the first and succeeding histograms. The number of histograms needed for this moving sum average is automatically determined by a statistical algorithm. Newly created histograms are compared to this moving sum average as they are created. Any change of more than a given percentage generates an alert. This percentage may be automatically set by a statistical algorithm for each implementation. In most types of attack a significant change of behavior will occur. Once the autonomous network immune system is widely deployed, it is possible that attackers will vary their attacks and seek to trickle their activity so that it doesn't reach the trigger percentage. To guard against this, an automated process may specifically and automatically search for trickle patterns in the histograms separate from the moving sum averages. Based on inputs from orchestrators associated with threat intelligence systems, the orchestrator building and tracking histograms may use its objectives, algorithms, and constraints to trigger alerts based on specific patterns in the histograms and their changes.

The histogram behavioral analysis algorithm may be performed in a central site configuration such as in FIGS. 1B, 2, 9—analytic engine 120; a fully distributed process specifically shown in FIG. 10; orchestrator 1015 and FIGS. 11, 12; and orchestrator 1114. It can also be performed by the orchestrators and/or collectors shown throughout this disclosure (e.g., orchestrators 210, 211, 214, 302, 304, 306, 422, 904, 1015, 1114, 1203, 1204, 1407, 1502a, 1502b, 1502n, 1609, 1715, 1814, 1816a, 1816b, 1816n, 1914, 1916a, 1916b, 1916n, 1921, 1922, 1923, 1924, 1925, 1926, 1927, collector 104); or a combination of the two (e.g., analytic engine 120, orchestrators, and/or collectors). The orchestrators or collectors can get data to work with by connecting to existing interfaces. These interfaces may generate streams of information in their normal operation that the orchestrators or collectors can "tap." That is, listen to in a non-disruptive fashion. Other interfaces may only respond to requests sometimes called "polls."

In some embodiments, the histogram behavioral analysis algorithm is performed in a distributed process. This allows the amount of data that has to be dealt with at each behavior analysis engine to be greatly reduced. Furthermore, the histogram behavioral analysis algorithm does not require keeping the underlying data. Once a histogram has been created for a sample data set, that data set can be discarded. Thus, an orchestrator employing the histogram behavioral analysis algorithm does not need to store the full data sets from which it is counting parameters. This is in contrast to behavioral analysis systems that must keep multiple such full data sets covering days, weeks, months, etc. In contrast, the method described here may only need to keep the small moving sum average histogram data set and the currently being assembled histogram data set. By distributing the capture and analysis of the input data, the volume of data, even when all sources are employed, that each behavioral analysis engine has to deal with is limited to a manageable level. This part of the autonomous network immune system may be used in conjunction with traditional existing types of behavioral analysis systems, with the histogram behavioral analysis algorithm described above, or with a combination of the two. Central site behavior analysis systems can still be used with or without the histogram method.

The distributed process can also be used to reduce false positives, that is alerts triggered by a change in behavior that comes about as a result of a change in environment, a change in work load, etc. that otherwise could be interpreted as indicating an attack (the consequences of false positives and how to deal with them are discussed in detail later in this document). Using the negotiation process and based on their objectives, algorithms, and constraints, orchestrators associated with other parts of the system (including associated with applications) working in the distributed fashion can filter out changes in observed behavior due to environment, workload, etc. This will greatly reduce false positives.

As pointed out above, this type of behavioral monitoring has general applicability, but may be especially important in realizations that by their nature have limited memory/storage resources, are mobile, or involve large numbers of heterogeneous components.

Figure 13:
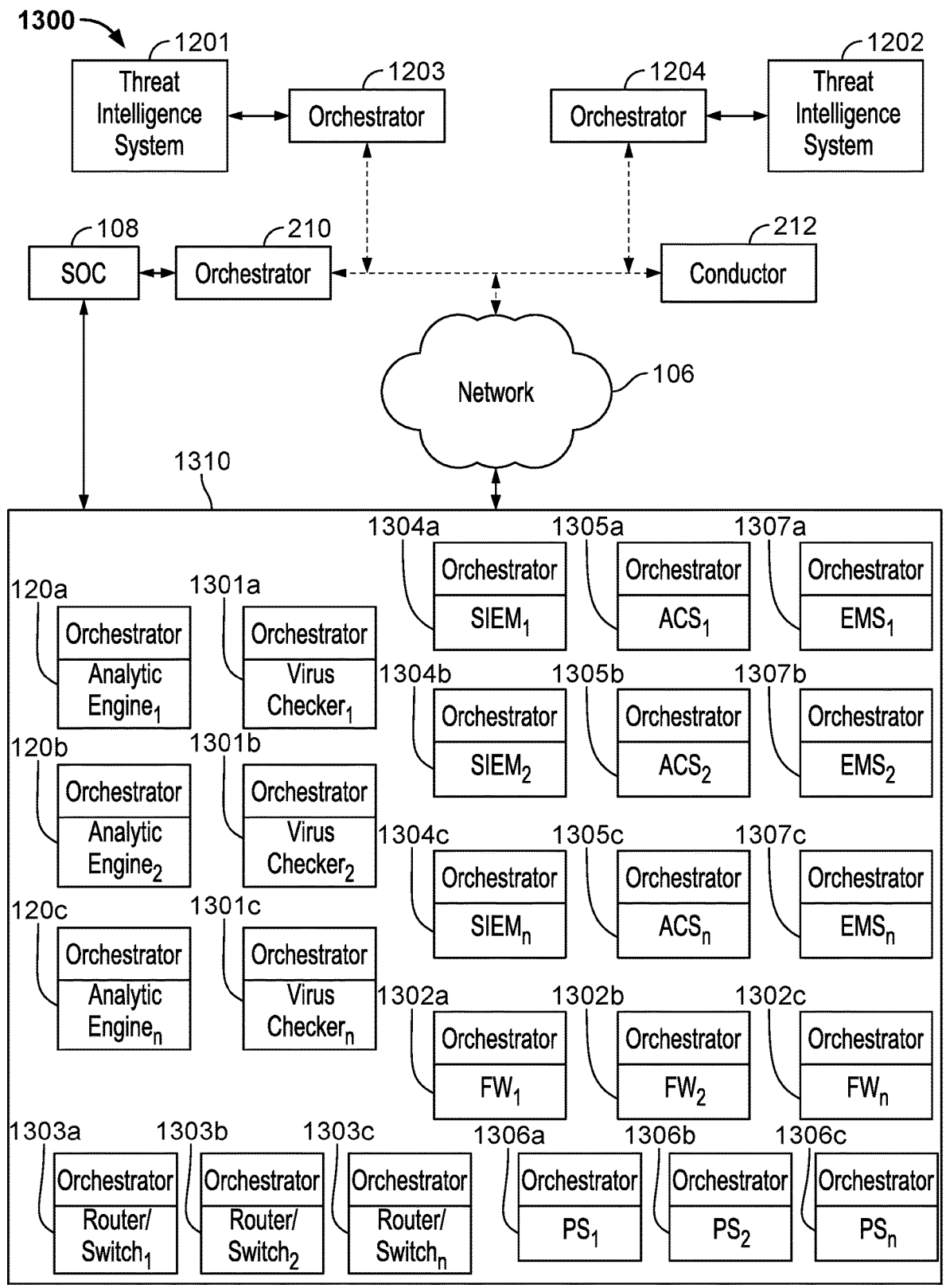
FIG. 13 is a block diagram illustrating an embodiment of an autonomous network immune system.

FIG. 13 is a block diagram illustrating an embodiment of an autonomous network immune system. FIGS. 2, 9, 10, 11, and 12 have simplified the central site computing center 110 in order to make it easier to understand the discussion of activities in other parts of the networks, but in some realizations orchestrators have important roles to play in the central site computing center. Because of layers of technology, proprietary vendor strategies, changing business environments, reorganizations, mergers and acquisitions, etc., enterprises and government organizations have ended up with a proliferation of security systems, each having a different human interface and each relying in part or in whole on manual efforts to make them work with each other. This makes a large, growing, and in some cases impossible to achieve demand on SOC resources because there has to be staff combinations available all the time that know each of the different interfaces (as well as control interfaces of components in the underlying network). It also dramatically slows the ability of the end-to-end systems to respond in a timely fashion, introduces human error, and fear-based hesitation to respond, etc. Combined with the requirement to understand all the technologies deployed in the network being defended it further increases the already intractable staffing problem.

Others have tried to solve this problem but with limited success. Struggling with all the degrees of freedom of the problem, they all have tended to be central site solutions, without the ability to easily move functionality to where it can work best, and because they haven't provided a complete solution, have in many cases made the situation worse. Some have tried to develop a single set of point solutions all from the same vendor all tied together. Others have tried to pick best of breed of the available point solutions and, doing conventional system integration, tie them together. Both suffer from the problem that many organizations have a sizable sunk investment (procurement costs, staff training/experience, developed code, policies and procedures, etc.) in a range of point solutions that are not the ones developed/selected. It is therefore expensive, difficult, and sometimes logistically impossible to change to the new point solutions. In addition, the single vendor approach has proved less than optimal because a single vendor is not able to develop at the highest quality all the needed point solutions, may be limited by IP problems, architectural limitations, ability to respond to the rapidly changing threat environment, etc. The best of breed approach faces similar problems with IP problems, architectural limitations, ability to respond to the rapidly changing threat environment, etc. A third approach is the use of a sequential systems integration business model, a community business model, etc. to develop interface translations that take the place of the manual processes that currently link systems. This may result in point-to-point links that may seem to work well, but by themselves suffer from problems including:

"paving the cow paths"—that is converting the existing manual processes into code rather than what is really needed;

"painting yourself into a corner"—that is building something that works today, but doesn't let you get to what you need tomorrow; and Creating an overly complex system that is difficult to operate and maintain. Each pairwise link can be different and taken together can look like "spaghetti code."

The point-to-point links don't provide a distributed umbrella model. This greatly limits the potential effectiveness of the solution and doesn't reduce the burden of staffing to support all the different human interfaces, because once staff has to intervene to understand something, take action, maintain, etc. they still have to use all of the individual human interfaces.

The autonomous network immune system disclosed herein in large part because it has more degrees of freedom than the problem may provide:

1. excellent end-to-end performance, 2. the ability to use an organization's existing point solutions, 3. the ability to quickly on-ramp new innovative solutions as they appear, 4. a true end to end view for system automation with different data visualizations useful to specific staff functions improving productivity and eliminating the need to have 24/7 staffing with expertise at all the user interfaces of the point security systems and the components of the underlying network, 5. the ability to respond effectively to changing data models from the addition of new components (both in the security system and in the underlying network), software upgrades, etc.

In the example shown, system 1300 includes network 106, an SOC 108 (for ease of understanding SOC staff 108*a* and SOC workstation 108*b* are now subsumed under 108), a central site computing center 1310, an orchestrator 210, a conductor 212, a threat intelligence system 1201 and associated orchestrator 1203, and a threat intelligence system 1202 and associated orchestrator 1204. Other orchestrators, network components, devices may be subsumed into the network 106 to make it easier for the reader to understand.

Central site computing center 1310 may include one or more analytic engines (storage and analysis portion of a behavioral analysis system) 120*a*, 120*b*, 120*c*, one or more virus checkers 1301*a*, 1301*b*, 1301*c*, one or more fire walls (FW) 1302*a*, 1302*b*, 1302*c*, one or more router/switches 1303*a*, 1303*b*, 1303*c*, one or more Security Information and Event Managers (STEM) 1304*a*, 1304*b*, 1304*c*, one or more access control systems 1305*a*, 1305*b*, 1305*c*, one or more varieties of point solutions (PS) 1306*a*, 1306*b*, 1306*c*, and one or more element management systems 1307*a*, 1307*b*, 1307*c* (e.g., commonly used to manage a suite of products from a single vendor such as router/switches from Juniper, Core Network Components from Cisco, Security Gateways from Nokia, etc.). An example of a point solution is a dedicated system focused on a specific type of problem and/or attack. Each component of central site computing center 1310 may include an associated orchestrator. Each associated orchestrator is configured to receive information from the components with which they are associated and to deliver information and commands to the components with which they are associated. For example, the orchestrators may deliver remediation commands to the components with which they are associated. The associated orchestrators may provide information from the components with which they are associated to other orchestrators (e.g., orchestrators 210, 1203, 1204), a conductor 212, or a SOC 108 (and possibly others subsumed in 106). The central site computing center may include one or more collectors (not shown for ease of reader understanding), and associated orchestrators for each major security related system of the central site computing center. The orchestrators described here may include the collector and analysis functions described for orchestrators 1015 and 1114.

Each of the components of central site computing center 1310 may have a corresponding specific human interface and a corresponding set of external machine interfaces. These imply a subsystem specific data model. Orchestrator 210 in conjunction with orchestrators 1203, 1204, and all of the orchestrators included in the central site computing center may provide SOC staff with a single user interface that allows them as necessary to observe and control all the security related subsystems. They may also provide the capability to automate as many or as few specific system, multi-system, or end-to-end system tasks as the organization desires with specific scripting or through the negotiation process described in this document.

In other embodiments, a plurality of data centers are connected with each other. The plurality of data centers may be remote from each other (e.g., a first data center of an organization is located at a first location and a second data center of the organization is located at a second location). For example, central site computing center 1310 may be connected with one or more other data centers (not shown). The one or more other data centers may include a plurality of orchestrators similar to that shown in FIG. 13. The plurality of orchestrators of the one or more other data centers are configured to provide the same functionality as provided in the autonomous network immune system 1300. This provides the benefits described for system 1300 on the more macro scale. In some embodiments, the orchestrators of the autonomous network immune system 1300 may implement a remediation based on a command from an orchestrator associated with the one or more other data centers.

Figure 14A:
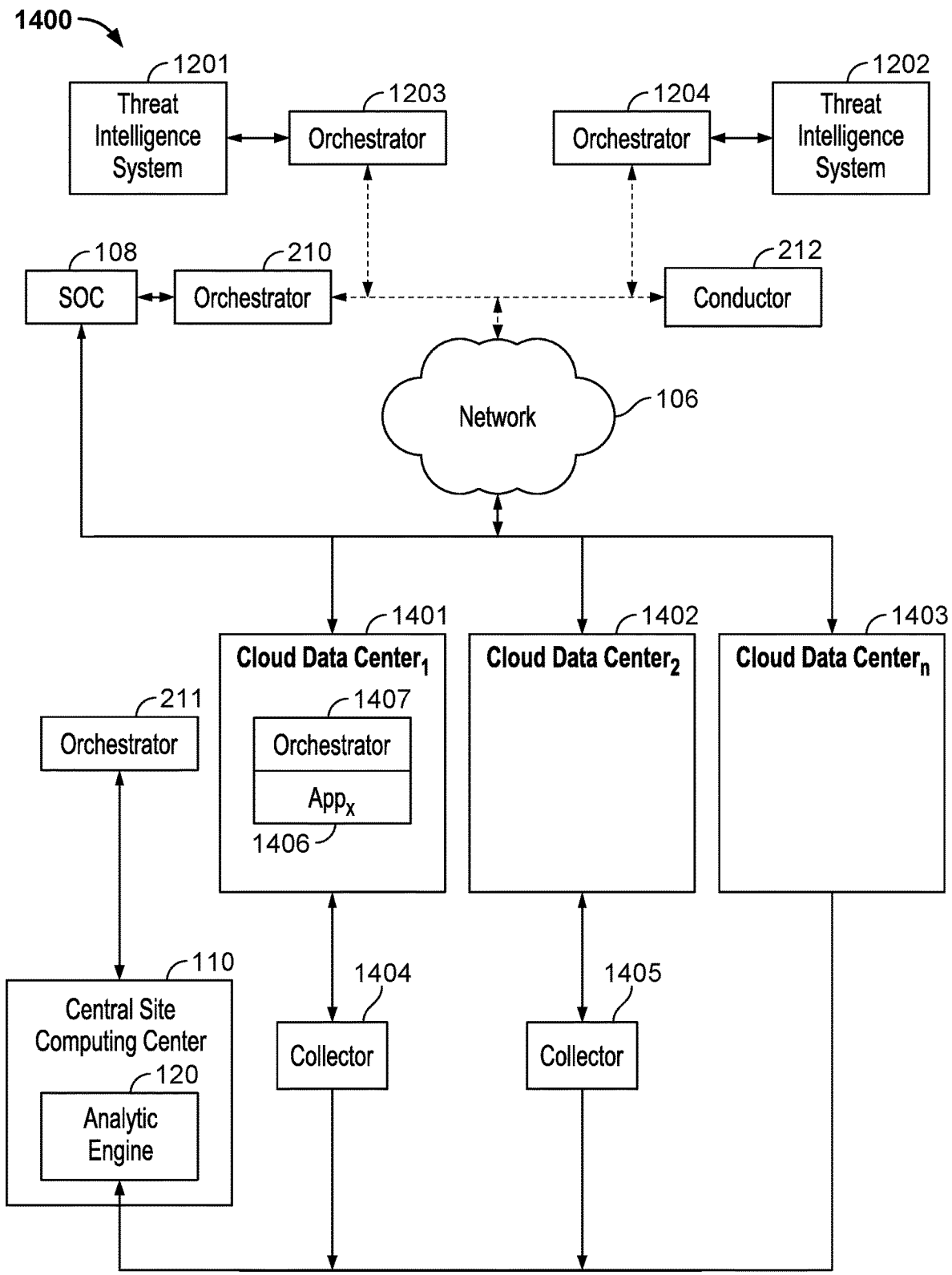
FIG. 14A is a block diagram illustrating an embodiment of an autonomous network immune system.

FIG. 14A is a block diagram illustrating an embodiment of an autonomous network immune system. In modern Cloud-based processing systems, it is common for applications to move between different resources within a single Cloud and between different Cloud instances. The different Cloud instances can be in the same physical data center, a different data center owned and operated by the same organization, or between Cloud instances owned and operated by different organizations. In some embodiments, an organization may implement a Hybrid Cloud. In the Hybrid Cloud, an organization has a central site data center it owns and operates, and contracts with an external organization that owns and operates an external data center with its Cloud instance. Based on workload fluctuations or other considerations, applications (APP's) may move from one to the other Cloud. This movement can be frequent and fast, such that in a large organization with many APPs it may be difficult to tell at any moment where a particular App is running. While the organizations that are processing APPs are changing, the security infrastructure takes a more static view. In current systems, collectors tend to remain fixed on specific hardware in specific locations. While it is possible that some or all of the central site security systems (including behavioral analysis) may themselves operate in Clouds and may move from one Cloud instance to another, for behavioral analysis purposes, the central site analysis center only has the view that it's collectors give it, which tends to be static (for example focused on activity in a single Cloud with separate foci for each Cloud). There are security related concerns about the behavior of network components primarily responsible for communication, but many times the most valuable information resources reside in the APPs and much of the behavior analysis performed on data from the communication centric components is focused on determining if there has been a breach of an APP. So, in many cases, it is the behavior of the APPs that is of concern. When APPs are moving frequently, it may be difficult to determine from static Cloud/data center focused macro data if there has been a behavior change of concern. Even worse, this may become impossible if the APP moves to an external Cloud operated by an external organization where the APP owner does not have access to behavioral data. Behavioral data may be restricted in a public Cloud because a collector deployed by the public Cloud operator and provided to an App owner might see data from applications owned by different organizations thus causing privacy concerns. There are also technical and logistical limitations that can impact the ability of public Clouds to provide behavioral information at the Cloud instance level.

In the example shown, system 1400 includes network 106, an SOC 108, an analytic engine included in a central site computing center 110, an orchestrator 210, a conductor 212, a threat intelligence system 1201 and associated orchestrator 1203, a threat intelligence system 1202 and associated orchestrator 1204, cloud data centers 1401, 1402, 1403, collectors 1404, 1405, and an APP 1406 and associated orchestrator 1407. System 1400 includes n data centers running separate Clouds, each in its own separate data center (1401, 1402, 1403). Cloud Data Center 1401 is connected to Collector 1404, Cloud Data Center 1402 is connected to Collector 1405, but Cloud Data Center 1403 does not have a Collector (for example, it is a Public Cloud while the others are Private Clouds). The collectors are connected to analytic engine 120 with its associated orchestrator 211. Running in Cloud Data Center$_1$ 1401 is APP$_x$ 1406. Associated with APP$_x$ 1406 and running in the same Cloud is orchestrator 1407. Orchestrator 1407 is configured to monitor the behavior of APP$_x$ specifically with very complete and very current (low latency) behavioral data. Orchestrator 1407 may be a combined orchestrator, collector, and behavioral analysis engine, similar to orchestrator 1114.

Figure 14B:
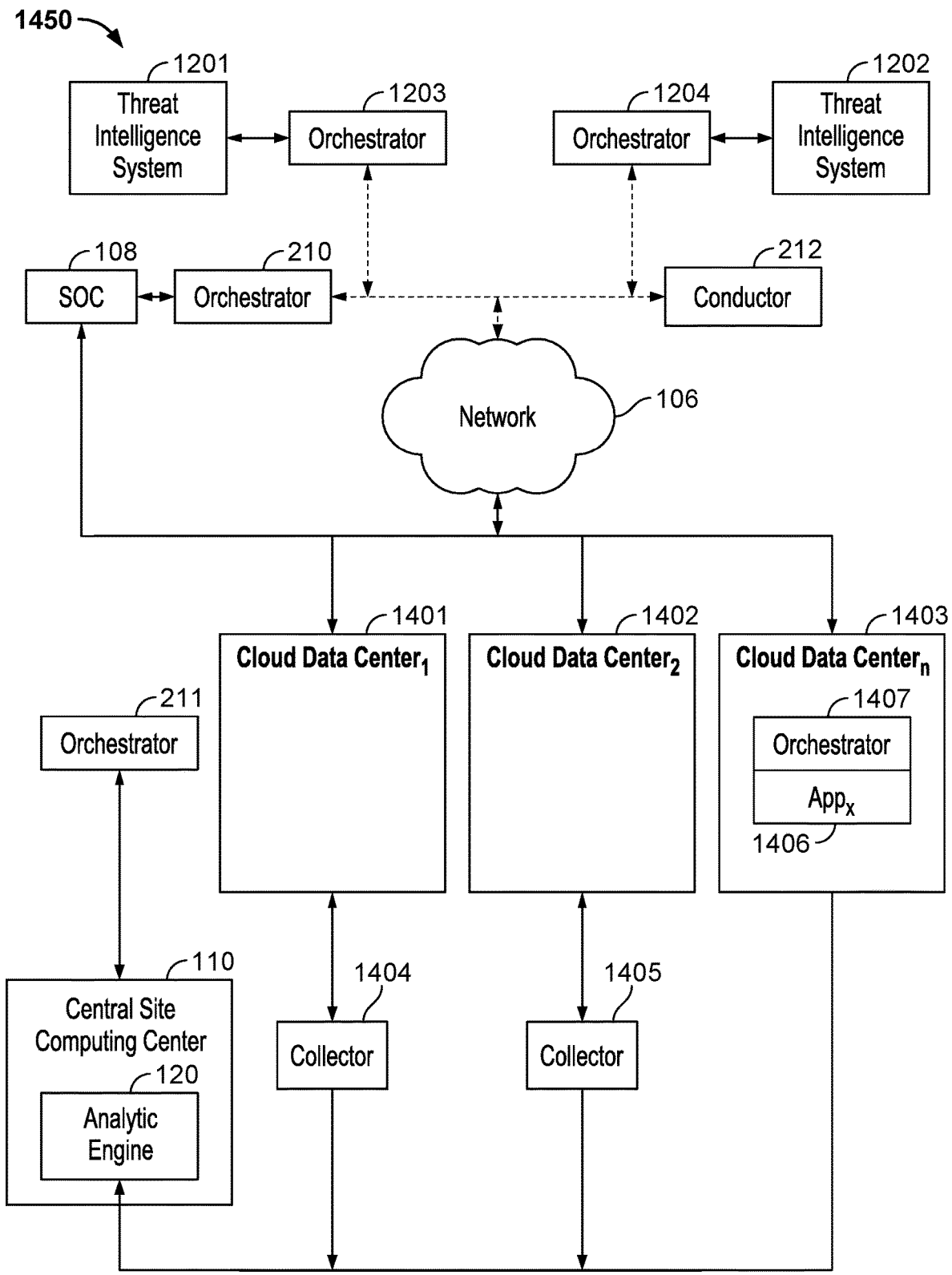
FIG. 14B is a block diagram illustrating an autonomous network immune system according to some embodiments.

FIG. 14B is a block diagram illustrating an autonomous network immune system according to some embodiments. In the example shown, autonomous network immune system 1450 is similar to autonomous network immune system 1400 except that APP$_x$ 1406 has moved to Cloud Data Center$_n$ from Cloud Data Center$_1$. At the same time orchestrator 1407 has moved with APP$_x$ to Cloud Data Center$_n$. The realization shown in FIGS. 14A and 14B provides several advantages. First, the behavior of the APP is observed directly rather than indirectly along with a profusion of other apps and components. At the same time its directly associated orchestrator has access to the most current and complete behavioral data (does not have to worry about selective reporting to reduce overhead on the network, or other restrictions that might come into play at the Cloud/ data center level, etc.). This provides a much more accurate basis for analysis. Second, there is no interruption or confusion as the move takes place. Finally, there is no confusion by looking at behavioral data mixed with behavioral data from other activities in Cloud Data Center$_1$. Nor is there confusion by seeing differences once it has moved that could be attributable to Cloud Data Center$_n$. Further, in the case shown in FIG. 14B, Cloud Data Center$_n$ 1403 does not have an associated collector and therefore there is no behavioral data available associated with APP$_x$ 1406 from 1403 unless orchestrator 1407 moves with APP$_x$ 1406 when it moves to Cloud Data Center$_n$ 1403. Thus, having an orchestrator associated with an APP located in a cloud data center may provide behavior data associated with the APP that would otherwise be unavailable for analysis.

Also, it should be noted that while any form of behavioral analysis can be used in this particular embodiment, using the histogram behavioral analysis algorithm described above provides special advantages in this case. The small footprint of the orchestrator code coupled with the small size of the data set maintained by the histogram behavioral analysis algorithm makes it very easy to move the resulting orchestrator with the combined collector and analysis engine. Much easier than with a very large data set created and employed by other methods. At the same time, this approach can be combined through the assistance of the applicable orchestrators with the fixed data center based behavioral analysis system 120.

Figure 15:
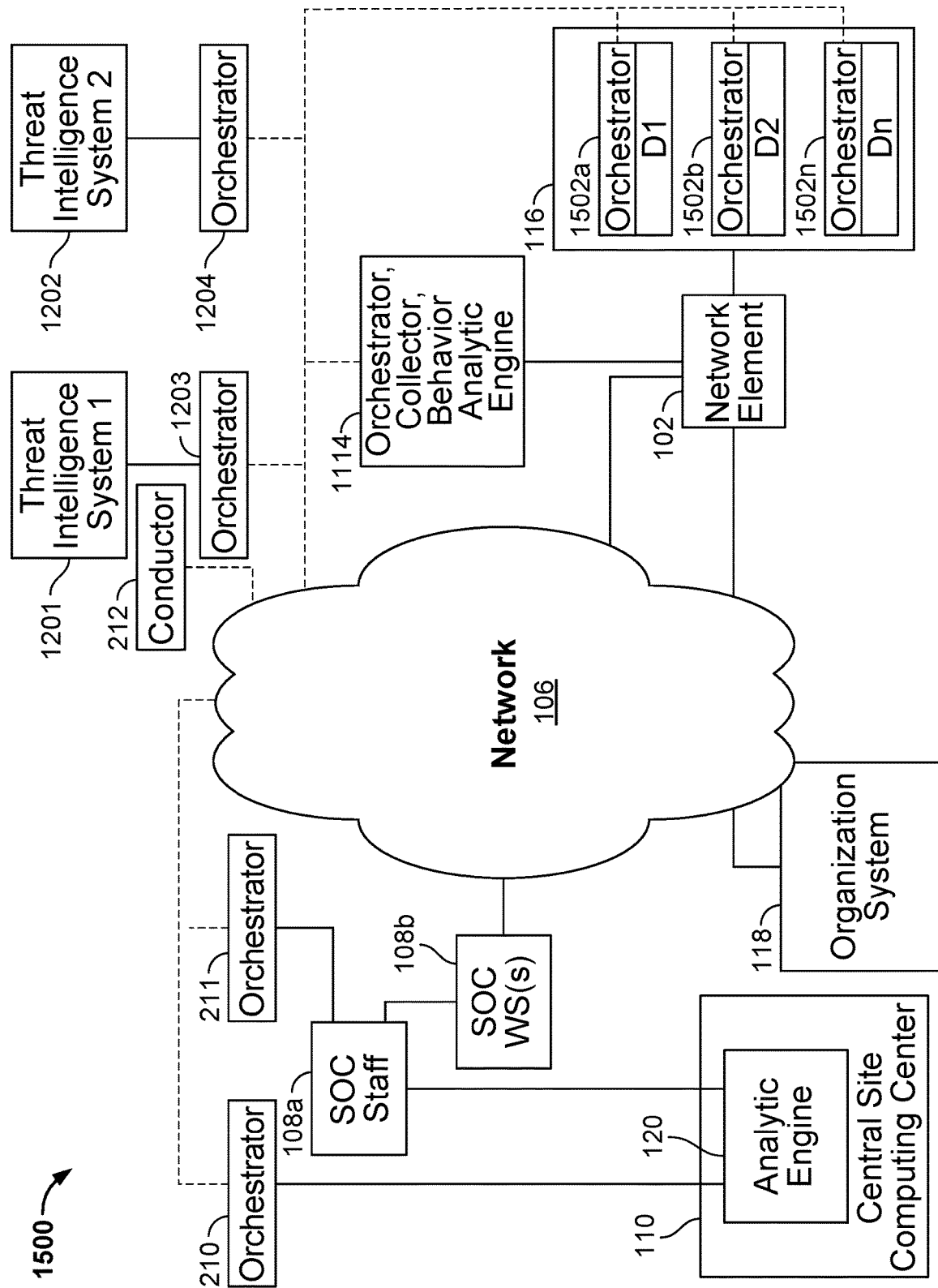
FIG. 15 is a block diagram illustrating an embodiment of an autonomous network immune system.

FIG. 15 is a block diagram illustrating an embodiment of an autonomous network immune system. FIGS. 2, 10, 11, and 12 show computing devices 116. The behavior of these devices is monitored from information available to an underlying network element 102. In some embodiments, this underlying network element and its downstream computing devices may be someplace in the interior of the network. In other embodiments, the network element can be an edge router, and the downstream devices can be edge systems. In either embodiment, it is possible to add orchestrators such that some or all of the downstream devices have individual orchestrators associated with them (either physically co-located or remote). In some embodiments, there can still be an orchestrator for the underlying network device that also monitors the behavior of the downstream devices as well as the underlying network element. In other embodiments, there are only orchestrators for the downstream devices.

In the example shown, autonomous network immune system 1500 includes a plurality of computing devices 116. Each computing device has an associated orchestrator, e.g., orchestrator 1502a, 1502b, 1502n. An orchestrator associated with a computing device is configured to perform the functions associated with an orchestrator as described herein. The autonomous network immune system 1500 includes an underlying network element 102 that still has an orchestrator 1114 associated with it. In some embodiments, autonomous network immune system 1500 includes an underlying network element 102 without associated orchestrator 1114.

The autonomous network immune system 1500 shown in FIG. 15 provides several advantages. First, the behavior of the computing devices 116 is observed directly rather than indirectly along with a profusion of other devices and components (i.e., the behavior is observed directly from an associated orchestrator instead of orchestrator 1114). An orchestrator associated with one of the computing devices 116 has access to the most current behavioral data and the most complete (does not have to worry about selective reporting to reduce overhead on the network, etc.). If the computing devices are mobile (notebook computers, pads, etc.) and move such that they are served at different times by different underlying network elements 102 in different locations (for example office and home, etc.), having the orchestrator directly associated with the computing device provides a much more accurate basis for behavioral analysis. In such a case, there is no interruption or confusion as the computing device uncouples from one instance of an underlying network element 102 and attaches to another instance of an underlying network element. Finally, there is no confusion by looking at behavioral data mixed with behavioral data from the changing environments resulting from the moves.

Also, it should be noted that while any form of behavioral analysis may be used in this particular embodiment, using the histogram behavioral analysis algorithm described above provides special advantages in this case. The small footprint of the orchestrator code coupled with the small data set maintained by the histogram behavioral analysis algorithm makes it very easy to host the orchestrator function directly on the computing devices 116. As shown in the autonomous network immune system 1500, this approach can be combined through the assistance of the applicable orchestrators with the analytic engine 120 of the central site computing center 110.

Figure 16:
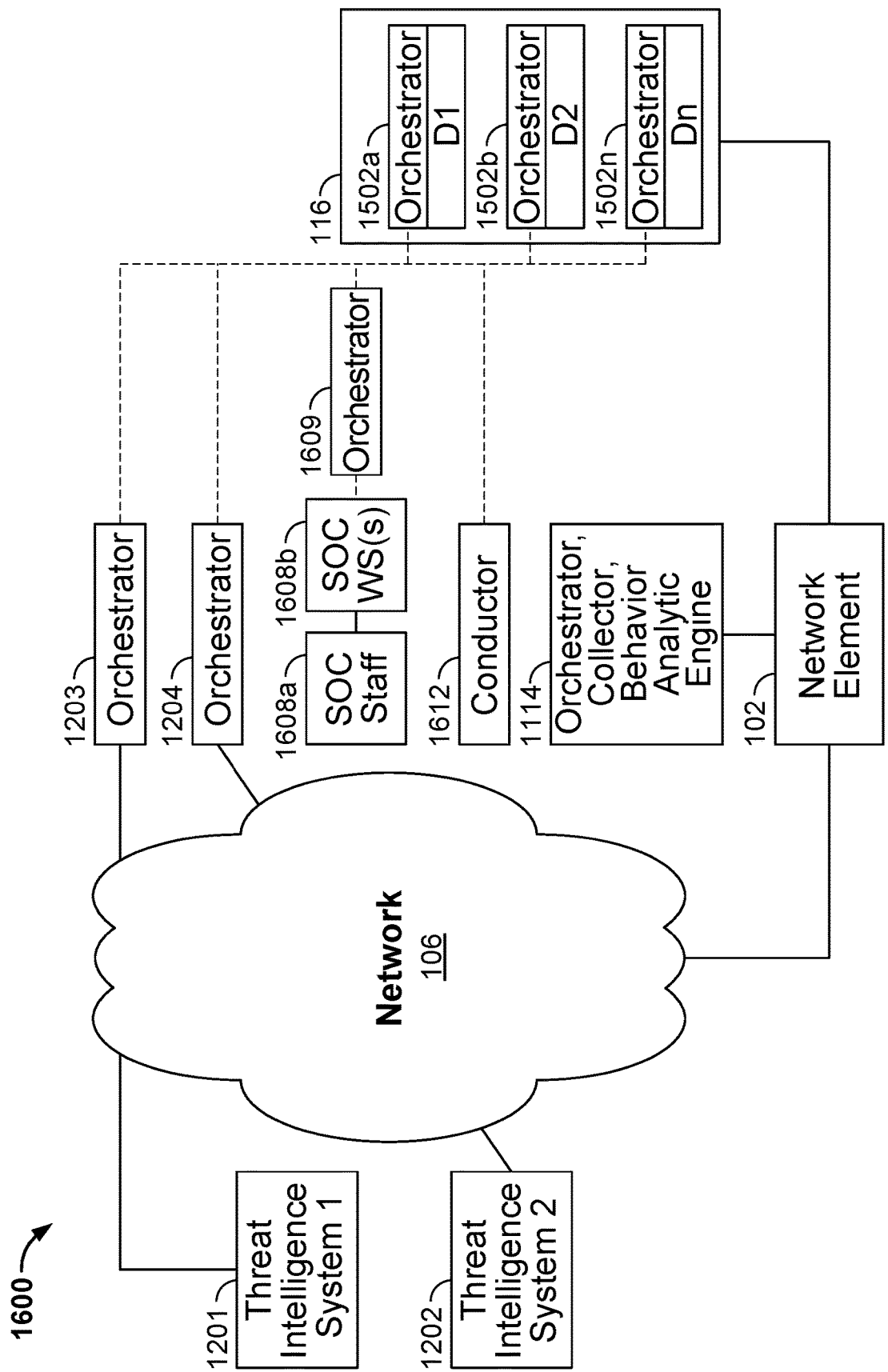
FIG. 16 is a block diagram illustrating an embodiment of an autonomous network immune system.

FIG. 16 is a block diagram illustrating an embodiment of an autonomous network immune system. The autonomous network immune system may be associated with a single individual, family, small office/home office (SOHO), smart home, etc. The owner of such a system may contract with a large organization to provide security support and one or more of the other embodiments described herein may be deployed. However, in some embodiments, the owner desires to acquire the tools to monitor and secure his/her own system. Autonomous network immune system 1600 may be used for such situations.

In the example shown, autonomous network immune system 1600 includes a network element 102, a network 106, one or more computing devices 116, an orchestrator 1114 that includes a collector and local behavior analytic engine, threat intelligence systems 1201, 1202, orchestrators 1502a, 1502b, 1502n associated with the one or more computing devices 116, a conductor 1612, and an SOC staff 1608a (e.g., a manager of an office, a parent of a household, etc.). The autonomous network immune system 1600 includes conductor 1612 and the SOC workstation 1608b (which may be in some embodiments a window on one of the D devices in 116), which are now in the network downstream of the network element 102 (e.g., router/switch/ firewall) and its associated orchestrator 1114 connected to the internet 106. The owner may choose to subscribe to one or more threat intelligence services 1201 and 1202, with associated orchestrators 1203 and 1204. All orchestrators and the Conductor in some embodiments are run in one or more of the devices D. In some embodiments, orchestrators 1502a, b, and n are orchestrators like 1114 that include collectors and behavioral analysis engines. Here again, it should be noted that while any form of behavioral analysis may be used in this particular embodiment, using the histogram behavioral analysis algorithm described above provides special advantages in this case. The small footprint of the orchestrator code coupled with the small data set maintained by the histogram behavioral analysis algorithm makes it very easy to host the orchestrator function directly on the computing devices 1502 *a, b*, and *n*. Orchestrator 1609 in some embodiments is configured to provide data visualization in such a fashion that an owner/operator with limited technical expertise can easily work with the security system.

Thus, system 1600 provides the capability for a small organization to secure its environment without relying on an external organization to manage it. It also provides a way for the small organization to do so in a practical and cost effective manner.

Figure 17A:
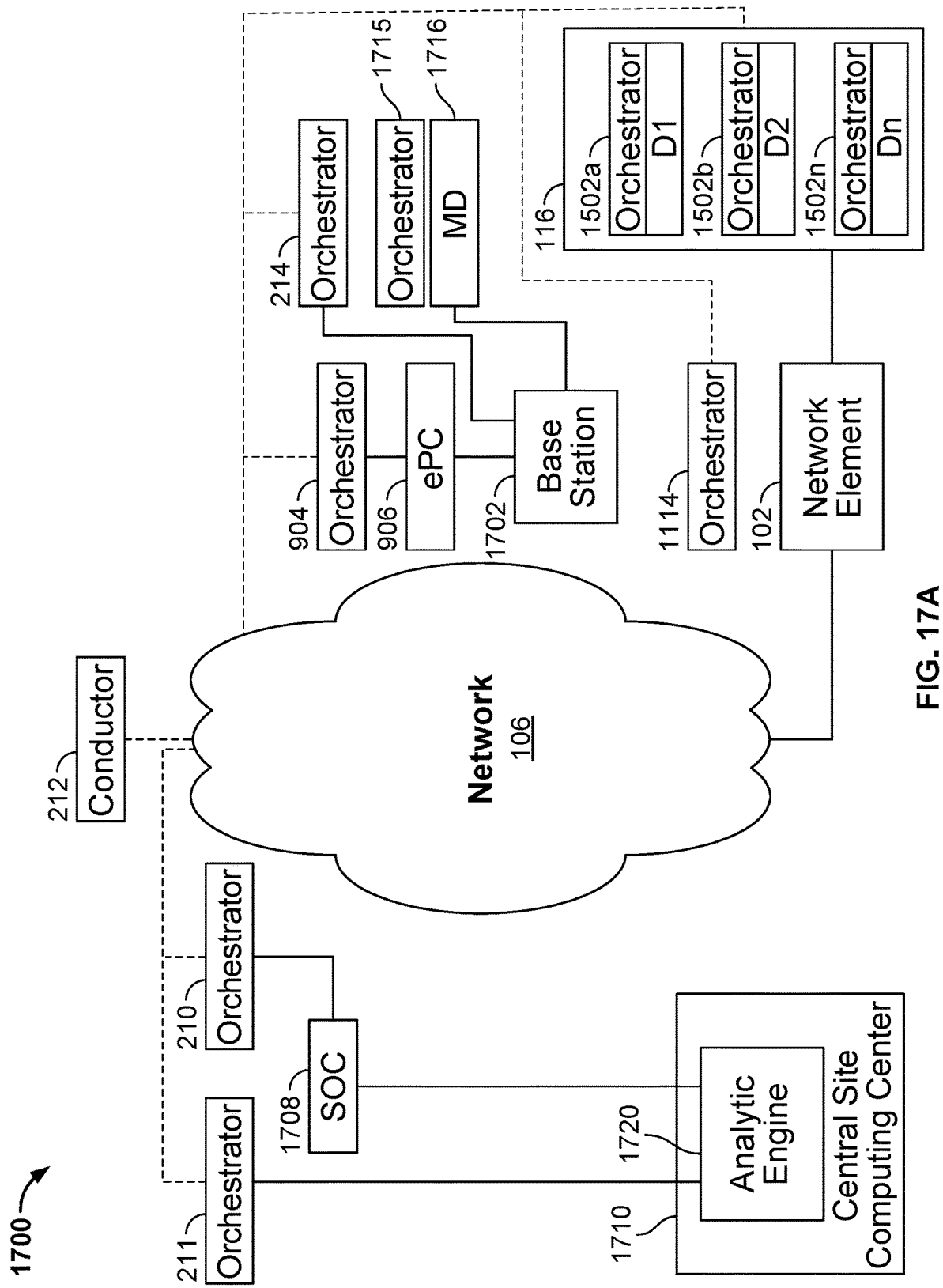
FIG. 17A is a block diagram illustrating an embodiment of an autonomous network immune system.

FIG. 17A is a block diagram illustrating an embodiment of an autonomous network immune system. In the example shown, system 1700 depicts in some embodiments a system where a Cellco provides security support for mobile devices that are connected by Cellco owned and operated network components; in other embodiments a system where a Cellco provides security support for both fixed and mobile devices. For the ease of the reader other embodiments where the Cellco owns only portions of the network and/or owns no portion of the network are not shown, but included by reference. Also, FIG. 17A has been simplified by removing some of the subsystems. This has been done to make it easier for the reader. But all those subsystems shown in the other figures may be considered to be present by reference. A mobile device may include a cell phone, a smart phone, a connected tablet, a smart watch, etc. Autonomous network immune system 1700 may include networks 106 (e.g., cellular net, Internet, WiFi, etc.), a base station/access point 1702, an analytic engine 1720 that is part of a central site computing center 1710 associated with a Cellco, a Cellco SOC 1708 (containing both staff and workstations), a conductor 212, orchestrators 210, 211, 1114, 904, and 214, one or more mobile devices 1716 and associated one or more orchestrators 1715. Cellco SOC 1708, the analytic engine 1720, and base station/access point 1702 are operated by a Cellco. Base station/access point 1702 may include a switcher/router and/or firewall. In some embodiments orchestrators 1114, 214, 904, 1502*a,b,n*, and 1715, are configured to perform behavioral analysis on data collected by their associated devices.

Having the orchestrator directly associated with a mobile device provides a much more accurate basis for behavioral analysis. In such a case, there is no interruption or confusion as the mobile device uncouples from one instance of 1702 and attaches to another. Finally, there is no confusion by looking at behavioral data mixed with behavioral data from the changing environments resulting from the moves.

Also, it should be noted that while any form of behavioral analysis can be used in this particular realization, using the histogram behavioral analysis algorithm described above provides special advantages in this case. The small footprint of the orchestrator code coupled with the small size of the data set maintained by the histogram behavioral analysis algorithm makes it very easy to host the orchestrator function directly on a mobile device 1716. As shown in 1700, this approach can be combined through the assistance of the applicable orchestrators with the data center based behavioral analysis system 1720.

There is another important benefit from having the orchestrator with the histogram method reside in a mobile device. The number of mobile devices approximates the number of people on the planet and comes from a variety of different vendors. Plus, new models come out very frequently and there are frequent software upgrades for devices in the field. This combination of extremely large scale, complexity, and volatility is very challenging for a single organization to secure using a central site, monolithic, scripted approach. The distributed nature, ability to discover/negotiate, operate with minimal or no manual intervention, automatically respond to changes in the environment, etc. of the invention make it uniquely able to address these challenges.

Figure 17B:
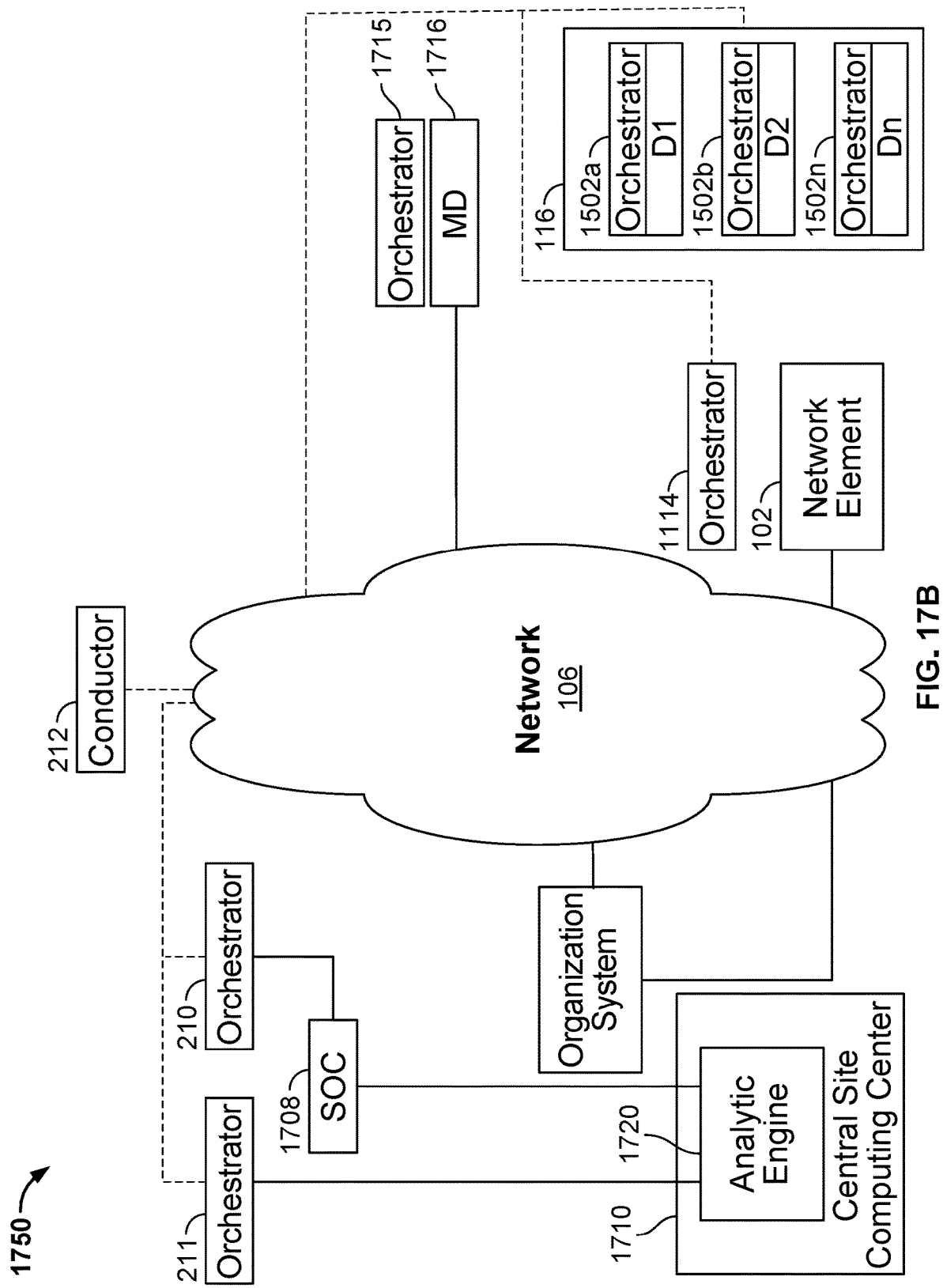
FIG. 17B is a block diagram illustrating an embodiment of an autonomous network immune system.

FIG. 17B is a block diagram illustrating an embodiment of an autonomous network immune system. In the example shown, system 1750 illustrates an embodiment where an enterprise or other organization provides security support for the mobile devices 1716. System 1750 is similar to system 1700, except that the SOC is an Enterprise SOC 1708, the central site analysis system 1720 is now operated by the enterprise, and the orchestrator cellular infrastructure is no longer present because it is not within the span of control of the enterprise. System 1750 has similar benefits to system 1700 and can benefit in a similar fashion from the histogram method.

Figure 17C:
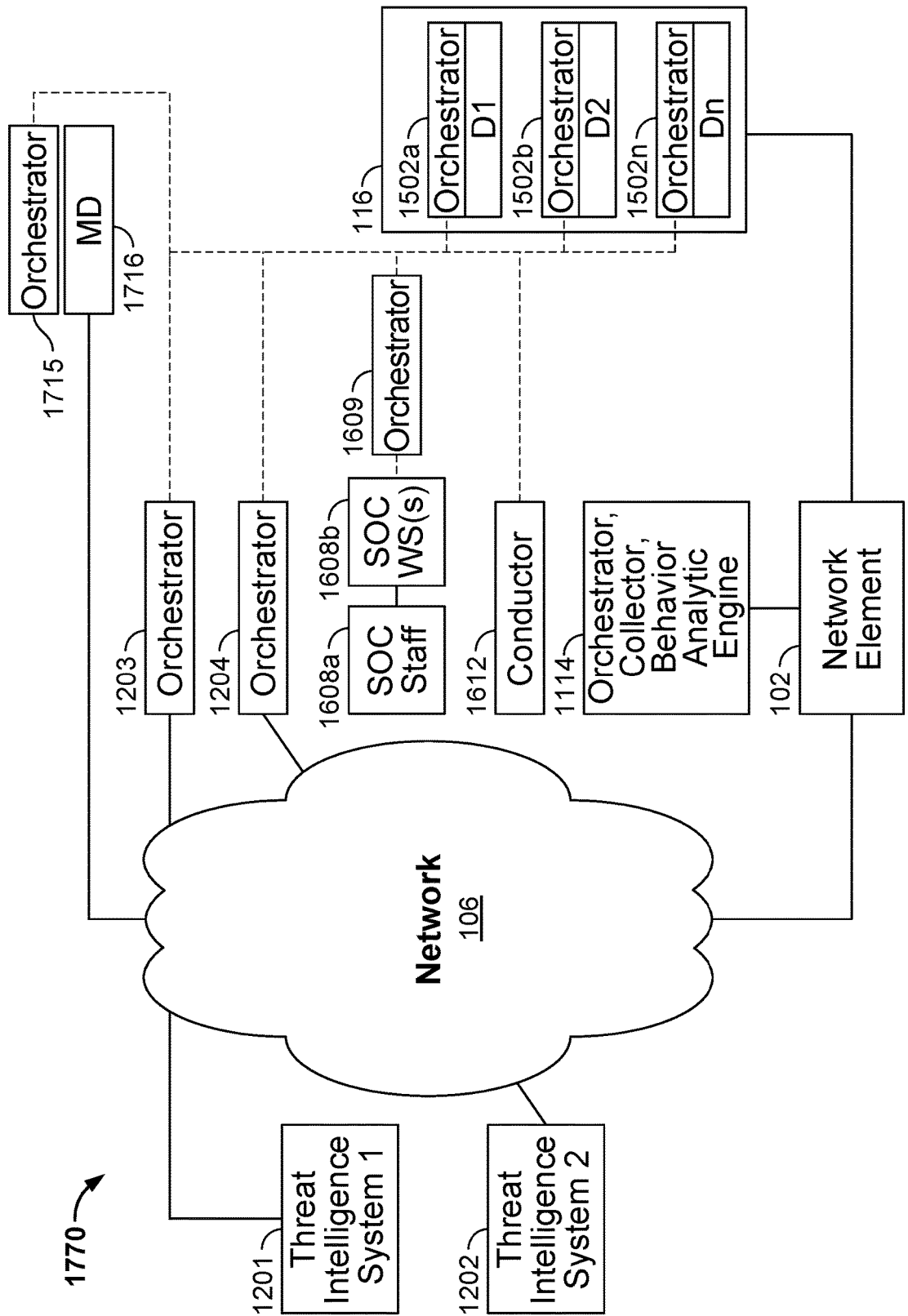
FIG. 17C is a block diagram illustrating an embodiment of an autonomous network immune system.

FIG. 17C is a block diagram illustrating an embodiment of an autonomous network immune system. In the example shown, system 1770 illustrates an embodiment where a system associated with a single individual, family, small office/home office (SOHO), smart home, etc., may contract with a large organization to provide security support for either or both of their mobile devices and fixed devices. FIG. 17C is similar to FIG. 16, except that system 1770 includes mobile device 1716 connected to the rest of the system through the internet 106, and its associated orchestrator 1715.

It is possible to have combinations of the systems 1700, 1750, and 1770. That is, there can be multiple SOC's under control of multiple different organizations who agree to share some or all of the data and control of the orchestrators. There are also many other embodiments, where third parties provide security support, and combinations and permutations of some or all of these. The third parties can include the vendor of mobile devices 1716.

These combinations raise the question of who owns and who operates the conductor. There may be multiple conductors associated with multiple orchestrator arrays owned by multiple entities. The orchestrator arrays may or may not overlap. If they overlap, more than one orchestrator may be associated with a single component. In such cases, the orchestrators may have segregated access to information and controls. For example, in some embodiments, a user of mobile device 1716 may share access to, and control of some portion or all of its associated orchestrator with a network operator and/or an organization, and/or a manufacturer, etc. In other embodiments, there may be one conductor controlling only one orchestrator array. If there is one conductor/orchestrator array, by agreement one of the parties involved can own the conductor or its ownership can be shared. Similarly, by agreement one of the parties involved can operate the conductor or its operation can be shared.

As the underlying computing, communications, and mobility technology and business practices evolve, there may be other structures, scenarios, use cases, business models, and government laws/regulations that create additional combinations and permutations. The autonomous network immune system described here in this invention has the flexibility to meet all of them.

Transportation Applications

The transportation industry is going through a period of profound transformation as the autonomous connected vehicle emerges. Whether carrying passengers or freight, whether on land, sea or in the air, the one thing that is clear is that security for these is not a "nice to have," but a "must have." As pervasive automation continues to permeate our society, the security situation with self-driving cars is an example of the security situation with self-driving trucks/railroads/drones etc., self-driving communications networks/electrical grids/water systems/sewage systems, etc., self-operating hotels/restaurants/retail, etc., and on and on. The embodiments described below are applicable for all "self-driving" pervasive automation systems to come.

For background on the scale complexity and volatility of the problem consider that 80 million new cars a year are sold. The installed base is approaching 1 billion. There are many companies selling many different types and models of cars on a global basis and another large group of companies selling cars on a local or regional basis. As a result, a high degree of heterogeneity exists. With the software-ization of cars and the use of software downloads, heterogeneity and volatility are increasing. The use of vehicles today in terrorist attacks points to one kind of vulnerability. Detective stories often use a cut brake line as a mechanism to cause pain or death to a character and point to another kind of vulnerability. The media often has stories about someone who has tried to steal a car and lost control resulting in damage and injury. The ability to intrude into today's modest control systems in cars has been demonstrated repeatedly. Ride hailing companies (e.g., Uber®) are facing lawsuits from passengers who have been attacked by drivers, drivers who have been attacked by passengers, and passengers who have attacked other passengers. Autonomous cars themselves, have been attacked by pedestrians and other drivers. As people in cars no longer have to pay attention to driving, they will make increasing use of information technology and will want the same level of security that they have in their workplaces and homes. As vehicles become autonomous all these and many other vulnerabilities will be critical. The discussion of vulnerabilities can become quite complicated. But the value that an autonomous vehicle monitoring system, active at all times to catch attacks before they can cause too much damage, is clear. This is difficult to do without a system that automatically monitors all the vehicle systems for attacks automatically without requiring special effort to establish patterns, etc.

Because of the software-ization of vehicles, the security problem is the same for the connected vehicle that is driver operated, and the connected vehicle that is autonomous, and they both can be secured in a similar fashion. The vehicle that is not intended to be connected (it has been shown that control systems in vehicles not intended to be connected can be breached) is also at risk. It can be secured in a fashion similar to connected vehicles, with a slightly different realization to take account of the lack of pervasive network connections.

Figure 18A:
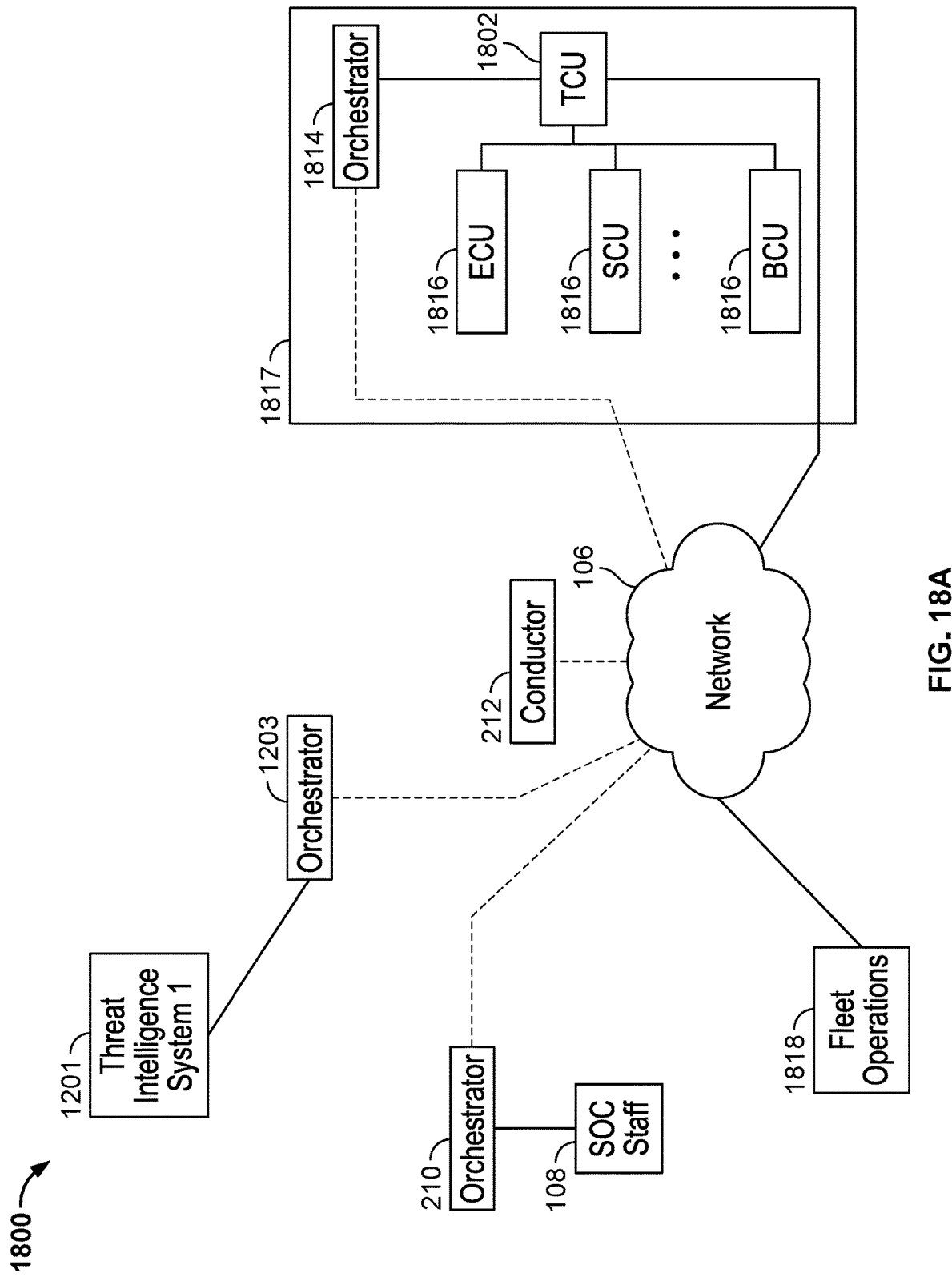
FIG. 18A is a block diagram illustrating an embodiment of an autonomous network immune system.

FIG. 18A is a block diagram illustrating an embodiment of an autonomous network immune system. Autonomous Network Immune System 1800 may include a network 106, an SOC 108, orchestrators 210, a conductor 212, a threat intelligence system 1201 and associated orchestrator 1203, a vehicle 1817, and fleet operations 1818. Vehicle 1817 may be a connected vehicle (either driver controlled, autonomous, or able to move back and forth between driver controlled and autonomous) that contains a Telecommunications Control Unit (TCU) 1802, a number of downstream control units 1816, and orchestrator 1814. These downstream control units may include an Engine Control Unit (ECU), a Steering Control Unit (ECU), and a Breaking Control Unit (BCU). The downstream control units may include one or more other control units (not shown). Orchestrator 1814 may include a collector and a local behavior analytic engine. The collector is configured to collect data from TCU 1802. The local behavior analytic engine may be configured to determine that one of the downstream control units 1816 has been compromised based on information provided by TCU 1802 and analysis functions including but not limited to, behavioral analysis. Orchestrator 1814 can detect a problem using algorithms, objectives, and constraints; use machine learning technology to identify patterns; and other mechanisms and/or processes, etc.

In the example shown, orchestrator 1814 is configured based on information delivered to it by TCU 1802 to determine that one of the downstream control units 1816 has been compromised and to generate an alert. In some embodiments, the alert is also delivered to SOC 108 and/or fleet Fleet operations 1818. Based on algorithms (which can be work flow process scripting, or more complex interactions between orchestrators), constraints, and objectives (which can include information about the value of the component in question, its owner, etc.) orchestrator 1814 can determine whether human interaction should be included in the course of action or if remediation should proceed immediately. In the event human interaction is determined to be needed, information determined by the algorithms, objectives, and constraints is provided to orchestrator 210, i.e., the orchestrator associated with the operator's console in SOC 108. In some embodiments, the information is presented in a screen that minimizes the opportunity for the operator to make a "Fat Finger" error. For example, it is presented in a screen that is configured to provide relevant information and only allows for yes or no clicks/responses. In some embodiments, orchestrator 210 provides a message to orchestrator 1814 to begin remediation. In response to receiving the message, orchestrator 1814, based on algorithms, objectives, and constraints, is configured to communicate with the device with which it is associated, in this example, TCU 1802 and via TCU 1802, to communicate with the control units 1816 to commence remediation.

In some embodiments, fleet operations center 1818 is operated by the vehicle manufacturer and/or an organization providing transportation as a service. It is possible that there will be a small number of custom vehicles built where the builder does not maintain a Fleet Operations Center and the vehicle is not involved in transportation as a service. In these cases, the vehicle owner will perform the SOC function. Threat intelligence system 1201 may include specialized threat intelligence services specifically focused on threats to connected vehicles as well as generalized threat intelligence services that provide more generalized threat information. Orchestrator 1203 may collect such information and provide such information to one or more other orchestrators included in the system 1800. The one or more orchestrators included in system 1800 may implement a course of action and/or a remediation based on the information.

SOC 108 may be operated by the same organization as fleet operations, but they may be operated by separate organizations. The operator of the SOC will likely host (or arrange to have hosted) the conductor 212 and operate it. As in the case discussed in the description of FIG. 17C, there may be multiple SOCs and/or fleet operators. The discussion in the description of FIG. 17C applies to this situation here and for the sake of brevity will be included only by reference. In some embodiments, the SOC 108 and fleet operations centers 1818 are co-located, combined, and/or otherwise interrelated.

In some embodiments there will also be an analytic engine 120 in a central site 110 with associated orchestrator 211 as shown in FIG. 15. In other embodiments the security services for the vehicle will be provided by a Cellco, in which case, the vehicle 1817 will assume the position of the mobile device (MD 1716) in FIG. 17A.

Figure 18B:
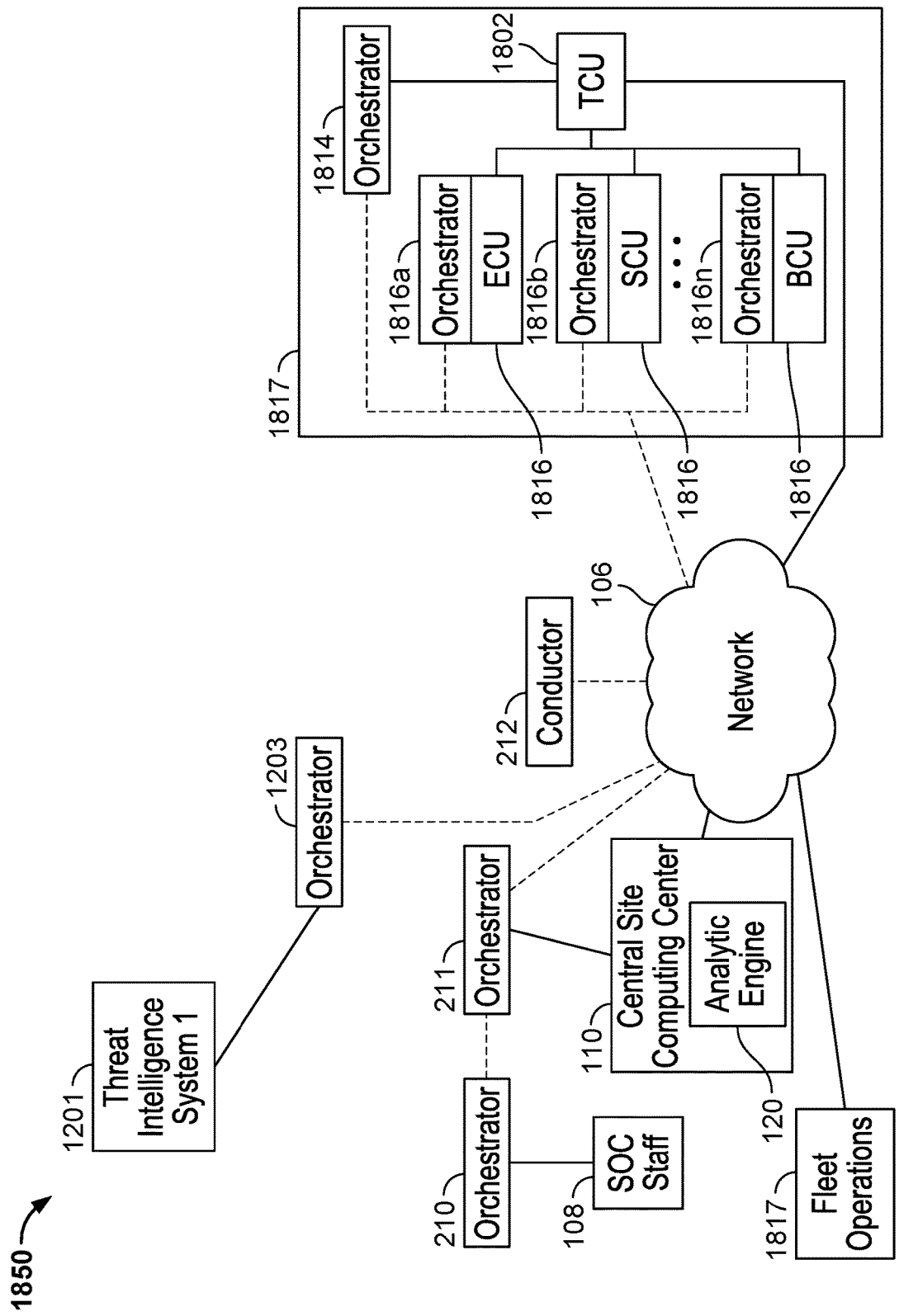
FIG. 18B is a block diagram illustrating an embodiment of an autonomous network immune system.

FIG. 18B is a block diagram illustrating an embodiment of an autonomous network immune system. In the example shown, autonomous network immune system 1850 differs from autonomous network immune system 1800 in that individual orchestrators 1816a, 1816b, 1816n are associated with each of the downstream control units 1816, respectively. Associating orchestrators with one or more of the downstream control units has the benefit of observing the control units' functions directly rather than indirectly along with a profusion of other devices and components. At the same time, its directly associated orchestrator has access to the most current behavioral data and the most complete (does not have to worry about selective reporting to reduce overhead on the network). It also dramatically lowers latency. Given the speed with which vehicles move and the potential consequences of unauthorized movement, low latency responses to behavioral anomalies (whether caused by an attack or a bug) are very important. Orchestrator 1816a is configured to directly observe the behavior of the ECU and provide the behavioral data to orchestrator 1814 and/or take action directly based on its local analytic engine. Orchestrator 1816b is configured to directly observe the behavior of the SCU and provide the behavioral data to orchestrator 1814 and/or take action directly based on its local analytic engine. Orchestrator 1816n is configured to directly observe the behavior of the BCU and provide the behavioral data to orchestrator 1814 and/or take action directly based on its local analytic engine.

Orchestrator 1814 includes a collector that is configured to capture behavioral information from TCU 1802 and orchestrators 1816a, 1816b, 1816n. Orchestrator 1814 includes a local behavior analytic engine that may be configured to determine that one of the control units 1816 has been compromised based on information provided by underlying TCU 1802, directly provided from one of the orchestrators 1816a, 1816b, 1816n, and/or analysis functions including but not limited to, behavioral analysis. Orchestrator 1814 can detect a problem using algorithms, objectives, and constraints; use machine learning technology to identify patterns; other mechanisms, and/or processes, etc. As with the algorithms discussed in conjunction with FIG. 10, Orchestrator 1814 may use the cooperative distributed facility of the negotiation process (with orchestrators 211, 210, and in some embodiments conductor 212) combined with IF-MAP like data stores to implement the detection process and/or the machine learning technology making it distributed analysis and/or distributed machine learning. The distributed process can, in some cases, involve analytic engine 120 that has received behavioral information from orchestrator 1814 via orchestrator 211. All of the other orchestrators may take hardening and/or remediation actions based on information received from orchestrator 1203 based on information from threat intelligence system 1201. All the other orchestrators may deliver information on Local attack experience(s) to threat intelligence system 1201 via orchestrator 1203.

In the example shown, orchestrator 1814 is configured based on information delivered to it by TCU 1802, orchestrator 1816a, orchestrator 1816b, or 1816n, to determine that one of the control units 1816 has been compromised and to generate an alert. In some embodiments, the alert is also delivered to SOC 108. Based on algorithms (which can be work flow process scripting, or more complex interactions between orchestrators), constraints, and objectives (which can include information about the value of the component in question, its owner, etc.) orchestrator 1814 can determine whether human interaction should be included in the course of action or if remediation should proceed immediately. In the event human interaction is determined to be needed, information determined by the algorithms, objectives, and constraints is provided to orchestrator 210, i.e., the orchestrator associated with the operator's console 108. In some embodiments, the information is presented in a screen that minimizes the opportunity for the operator to make a "Fat Finger" error. For example, it is presented in a screen that is configured to provide relevant information and only allows for yes or no clicks/responses. In some embodiments, orchestrator 211 provides a message to orchestrator 1814 to begin remediation. In other embodiments, orchestrator 210 provides a message to orchestrator 1814 to begin remediation. In other embodiments, orchestrator 211 and orchestrator 210, in conjunction, provide a message to orchestrator 1814 to begin remediation. In response to receiving the message, orchestrator 1814, based on algorithms, objectives, and constraints, is configured to communicate with the device with which it is associated, in this example, TCU 1802 to communicate with the control units 1816 to commence remediation or to directly communicate with control units 1816 to commence remediation. Examples of remediation actions include, but are not limited to, partially or fully limiting the other parts of the underlying network with which one or more control units 1816 can communicate, rebooting one or more control units 1816, restoring one or more control units 1816 (e.g., to a last known good state), repairing one or more control units 1816, patching a software element associated with one or more control units 1816, reloading installed software on control units 1816 from a trusted source, etc. In some embodiments, the central site analytic engine 120 is included as part of conductor 212.

In vehicles in which passengers have access to vehicle information displays and controls, passengers in the vehicle may act as part or all of the SOC staff 108a (contained in FIG. 18B within SOC 108).

Also, it should be noted that while any form of behavioral analysis can be used, using the histogram behavioral analysis algorithm described above provides special advantages in this case. The small footprint of the orchestrator code coupled with the small data set maintained by the histogram behavioral analysis method makes it very easy to host the orchestrator function directly on the TCU 1802 and/or on the control units 1816. Also, because of its method, it is able to respond to change in behavior very quickly, dramatically lowering the system latency. This reduction in latency for vehicles traveling at high rates of speed may be very critical.

As shown in system 1850 the local behavioral analysis may be combined through the assistance of the applicable orchestrators with the data center based behavioral analysis system 120 (e.g., via orchestrator 211). For example, analytic engine 120 may be able to detect problems caused by attacks on a particular fleet and/or manufacturer make/model, etc. and take steps to protect other instances before they have trouble. This may be based on data collected by orchestrator 1814 that is provided to analytic engine 120 via orchestrator 211. As shown in system 1800, the data center behavioral analysis system may be eliminated and the resulting system can still perform well. This has special advantages in vehicles because of the large number of vehicles, their very long useful lives, the large variety in makes and models, and the fact that many vehicles operate long after their manufacturer has gone out of business.

Vehicle Remediation

In some embodiments, orchestrators 1814, 1816a, 1816b, 1816n, fleet operations 1818, and/or SOC 108 is configured to implement an algorithm that determines the likely extent of potential damage associated with a compromised control unit (e.g., a threat level). The remediation performed by an orchestrator is based on one or more policies. For example, if the compromise simply affects traffic reporting information, it may be considered low threat. However, if the compromise affects steering, acceleration, and/or braking, the potential damage is considered a high threat, especially while in heavy congestion and high speed. In a high threat situation, the first step may be to safely remove the vehicle from operation. For example, a vehicle may be configured to drive in full autonomous mode as long as the vehicle is on a divided highway and the vehicle and surrounding traffic are moving at 37 miles per hour or less. If the vehicle senses that any of these conditions are no longer being met, it may signal to the driver to take over. If the driver does not respond, the vehicle may be configured to turn on its emergency flashers and slowly come to a stop in the traffic lane it is in at the time. The vehicle may also call emergency services to report that it is disabled and blocking traffic. In a low threat situation, it may be enough, initially, to simply quarantine the affected component. Once the first step has been taken, longer term focused action can be taken.

The determination of where the line is drawn between low threat and high threat is an important and maybe difficult policy decision. First, there may be more than just low threat and high threat categories. There may be one or more intermediate threat categories. Also, there may be a category where a breach is detected, but it is not considered to impact the vehicle's operation directly. For example, there may be a breach in the entertainment system and therefore only requires notification to the passengers, fleet operations center, vendor, and SOC. The complexity, seriousness, and implications of the decisions in this regard can be illustrated by a fatal accident where an autonomous test vehicle hit and killed a woman crossing a road. In this case it was reported that the vehicle vision system detected the woman, but that the fleet operator had decided that there had been too many false positives coming from the sensing systems and had set the threshold for acting higher. Thus, the vehicle control system "decided" to ignore the input from the vision system. In the security case there are bound to be situations where it at first appeared that there was a high threat that later turned out not to be. So a decision fleet operators/vendors/SOC staff have is to decide how to balance safety and convenience. This decision will be reflected in the algorithms, objectives, and constraints provided to the involved orchestrators.

The remediation process starts when an orchestrator (e.g., orchestrator 1814, 1816a, 1816b, 1816n) detects or is informed by another system component (e.g., orchestrator 1814 is informed by one of the orchestrators 1816a, 1816b . . . 1816n) that an anomalous behavior has occurred. Within the context of the policy processes described above, a triage process must first begin to determine if this behavior indicates a cyber breach that should be remediated. Since recognition of consequences of specific actions is involved here, the simulation process described herein may play a valuable role in anticipating those consequences.

Because of the fact that large numbers of vehicles of the same type are typically in service at the same time, there is a range of possible preconditions that includes:

1. A potential vulnerability has been pre-identified and a range of possible responses and their consequences is available to the orchestrators involved 2. Known vulnerability, but first time experienced and no pre-identified responses 3. Something that has not been seen before If it is an external information source that has been compromised such as a traffic reporting system or a mapping system, the remediation may be to notify the service provider, continue to quarantine and await an indication that the external service provider has overcome the breach. During the quarantine period the vehicle may operate as normal, in a reduced level of service, or be taken out of service. Here again, these are policy decisions as described above.

If it is one of the high threat systems that has been compromised, the response would include starting the chain of restoring the compromised component to good working order. This is an escalating series of processes that may start with a search for a patch. Because of the potentially large numbers of vehicles involved, this breach may be the result of a known attack vector for which there is an effective patch. However, because of the large number of vehicles involved, this particular vehicle may not have received and/or installed the patch. If a search discovers such a patch, the orchestrator (e.g., orchestrator 1814, 1816a, 1816b . . . 1816n) installs the patch. If not, it proceeds to the next step of searching for and utilizing a recovery utility. If that is not successful, the affected component may be rebooted. If that is not successful, the affected software may be deleted and the affected software may be reloaded from a known good source. While this is going on, the passengers, fleet operator, SOC, and possibly one or more threat intelligence reporting services may be notified. In each step in the remediation process, checks are made to see if the component has been re-infected. If, for a high threat attack, all remediation steps are exhausted and the component keeps getting re-infected, then the vehicle has to remain disabled until the vendor—either the OEM (automobile company), software vendor, fleet operators, SOC, etc.—provides a fix that successfully avoids the attack.

Semiconductors Applications

There is a growing recognition that fundamental building blocks of components such as microprocessors and Systems on a Chip (SoC's) can and have been compromised in such a fashion as to make it difficult or impossible to detect the compromise with existing security tools. Information about these types of vulnerabilities is closely guarded and only publicly available in a small percentage of the cases that occur. Public information on examples includes the following: the US Government has restricted the use of Huawei equipment because they have determined that there is a threat that components in the equipment may be providing unauthorized information to foreign entities. There is also information that systems on a chip provided to Huawei had capabilities built into them such that the US government could obtain unauthorized information from foreign entities. There is also a stream of information about unintended architectural and implementation flaws in widely used microprocessors and systems on a chip.

Although not easily detectable off the chip, an autonomous network immune system according to some embodiments may be used to detect threats on chip. As semiconductor technology begins to struggle with physical limits to decreases in feature size and increases in operating speed, alternatives to semiconductors including optical, biochemical, quantum computing, etc. are beginning to be experimented with and in some cases implemented. In the following discussion the words semiconductor, processor, systems on a chip, etc. should be considered to include these other emerging technologies as well.

Figure 19A:
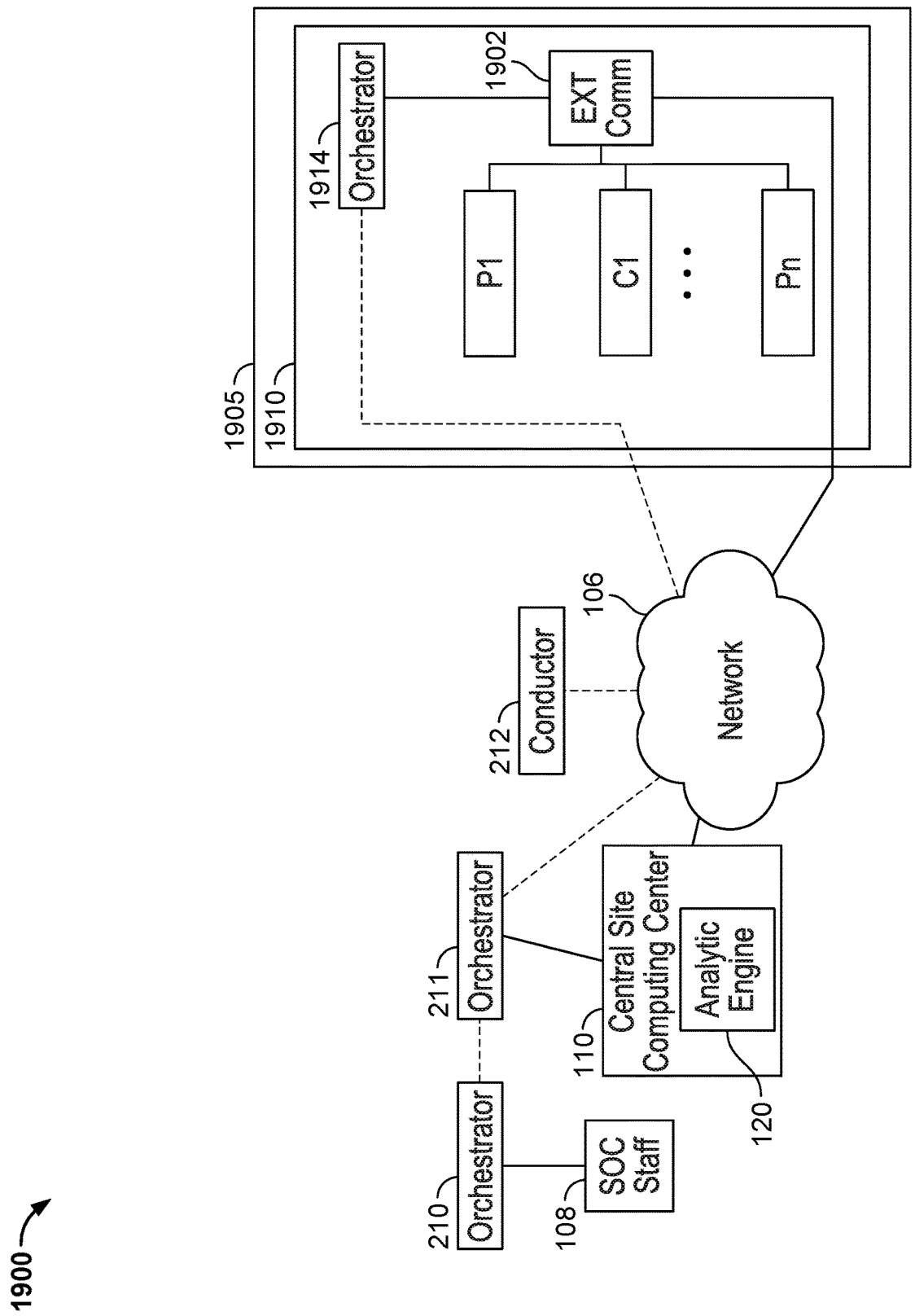
FIG. 19A is a block diagram illustrating an embodiment of an autonomous network immune system.

FIG. 19A is a block diagram illustrating an embodiment of an autonomous network immune system. In the example shown, autonomous network immune system 1900 includes a network 106, an analytic engine 120 that is part of a central site computing center 110, an SOC 108, orchestrators 210, 211, a conductor 212, and an electronic device 1905. Electronic device 1905 includes a semiconductor 1910. Semiconductor 1910 includes one or more processors (P) and/or one or more cores (C) 1916, a special sub-component called an external communications module 1902 (sometimes also called a core) that is responsible for communication between semiconductor components on the semiconductor and other system components separate from the semiconductor (i.e., "off chip"), and an orchestrator 1914 that is associated with external communications module 1902. The orchestrator, by virtue of its presence on the semiconductor can observe internal communications behavior inside the chip, into/out of the external communication module 1902, and the behavior of EXT Comm 1902 itself. Based on its analysis of the behavioral information, it can take actions to protect the semiconductor 1910, the electronic device 1905, the whole system 1900, etc.

In the example shown, orchestrator 1914 is configured based on information delivered to it by external communications module 1902 to determine that one of the processor(s) and/or core(s) 1916*a, b, n* and/or EXT Comm 1902 has been compromised and to generate an alert. In some embodiments, the alert is also delivered to SOC 108. Based on algorithms (which can be work flow process scripting, or more complex interactions between orchestrators), constraints, and objectives (which can include information about the value of the component in question, its owner, etc.) orchestrator 1914 can determine whether human interaction should be included in the course of action or if remediation should proceed immediately. In the event human interaction is determined to be needed, information determined by the algorithms, objectives, and constraints is provided to orchestrator 210, i.e., the orchestrator associated with the operator's console 108. In some embodiments, the information is presented in a screen that minimizes the opportunity for the operator to make a "Fat Finger" error. For example, it is presented in a screen that is configured to provide relevant information and only allows for yes or no clicks/responses. In some embodiments, orchestrator 210 provides a message to orchestrator 1914 to begin remediation. In response to receiving the message, orchestrator 1914, based on algorithms, objectives, and constraints, is configured to communicate with the device with which it is associated, in this example, external communications module 1902 and via external communications module 1902, to communicate with the processor(s) and/or core(s) 1916 *a, b, n* to commence remediation.

Orchestrator 1914 may be implemented in a variety of ways. It may be software that runs on one of the existing processors, or it may run on a special and/or protected processor. In either case, the software may be stored in a read/write memory. If so, there are two options. The orchestrator 1914 may be controlled by the external conductor 212 in a fashion similar to all other orchestrators. In other embodiments, the read/write memory is only configured at the time of manufacture of the semiconductor. This is to prevent any potential corruption of the orchestrator. In other embodiments, the orchestrator is implemented in a combination of read only and read/write memory. In this case the same two options are available, however the external conductor may have fewer degrees of freedom than with a full read/write implementation and there is a "ghost" conductor (not shown in FIG. 19A) that does the configuration of the portion of the orchestrator in read only memory at design time and/or during manufacture. In other embodiments, orchestrator 1914 is implemented in read only memory or hard wired logic. In this case, again, there is a ghost conductor (not shown in FIG. 19A) that does the configuration of the portion of the orchestrator in read only memory at design time and/or during manufacture. Alternatively, some or all of the orchestrator 1914 may be implemented in reconfigurable logic. For purposes of this description, reconfigurable logic can be considered the same as read/write memory with the same conductor implementation alternatives. Another alternative is to implement the orchestrator 1914 in hard wired logic. This alternative provides the greatest protection from interference from an attack or well intentioned mistaken action. It may also have lower latency, lower power consumption, smaller footprint, etc. advantages. It is also possible to have combinations and permutations of these implementation approaches.

In all of the embodiments discussed in this paragraph, the semiconductor 1910 designer and/or the electronic device 1905 designer can decide whether to have orchestrator 1914 act with only information inside the chip with no external involvement, or to act with only information inside the chip and report its actions to the outside, or to both allow outside involvement in decisions and reporting.

Figure 19B:
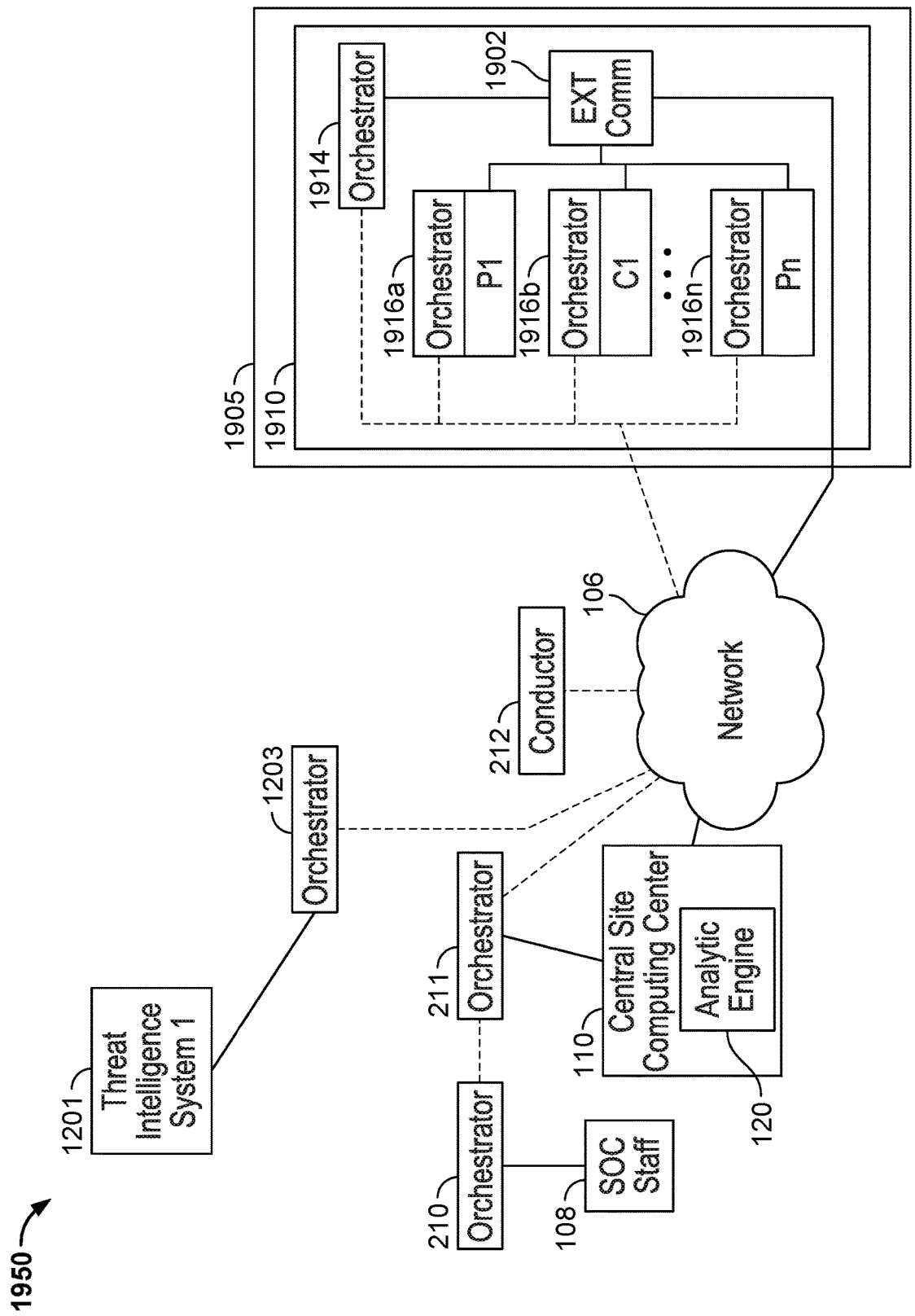
FIG. 19B is a block diagram illustrating an embodiment of an autonomous network immune system.

FIG. 19B is a block diagram illustrating an embodiment of an autonomous network immune system. In the example shown, system 1950 is the same as system 1900 except that each of the one or more processors and one or more cores 1916*a, b, n* has a corresponding orchestrator (e.g., orchestrator 1916*a*, 1916*b*, 1916*n*). By providing each processor or core with its own orchestrator, the constellation of orchestrators on the chip in system 1950 has more data at lower latency and an ability to take finer grained actions than in system 1900. This can be a significant advantage both at the semiconductor level and at the system level. It creates a new and valuable set of ways to use reconfigurability, and full or partial redundancy in both semiconductor design and systems design. The same alternatives for implementation described in relation to system 1900 exist for system 1950, with the same sets of alternatives for conductor realization.

Orchestrator 1914 includes a collector that is configured to capture behavioral information from EXT Comm 1902 and orchestrators 1916*a*, 1916*b*, 1916*n*. Orchestrator 1914 includes a local behavior analytic engine that may be configured to determine that one of the processor(s)/core(s) 1916*a, b, n* has been compromised based on information provided by underlying EXT Comm 1902, directly provided from one of the orchestrators 1916*a*, 1916*b*, 1916*n*, and/or analysis functions including but not limited to behavioral analysis. Orchestrator 1914 can detect a problem using algorithms, objectives, and constraints; use machine learning technology to identify patterns; and other mechanisms and/or processes, etc. As with the algorithms discussed in conjunction with FIG. 10, Orchestrator 1914 may use the cooperative distributed facility of the negotiation process (with orchestrators 211, 210, and in some embodiments conductor 212) combined with IF-MAP like data stores to implement the detection process and/or the machine learning technology making it distributed analysis and/or distributed machine learning. The distributed process can, in some cases, involve analytic engine 120 that has received behavioral information form orchestrator 1914 via orchestrator 211.

In the example shown, orchestrator 1914 is configured based on information delivered to it by EXT Comm 1902, orchestrator 1916*a*, orchestrator 1916*b*, or 1916*n*, to determine that one of the processor(s)/core(s) 1916*a, b, n* and/or the Ext Comm 1902 has been compromised and to generate an alert. In some embodiments, the alert is also delivered to SOC 108. Based on algorithms (which can be work flow process scripting, or more complex interactions between orchestrators), constraints, and objectives (which can include information about the value of the component in question, its owner, etc.) orchestrator 1914 can determine whether human interaction should be included in the course of action or if remediation should proceed immediately. In the event human interaction is determined to be needed, information determined by the algorithms, objectives, and constraints is provided to orchestrator 210, i.e., the orchestrator associated with the operator's console 108. In some embodiments, the information is presented in a screen that minimizes the opportunity for the operator to make a "Fat Finger" error. For example, it is presented in a screen that is configured to provide relevant information and only allows for yes or no clicks/responses. In some embodiments, orchestrator 211 provides a message to orchestrator 1914, and/or orchestrators 1916*a*, 1916*b*, 1916*n* to begin remediation. In other embodiments, orchestrator 210 provides a message to orchestrator 1914, and/or orchestrators 1916*a, b, n* to begin remediation. In other embodiments, orchestrator 211 and orchestrator 210, in conjunction, provide a message to orchestrator 1914, and/or orchestrators 1916*a*, 1916*b*, 1916*n* to begin remediation. In response to receiving the message, orchestrator 1914, based on algorithms, objectives, and constraints, is configured to communicate with the device with which it is associated, in this example, EXT Comm 1902, and/or orchestrators 1916*a*, 1916*b*, 1916*n* to communicate with the processor(s) and/or core(s) 1916*a, b, n* to commence remediation or to directly communicate with processor(s) and/or core(s) 1916*a, b, n* to commence remediation.

In some embodiments, orchestrators 1916*a*, 1916*b*, 1916*n* also have collectors and behavioral analysis engines and can operate individually or in concert with each other, 1914, and off chip orchestrators in the same fashion as described above for 1914. Collectors and behavioral analysis engines on orchestrators 1916*a*, orchestrators 1916*b*, orchestrators 1916*n* can decrease latency, increase the amount and quality of information available for behavioral analysis, decrease the granularity of possible remediations, increase the degrees of freedom of the security system as a whole, etc.

Also, it should be noted that while any form of behavioral analysis can be used with system 1900, system 1950, and system 1960, using the histogram behavioral analysis algorithm described above provides special advantages in this case. The small footprint of the orchestrator code coupled with the small data set maintained by the histogram processor(s)/core(s) behavioral analysis algorithm makes it easy to host the orchestrator function directly on the constrained memory/storage resources found inside a semiconductor.

For system 1900, system 1950, and system 1960 local behavioral analysis may be combined through the assistance of the applicable orchestrators with the data center based behavioral analysis system 120. For example, 120 may be able to detect problems caused by attacks on a particular make/model of semiconductor and take steps to protect other instances before they have trouble. This can be done by the semiconductor vendor, the system vendor, the user organization, a combination of these, the individual owner with the assistance of a threat intelligence service and local orchestrator(s) conductor, etc. The data center behavioral analysis system can be eliminated and the resulting system can still perform well. This has special advantages in semiconductors because of the large number in the field, their useful lives, the large variety in makes and models, and the fact that many vendors are merging and/or leaving the business making vendor support for some semiconductors in the field hard or impossible to obtain.

Semiconductor Remediation

A semiconductor processor(s) and/or core(s) may be remediated based on one or more policies. The one or more policies may be influenced by one or more actors, such as the semiconductor designer, semiconductor manufacturer, semiconductor packaging/testing vendor, operating system vendor (and BIOS, complier, etc. vendors), system designer, system deployer, system user, system operator, system SOC, etc. For each actor within the span of control of the system disclosed herein, there will be one or more orchestrators that interact based on each orchestrator's objectives, algorithms, and constraints in resolving the policy related decisions.

The remediation may depend on the type of semiconductor. Types of semiconductors include, but are not limited to: Single application ASIC, Multi-application ASIC, complex multi-application processor, general purpose processor, FPGA, reconfigurable logic, combinations of these in an SoC (System on a Chip), etc. The remediation may depend on the type of system associated with the semiconductor. Types of systems include, but are not limited to: single function appliances, multi-purpose tools, general purpose single user computers, servers, Clouds, etc. Some types of semiconductors support a single application while others may have a more varied application load. The application load may be quite numerous and changing. It may also be quite heterogeneous. An attack or bug may affect only a single or small group of applications or a quite large group. The application load is considered by the orchestrators in the context of the policy decisions.

What underlies all the policy concerns are the application(s) involved and what the consequences of remediation actions might be on these applications and their users. For example, shutting down a system that controls a respirator has different consequences than shutting down a children's talking doll. The simulation capability described herein (e.g., simulator engine 510) can play a role in identifying consequences.

In the semiconductor applications, the primary reason to have an orchestrator(s) on-chip is to detect and remediate an attack that can only be detected on-chip. It is possible that an attack detected off-chip is best remediated on-chip, but this is a relatively low probability situation. Also, the remediation approach will follow a similar path to that of an on-chip detected attack. Because of the economics involved, semiconductors are typically deployed in very large numbers. So, there is a range of possible preconditions that include:

1. A potential vulnerability has been pre-identified and a range of possible responses and their consequences is available to the orchestrators involved 2. Known vulnerability, but first time seen used by an attack vector 3. Known vulnerability, but first time in this application space (BIOS, O/S, system, VM, container, application, etc.)

4. Something that has not been seen before

If a change in behavior that is not associated with a known vulnerability is encountered, the first step has to be to determine whether it is an attack/bug that has a deleterious effect, or just a low probability event in the normal course of operation. The on-chip orchestrator (e.g., orchestrators 1914, 1916*a*, 1916*b*, 1916*n*) by itself, or with interaction with off-chip orchestrators (e.g., orchestrator 211) including the SOC orchestrator (e.g., orchestrator 210), makes this determination based on one or more policies. If applying a policy indicates that the orchestrators determine that it is an attack, etc.; remediation by an orchestrator(s) is triggered. This remediation may occur on-chip or off-chip.

Off-chip actions can be taken by orchestrators associated with: BIOS, O/S, system, VM, container, compiler, application, etc. Examples of off-chip actions include, but are not limited to the following: isolating the infected chip, only assigning work to the chip that is not affected by the infection, limiting external access (off-chip access by utilities and/or programs) to instructions for the instruction set that are compromised by the attack, etc.

Examples of actions that can be taken by on-chip orchestrators by themselves or in conjunction with off-chip orchestrators include updating/patching micro code, disabling a particular micro code instruction, disabling a particular function, isolating (quarantining) a part of the chip, disabling/shutting down the whole chip, etc. If the on-chip orchestrator determines that the type of attack can be promulgated from the affected chips to other chips, it may also quarantine the whole chip to limit the spread of the attack.

Disabling a particular function may be based on one or more policies. For example, a set of micro-architecture vulnerabilities rely on speculative execution. Remediation of an attack using one or more of these vulnerabilities may be accomplished by selectively disabling this function in a particular chip. This disable capability may vary by chip vendor and by product instance within a vendor. It may be that the particular application running on a particular chip may not make use of speculative execution in its normal operation. So, disabling speculative execution for that application may not have significant negative consequences. If the application does make use of speculative execution, a policy decision based on objectives, algorithms, and constraints may be made to disable speculative execution and suffer a degradation in performance rather than allow the attack to continue.

In some embodiments, semiconductor 1910 has limited reconfigurability. In some embodiments, semiconductor 1910 is reconfigurable. To the extent that the chip has reconfigurability, the remediation options increase. This reconfigurability can come by limited ability to update certain logical functions as seen in Barefoot Networks' product, FPGA's where the chip can be fully configured by software such as VHDL, or when the chip has been designed with and/or using the plasticity described in Cummings et al. (U.S. Pat. No. 9,268,578) (entitled "Integrated Circuit Design and Operation for Determining a Mutually Compatible Set of Configuration for Cores Using Agents Associated with each Core to Achieve an Application-Related Objective"). In these cases the range of interaction that the on-chip orchestrator can have is greatly increased to the point where the on-chip remediation begins to take on the same properties as remediation of infected software.

In some embodiments, the vulnerability being exploited (or the bug causing the problematic behavior) is the result of the design and implementation of the chip. In some embodiments, the vulnerability being exploited is the result of a change made during the operation of the chip. In some embodiments, changes to the micro code in the field are made. Micro code translates the machine language instructions into the actual steps that the chip must perform to execute the machine instruction. With such a chip, it is possible for the micro code to become corrupted. For example, sensitive results can end up being sent off chip. When such a corruption is detected, the on-chip orchestrator may restore the micro code to a known good state. This restoration can be done by the on-chip orchestrator by itself, or in cooperation with an off-chip orchestrator(s).

In a chip with on-chip reconfiguration capability it is possible for the configuration to become corrupted. Such corruption can, for example, result in sensitive information being sent off-chip in an unprotected fashion. When such a corruption is detected, the on-chip orchestrator may restore the configuration to a known good state. This restoration can be done by the on-chip orchestrator by itself, or in cooperation with an off-chip orchestrator(s).

Figure 19C:
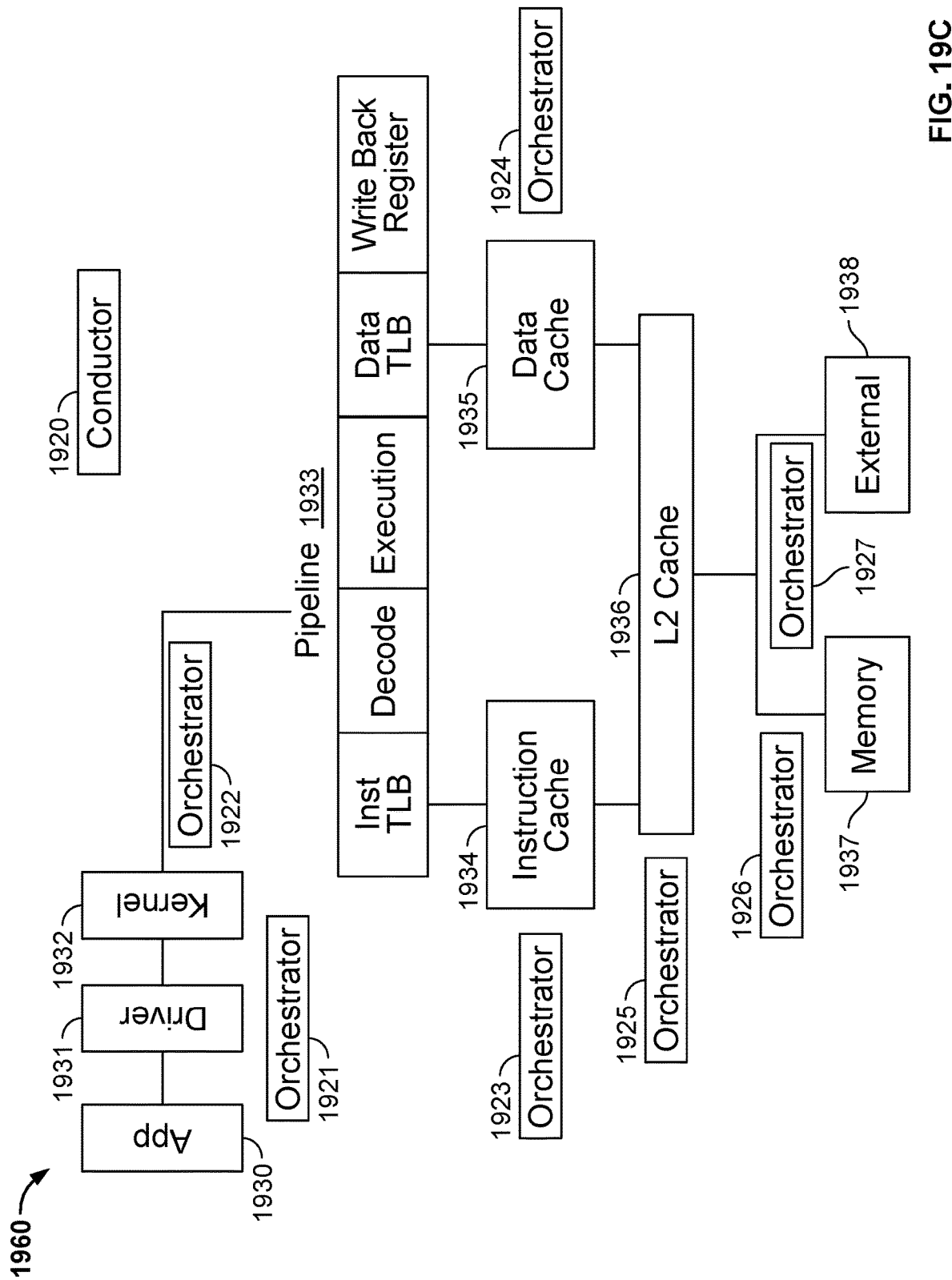
FIG. 19C is a block diagram illustrating an embodiment of an autonomous network immune system.

FIG. 19C is a block diagram illustrating an embodiment of an autonomous network immune system. In the example shown, system 1960 is a microprocessor with on-chip memory in addition to cache memory. It can be a processor core as in 1916*a, b, n*, or it can be a standalone processor. The example shown here is of a single stream instruction set processor, but there are similar embodiments for all the other types of processors. Also, the microprocessor shown in this example is a simplified version to make it easier for the reader. There are embodiments for the more complex versions as well. System 1960 consists of an App (application) 1930; Driver 1931; Kernel 1932; a Pipeline 1933 consisting of Inst TLB (Instruction Translation Look-Up Buffer), Decode, Execution, Data TLB (Data Translation Look-Up Buffer), and Write Back Register; Instruction Cache 1924; Data Cache 1925; L2 (Level two) Cache 1936; on chip memory 1937; External (provides access to off chip resources such as external memory and networks) 1938; and orchestrators 1921, 1922, 1923, 1924, 1925, 1926, 1927. In some embodiments orchestrators are associated with subsystems. In other embodiments orchestrators are associated with interfaces. For example, in some embodiments Orchestrator 1921 is associated with Driver 1931. In other embodiments orchestrator 1921 is associated with the interface between the Driver 1931 and the Kernel 1932. In some embodiments all the orchestrators shown are present. In other embodiments, only one or some of the orchestrators are present. This all-or-some-of carries forward to embodiments involving more complex processors. In some embodiments the conductor 1920 is on-chip while in other embodiments it is off chip. To make it easier for the reader, the interconnections of the orchestrators and conductor are not shown in this figure. However, they are understood to be connected in a fashion similar to that shown in other figures in this document. In some embodiments, the on-chip orchestrators not only intercommunicate with each other, but also with off-chip orchestrators. For example, in some embodiments there is an off-chip orchestrator associated with the application 1930; an orchestrator associated with the operating system; an orchestrator associated with the system that contains the chip 1905; an orchestrator associated with a threat intelligence system 1201; etc.

In some embodiments, the orchestrators include a collector that is configured to capture behavioral information and an analytic engine that may be configured to determine (in conjunction with other on-chip and/or off-chip orchestrators) using analysis functions (as described earlier in this document) including but not limited to, behavioral analysis that one of the on-chip components has been compromised. In some embodiments, the on-chip orchestrators (in conjunction with other on-chip and/or off-chip orchestrators) may take remediation and/or hardening actions. For example, Orchestrator 1925 can detect a problem using algorithms, objectives, and constraints; use the histogram process described earlier in this document; other mechanisms and/or processes, etc. As with the algorithms discussed in conjunction with FIG. 10, Orchestrator 1925 may use the cooperative distributed facility of the negotiation process combined with IF-MAP like data stores to implement the detection process and/or the machine learning technology making it distributed analysis and/or distributed machine learning.

In some embodiments, an on-chip alert is also delivered to SOC 108. Based on algorithms (which can be work flow process scripting, or more complex interactions between orchestrators), constraints, and objectives (which can include information about the value of the component in question, its owner, etc.) the on-chip and off-chip orchestrators can determine whether human interaction should be included in the course of action or if remediation should proceed immediately. In the event human interaction is determined to be needed, information determined by the algorithms, objectives, and constraints is provided to orchestrator 210, i.e., the orchestrator associated with the operator's console 108. In such cases, the on-chip and off-chip orchestrators proceed as described earlier in this document.

As described here, on-chip orchestrators (by themselves or in concert with other on-chip and/or off-chip orchestrators) can decrease latency, increase the amount and quality of information available for behavioral analysis, decrease the granularity of possible remediations, increase the degrees of freedom of the security system as a whole, etc. Also, there are categories of security vulnerabilities and attacks that are difficult to impossible to detect outside of the processor. Having orchestrator(s) on-chip inside processors makes it possible to detect when these vulnerabilities are being exploited or other forms of attack are underway. Once a vulnerability and/or attack on-chip is detected, it may be remediated or hardened by either/or on-chip and/or off-chip actions. The on-chip orchestrators provide unique on-chip remediation capabilities.

Also, it should be noted that while any form of behavioral analysis can be used with system 1960, using the histogram behavioral analysis algorithm described above provides special advantages in this case. The small footprint of the orchestrator code coupled with the small data set maintained by the histogram behavioral analysis algorithm makes it easy to host the orchestrator function directly on the constrained memory/storage resources found inside a semiconductor.

For system 1960 local behavioral analysis may be combined through the assistance of the applicable orchestrators with the data center based behavioral analysis system 120. For example, 120 may be able to detect problems caused by attacks on a particular make/model of semiconductor and take steps to protect other instances before they have trouble. This can be done by the semiconductor vendor, the system vendor, the user organization, a combination of these, the individual owner with the assistance of a threat intelligence service and local orchestrator(s) conductor, etc. The data center behavioral analysis system can be eliminated and the resulting system can still perform well. This has special advantages in semiconductors because of the large number in the field, their useful lives, the large variety in makes and models, and the fact that many vendors are merging and/or leaving the business making vendor support for some semiconductors in the field hard or impossible to obtain.

Finally, there are similar embodiments of on-chip orchestrators/conductors for other types of chips and/or cores used either in standalone or SoC (System on a Chip) configurations.

Securing Orchestrators and Conductors

Once widely deployed the conductor/orchestrator networks are likely to be targets of cyber security attacks. Therefore it is necessary to protect them as well as the underlying networks they are securing. To do so, it is necessary to implement a two-step process: (1) make it extremely difficult for potential attackers to break in; then make it possible to quickly find out if there has been a successful break in and (2) quickly overcome a successful breach.

Number one is done by isolating the conductor/orchestrator network. This can be done in several ways and a combination of them should be used. One way is to physically isolate the conductor/orchestrator network is using air gap methods. That is, so far as possible, having the physical and logical network separated from the general internet. This is possible because of the architecture of the conductor/orchestrator network in that it is completely self-contained and needs no external connection to function. As the experience with the Iranian centrifuges illustrates, although difficult, it is still possible to break into an air gap network. Also, depending on the underlying network being secured, there may be some limitations on how much physical separation is possible.

Using strong encryption on all information transferred over the conductor/orchestrator network or stored in the conductor or orchestrator provides another layer of protection. Virtual separation techniques should also be used. First, because the conductor has all the orchestrator addresses, it is not necessary to have any information about the conductor/orchestrator network in any DNS Server (Internet Domain Name Server).

Carrying this further, Dark Net technology may be used to make the conductor/orchestrator network invisible to the outside world. Such an approach is described in patent application (US 2018/0115520). In some embodiments, address information associated with the one or more orchestrators and/or conductors of an autonomous network immune system is not visible to a DNS server. In some embodiments, the one or more orchestrators are configured not to respond to a communication unless a communicator provides a credential that the one or more orchestrators is configured to trust.

General SOC staff only has access to the conductor/orchestrator network through the SOC orchestrator (e.g., orchestrator 210) that does not provide any address information. However, even though multiple simultaneous access controls are used on the administrative interface to the conductor, there is still the possibility of insider collusion (on purpose or by accident). Here again, encryption can be of assistance—especially if different people have access to the encryption keys than have access permission to the conductor administrative interface.

However, even with all these precautions and others not described here, it is possible that an attacker can still penetrate the conductor/orchestrator network. Therefore, the network must be able to reliably determine if it has been compromised and if so, take appropriate steps to recover. What follows is a description of one way that that can be done.

The conductor using behavioral analysis techniques described herein can monitor all its associated orchestrators and determine if one of them has been compromised. If so, the conductor is configured to use the recovery method described herein. The conductor is configured to remove the infected orchestrator and replace the infected orchestrator with a "clean" one. The conductor is configured to log this process and the SOC orchestrator subscribes to that log and when triggered delivers an alert to SOC staff. If there are frequent occurrences of the above, especially in the same place, same equipment, etc., the SOC staff may investigate and remediate that cause.

In some embodiments, a second conductor is established and configured to back up an active conductor. The second conductor may be configured to use the behavioral analysis techniques described herein to determine if the active conductor has been breached. Since it is difficult to reliably determine if the system running the behavioral analysis itself has been compromised, the on-line back-up conductor has the task of monitoring the behavior of the active conductor. This can lead to the situation where the active conductor says that it has not been compromised while the back-up conductor says that the active conductor has been compromised. To provide for this situation, another back-up conductor primarily tasked with behavioral analysis of the active conductor and protected from it by delayed mirroring also makes a determination. A voting algorithm is used to resolve conflicts and potential deadlocks. Here again, this is all logged—so SOC staff will be well aware that a serious attack is underway and can take additional steps.

It is still possible for the three on-line conductors to become compromised at the same time—either directly or through some kind of ransom-ware attack. For this reason a fourth conductor is kept physically disconnected from any network and in an inactive state. It periodically "wakes up" and connects. Before it does any mirroring, it performs behavioral analysis on the other three conductors. If it finds that the other three conductors have been compromised, it removes them from service and assumes control. In so doing, it takes the conductor/orchestrator network back to a state that it was in previous to the attack. Then the system (with the involvement of the SOC if it was previously involved in the change of state) updates itself. Here again, this is all logged—so SOC staff will be well aware that a serious attack is underway and can take additional steps.

Smart Devices

There is a growing area of innovation that has a group of overlapping technology/product classes. These include Smart Home, Smart Building, Automated Factory (robot manufacturing), Smart City, Electronic Voting Systems, IoT (Internet of Things), IoX (Internet of Everything), Autonomous Connected Vehicles, Robot Hotels, Robot Restaurants, etc. Examples of products in these spaces include: smart thermostats, smart lighting, digital door locks, (both card and smart phone-based), security video cameras, other digital sensors as part of physical security systems, baby monitors, factory robots, hotel check-in robots, restaurant server robots, small wheeled delivery vehicles, passenger vehicles, drones, smart traffic lights, etc.

Although very different in how they are perceived, all of these have some basic similarities. First and foremost, they all have had serious security problems. This is because they set out to dramatically lower costs and increase convenience for very large-scale end-point deployments in what have been very challenging application areas. These challenges have led to security taking a back seat—even after there have been significant breaches. In many cases, the security problem has been exacerbated by the fact that who and how security is to be provided has been either unclear, compromised, or left up to individuals without the tools to do so.

The autonomous network immune system disclosed in FIGS. 2 through 19C and associated descriptions apply to this whole area in general. It addresses the problems cited above. It is able to provide the required security while maintaining the cost convenience and widespread deployment that is the foundation of products and services in this space. It provides the individual and organization with the capability to manage their own security in their own smart environment, while maintaining cost and ease of use advantages. With that said, some figures/descriptions have special significance in this area.

FIGS. 16 and 17C and associated text with their focus on end points are particularly applicable to Smart Homes, Smart Buildings, Smart Factories, Smart Hotels, Smart Restaurants, electronic voting systems, etc. In these applications, end points are either fixed or have the kind of limited mobility well served by wireless LAN's (Local Area Networks).

Figures and associated text 17A, 17B, 17C with their focus on wireless (Wide Area Network) end points strengthen the fixed applications and extend to the full range of mobile applications. Fixed applications (and limited mobility applications that otherwise might be served by a wireless LAN) benefit because of the ease of implementation and support that wide area wireless networking provides when it is correctly secured.

FIGS. 18A and 18B and associated text with their focus on mobile autonomous devices further extend and show detail relative to these types of end points including not just autonomous vehicles, but also the full range of IoT devices and systems.

Because for all IoT systems cost minimization is critical and for many, size and power consumption minimization is also critical, single chip implementations are often unavoidable. FIGS. 19A and 19B and associated text are particularly significant here because of the fundamental ability to provide adequate security for IoT end points implemented in single chip SoC's (System on Chip) while maintaining the cost and ease of use advantages critical to these applications.

Attacks During Design/Development

In systems that experience high degrees of complexity, scale, and volatility during development there can be difficulty in detecting vulnerabilities during the design and development cycle. Development here is meant to include manufacture, test, and packaging too. The vulnerabilities can occur because of accident, bad actors in the design and development cycle, outside intrusions, etc. This can occur in semiconductors (chips), systems that combine chips, software, combinations of these, etc.

For example, prior to approximately 2005 Intel corp. had a policy that only three people in the corporation would be allowed to know the whole architecture of a microprocessor product. This was to make it harder for product intellectual property to leak out of the company. However, it was determined that by this time, microprocessor products had become so complex and so large that it was impossible for any single person to understand the whole architecture of a product. So the policy was eliminated. Another example can be found in large software systems. Senior US military leaders have said that when they receive a product based on a million or more lines of software code it is difficult to impossible to tell if it is doing or not doing things it shouldn't.

In the discussion of FIGS. 19A and 19B, the use of orchestrators and conductors in development of chips was introduced. Orchestrators may be associated with subcomponents/subsystems at the finest grain possible. Throughout the design development cycle, the orchestrators may be provided with objectives, algorithms, and constraints. The focus of the orchestrators may be to improve the efficiency of the design development cycle and the efficiency of the operation of the finished product. Efficiency can be seen to include security. The objectives, algorithms, and constraints can be focused in addition to, or instead of on what the subsystem should do and the resulting product "what the subsystems and resulting product should not do."

The same can be done with software. Most large software systems are written in modules that are then combined. Orchestrators and conductors can be associated with the modules and function in a fashion similar to that described above for hardware.

Thus it can be seen that orchestrators and conductors can be employed in the design and development cycle of semiconductors (chips), combinations of chips into subsystems such as multi-chip modules, boards, etc. and systems, software systems, combinations of these, etc. to improve the security capabilities of the resulting products.

There are likely to be many innovative system types fielded in the future that can not be anticipated now. However, the invention disclosed here has the flexibility, extensibility, etc. to be able to provide security to all of them. Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a processor; and
a memory coupled with the processor, wherein the memory is configured to provide the processor with instructions which when executed, cause the processor to:
receive image data of a node with which the system is associated, wherein the node is an electronic device, wherein the image data of the node is received in a language associated with the node;
translate the image data of the node with which the system is associated into a meta-language associated with an orchestrator network comprising an orchestration module hosted on the system and one or more other orchestration modules associated with one or more corresponding nodes;
determine a scope of information to provide from the orchestration module to the one or more other orchestration modules associated with the one or more corresponding nodes; and
communicate the determined scope of information to the other one or more orchestration modules in the meta-language understood by the orchestration module and the one or more other orchestration modules.

2. The system of claim 1, wherein the system further comprises a conductor in communication with the orchestration module and the one or more other orchestration modules, wherein the conductor is configured to generate the orchestration module and deploy the orchestration module to the node with which the system is associated.

3. The system of claim 1, wherein the image data of the node with which the system is associated includes behavioral data of the node with which the system is associated.

4. The system of claim 3, wherein the orchestration module is further configured to apply a histogram behavioral analysis algorithm to the behavioral data of the node with which the system is associated to determine a normal behavior of the node with which the system is associated, wherein the orchestration module is configured to determine the normal behavior either by itself or in conjunction with the one or more other orchestration modules.

5. The system of claim 3, wherein the orchestration module includes a local behavior analytic engine that is configured to analyze the behavioral data of the node with which the system is associated.

6. The system of claim 3, wherein the orchestration module includes a collector configured to capture the behavioral data of the node with which the system is associated.

7. The system of claim 1, wherein the determined scope of information includes information indicating that the node with which the system is associated has been compromised.

8. The system of claim 7, wherein the orchestration module is configured to receive from one of the one or more other orchestration modules a message indicating a remediation for the node with which the system is associated.

9. The system of claim 8, wherein the orchestration module is configured to cause the node with which the system is associated to implement the remediation.

10. The system of claim 8, wherein the orchestration module is configured to cause the node with which the system is associated to implement the remediation based on the image data of the node.

11. The system of claim 1, wherein the image data of the node with which the system is associated comprises one or more objectives associated with the node, one or more constraints associated with the node, one or more algorithms associated with the node, one or more capabilities associated with the node, one or more configurations associated with the node, and an environment associated with the node.

12. The system of claim 1, wherein the orchestration module is configured to communicate the determined information to the one or more other orchestration modules via a network that is specific to the orchestration module and the one or more other orchestration modules.

13. The system of claim 1, wherein the node with which the system is associated is a network element.

14. The system of claim 1, wherein the node with which the system is associated is a base station or access point.

15. The system of claim 1, wherein the node with which the system is associated is an application, and wherein the orchestration module and the application are located in a first cloud data center.

16. The system of claim 15, wherein the orchestration module and its associated application are configured to move from the first cloud data center to a second cloud data center.

17. The system of claim 1, wherein the node with which the system is associated is located in a central site computing center.

18. The system of claim 1, wherein the node with which the system is associated is a component of a vehicle.

19. The system of claim 1, wherein the node with which the system is associated is part of a semiconductor.

20. The system of claim 1, wherein the orchestration module is associated with a component inside of at least one of a processor, a core, and/or a semiconductor.

21. The system of claim 1, wherein the system and at least one of the one or more other orchestration modules are configured to negotiate with each other based on objectives, algorithms, and constraints to respond to one or more changes in an internal security environment and/or external security environment.

22. The system of claim 1, wherein the orchestration module and the one or more other orchestration modules are associated with an umbrella model, wherein corresponding image data associated with a plurality of nodes is translated from a language associated with a corresponding node into the meta-language, wherein the umbrella model comprises a set of the corresponding image data associated with the plurality of nodes, wherein the umbrella model provides end-to-end orchestration throughout the orchestrator network.

23. The system of claim 22, wherein the umbrella model is configured to change while the orchestration module and the one or more other orchestration modules are running.

24. The system of claim 1, wherein the orchestration module is configured to subscribe to one or more changes to the image data of the node with which the system is associated.

25. A method, comprising:
receiving image data of a node with which an orchestration module is associated, wherein the node is an electronic device, wherein the image data of the node is received in a language associated with the node;
translating the image data of the node with which the orchestration module is associated into a meta-language associated with an orchestrator network comprising the orchestration module and one or more other orchestration modules associated with one or more corresponding nodes;
determining a scope of information to provide from the orchestration module to the one or more other orchestration modules associated with the one or more corresponding nodes; and
communicating the determined scope of information to the one or more other orchestration modules in the meta-language understood by the orchestration module and the one or more other orchestration modules associated with the one or more corresponding nodes.

26. A computer program product, the computer program product being embodied in a non-transitory computer readable storage medium and comprising computer instructions for:
receiving image data of a node with which an orchestration module is associated, wherein the node is an electronic device, wherein the image data of the node is received in a language associated with the node;
translating the image data of the node with which the orchestration module is associated into a meta-language associated with an orchestrator network comprising the orchestration module and one or more other orchestration modules associated with one or more corresponding nodes;
determining a scope of information to provide from the orchestration module to the one or more other orchestration modules associated with the one or more corresponding nodes; and
communicating the determined scope of information to the one or more other orchestration modules in the meta-language understood by the orchestration module and the one or more other orchestration modules associated with the one or more corresponding nodes.

\* \* \* \* \*

UNITED STATES PATENT AND TRADEMARK OFFICE
CERTIFICATE OF CORRECTION

PATENT NO. : 10,694,402 B2  
APPLICATION NO. : 16/008673  
DATED : June 23, 2020  
INVENTOR(S) : Mark Cummings It is certified that error appears in the above-identified patent and that said Letters Patent is hereby corrected as shown below:

On the Title Page

In page 2, Column 1, item (56), U.S. patent documents, cite no. 11, delete "Burgoon, Jr." and insert --Burgoon, Jr. et al.--, therefor.
In page 2, Column 2, item (56), U.S. patent documents, cite no. 23, delete "Green, III" and insert --Green, III et al.--, therefor.
In page 3, Column 2, item (56), other publications, cite no. 8, before "Case", delete "Ue" and insert --Use--, therefor.
In page 3, Column 2, item (56), other publications, cite no. 15, delete "Future Field Programmable Gate Array (FPGA) Design Methodologies and Tool Flows" and insert --'Future Field Programmable Gate Array (FPGA) Design Methodologies and Tool Flows--, therefor.

In the Specification

In Column 6, Line(s) 42, after "detection", insert --,--.
In Column 8, Line(s) 1, delete "Systems".
In Column 8, Line(s) 36, after "etc.)", insert --.--.
In Column 2, Line(s) 11, delete "telcos'" and insert --"telcos"--, therefor.
In Column 34, Line(s) 61, delete "STEM'" and insert --SIEM--, therefor.

Signed and Sealed this  
Eighth Day of December, 2020

Andrei Iancu  
*Director of the United States Patent and Trademark Office*